(12) United States Patent
Panicacci

(10) Patent No.: US 10,249,656 B2
(45) Date of Patent: Apr. 2, 2019

(54) CHARGE PACKET SIGNAL PROCESSING USING PINNED PHOTODIODE DEVICES

(71) Applicant: SEMICONDUCTOR COMPONENTS INDUSTRIES, LLC, Phoenix, AZ (US)

(72) Inventor: Roger Panicacci, Los Angeles, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 312 days.

(21) Appl. No.: 15/175,960

(22) Filed: Jun. 7, 2016

(65) Prior Publication Data
US 2017/0352694 A1 Dec. 7, 2017

(51) Int. Cl.
| | | |
|---|---|---|
| H01L 27/146 | (2006.01) | |
| H03M 1/12 | (2006.01) | |
| H03M 1/46 | (2006.01) | |
| H03M 1/56 | (2006.01) | |
| H03M 3/00 | (2006.01) | |

(52) U.S. Cl.
CPC .. *H01L 27/14609* (2013.01); *H01L 27/14643* (2013.01); *H03M 1/1245* (2013.01); *H03M 1/468* (2013.01); *H03M 1/56* (2013.01); *H03M 3/438* (2013.01); *H03M 3/456* (2013.01)

(58) Field of Classification Search
CPC ......... H01L 27/14609; H01L 27/14612; H01L 27/14643; H01L 27/146; H04N 5/369; H03M 1/1245; H03M 1/124; H03M 1/12; H03M 1/468; H03M 1/466; H03M 1/46; H03M 1/56; H03M 3/438; H03M 3/456;
(Continued)

(56) References Cited

U.S. PATENT DOCUMENTS

| | | |
|---|---|---|
| 5,880,495 A | 3/1999 | Chen |
| 5,904,493 A | 5/1999 | Lee et al. |

(Continued)

OTHER PUBLICATIONS

De Wit, "A Passive Integrator to Achieve Low Power, Low Noise Signal Amplification," 2013 International Image Sensor Workshop, Jun. 13, 2013, pp. 1-3, Sandy, Utah, USA.

*Primary Examiner* — John R Lee
(74) *Attorney, Agent, or Firm* — Treyz Law Group, P.C.; Joseph F. Guihan

(57) ABSTRACT

An image sensor may include an array of image pixels coupled to analog-to-digital conversion circuitry formed from pinned photodiode charge transfer circuits. Majority charge carriers for the pinned photodiodes in the charge transfer circuits may be electrons for photodiode wells formed from n-type doped regions and may be holes for photodiode formed from p-type doped regions. Pinned photodiodes may be used for charge integration onto a capacitive circuit node. Pinned photodiodes may also be used for charge subtraction from a capacitive circuit node. Comparator circuitry may be used to determine digital values for the pixel output levels in accordance with single-slope conversion, successive-approximation-register conversion, cyclic conversion, and first or second order delta-sigma conversion techniques. The array of image pixels used for imaging may have a conversion mode wherein at least a portion of the pixel circuitry in the array are operated similar to the charge transfer circuits.

5 Claims, 33 Drawing Sheets

(58) Field of Classification Search
CPC .... G01J 1/4228; G01J 1/42; G01J 1/44; G01J 2001/446; G01J 2001/444
See application file for complete search history.

(56) References Cited

U.S. PATENT DOCUMENTS

| | | | |
|---|---|---|---|
| 6,545,624 B2 | 4/2003 | Lee et al. | |
| 8,866,532 B2 | 10/2014 | De Wit | |
| 10,001,406 B2* | 6/2018 | Panicacci | G01J 1/4228 |
| 2008/0225140 A1* | 9/2008 | Raynor | H04N 5/361 |
| | | | 348/243 |
| 2010/0226495 A1* | 9/2010 | Kelly | G11B 20/00086 |
| | | | 380/30 |
| 2012/0199749 A1* | 8/2012 | Kameshima | A61B 6/00 |
| | | | 250/370.08 |
| 2017/0350756 A1* | 12/2017 | Panicacci | G01J 1/4228 |
| 2017/0352694 A1* | 12/2017 | Panicacci | H01L 27/14609 |
| 2017/0352696 A1* | 12/2017 | Panicacci | H01L 27/14643 |

* cited by examiner

First Order Delta Sigma Modulator

Pixel arranged in array to have separate connections for Vdac and Vfill; operate in imaging or ADC modes.

CHARGE PACKET SIGNAL PROCESSING USING PINNED PHOTODIODE DEVICES

BACKGROUND

This relates generally to imaging systems and, more particularly, to signal processing circuitry that utilizes pinned photodiode devices for delivering charge to a circuit node.

Modern electronic devices such as cellular telephones, cameras, and computers often include camera modules having digital image sensors. An image sensor (sometimes referred to as an imager) is formed from a two-dimensional array of image sensing pixels. Each pixel receives incident photons (light) and converts the photons into electrical signals.

Capturing images using an image sensor involves using reading out pixel signals from a subset of pixels from the two-dimensional image sensing pixel arrays (sometimes referred to as a "readout operation" of an image sensor). Pixel signals may be routed or otherwise provided to signal processing circuitry during the readout operation. A readout operation may be said to conclude when the signal processing circuitry that receives the image pixel signals converts the image pixel signals to digital image data. Prior to the read out of pixel signals from a subset of the pixels in an array, the reset levels from the subset of the pixels in the array are also read out and converted to digital reset level data by the signal processing circuitry on the image sensor.

Converting pixel reset levels and pixel signals from analog signals to digital data is accomplished by analog-to-digital converter (ADC) circuitry. Conventional ADC circuits sometimes utilize poly-insulator-poly or metal-insulator-metal capacitors having large substrate area requirements, density requirements, linearity requirements, and extra silicon processing steps to form them. Capacitors may be used in switch capacitor circuits that provide reference charges to the comparator circuitry in the ADC circuitry. Comparator circuitry in the traditional ADC circuitry itself often requires capacitors. The capacitors in ADC circuitry are often used to transfer large amount of charges between nodes, resulting in excessive power consumption and dissipation in the signal processing circuitry. Moreover, capacitors that are formed in signal processing circuitry are not customizable as far as specialized silicon processing needed to meet capacitor device performance specifications, thereby limiting the applications and configurability of an image sensor that relies on capacitors to provide references charges for an ADC circuit.

An image sensor that lacks silicon process customization or configurability for specialized analog circuit components in its image processing circuitry cannot be optimized for particular applications as readily, if at all, when compared to sensors having configurable processing circuitry. Furthermore, reliance on capacitors to transfer large charge packets between nodes often results in excess power consumption and dissipation in the signal processing circuitry, further limiting the applicability of the capacitor-based signal processing circuitry to systems with larger and more costly power sources and heat dissipation capabilities that are suited to the power requirements of the capacitor-based circuitry. Capacitors used in ADC circuitry are also used to charge mixing, which occurs when capacitors are connected together or coupled to a common node and settle to a common voltage. A capacitor in signal processing circuitry with a charge level transfers charges to a second capacitor at a lower charge level when an electrical path is formed between the two capacitors, resulting in a mixing of capacitor signals when the two capacitors are not electrically isolated from one another like with an amplifier in a switched capacitor circuit topology.

It would therefore be desirable to provide improved signal processing circuitry without reliance on conventional high performance capacitors that dissipate power to support charge mixing or dissipate power to support switched capacitor circuit topologies.

DETAILED DESCRIPTION

Embodiments of the present invention relate to signal processing circuitry configured to transfer charge packets having an adjustable size to a circuit node. Adjustable size charge packets may originate at pinned photodiode structures. Adjustable size charge packets may be transferred to circuit nodes that provide a reference voltage for a comparator in a signal processing circuit such as an ADC.

Figure 1:
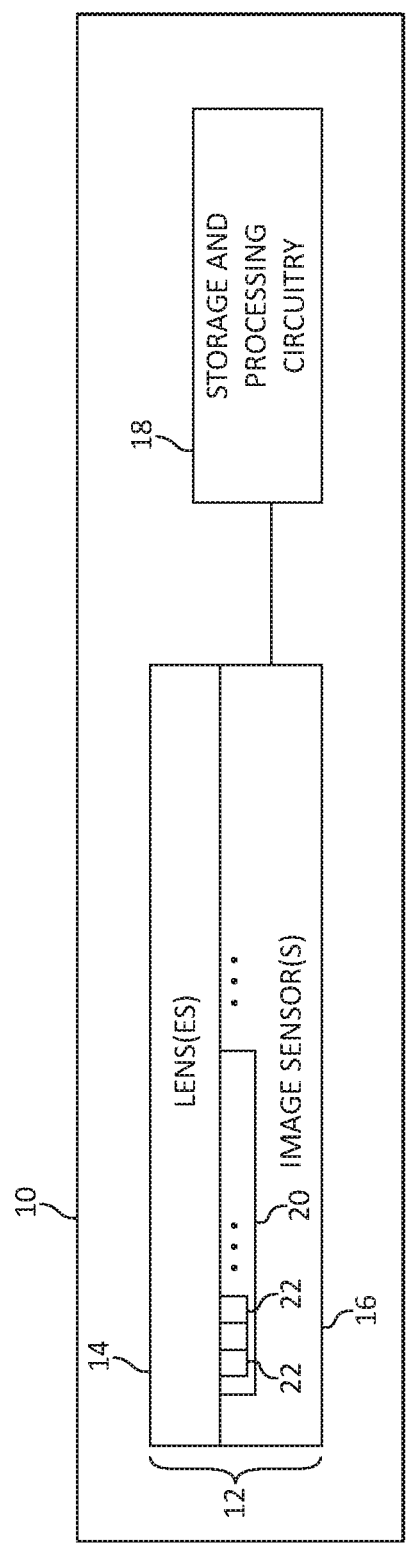
FIG. 1 is a schematic diagram of an illustrative imaging system with an image sensor having image sensor pixels in accordance with an embodiment.

An electronic device with a digital camera module is shown in FIG. 1. Electronic device 10 may be a digital camera, a computer, a cellular telephone, a medical device, or other electronic device. Camera module 12 (sometimes referred to as an imaging device) may include image sensor 14 and one or more lenses 28. During operation, lenses 28 (sometimes referred to as optics 28) focus light onto image sensor 14. Image sensor 14 includes photosensitive elements (e.g., pixels) in which photogenerated charges are produced in response to the light incident to the pixels. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 14 may be provided to image processing and data formatting circuitry 16 via path 26. Image processing and data formatting circuitry 16 may be used to perform image processing functions such as automatic focusing functions, depth sensing, data formatting, adjusting white balance and exposure, implementing video image stabilization, face detection, etc.

Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit. The use of a single integrated circuit to implement camera sensor 14 and image processing and data formatting circuitry 16 can help to reduce costs. This is, however, merely illustrative. If desired, camera sensor 14 and image processing and data formatting circuitry 16 may be implemented using separate integrated circuits.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
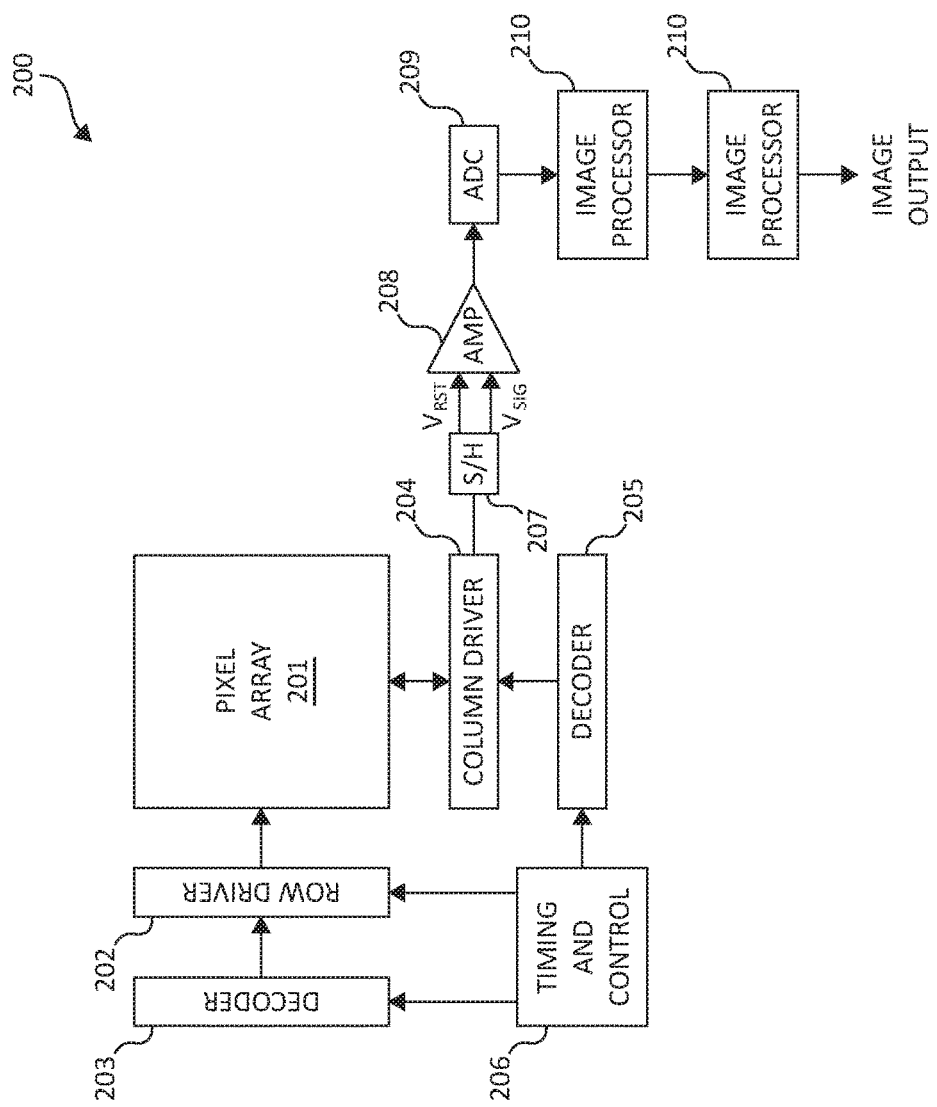
FIG. 2 is a simplified block diagram of an imager in accordance with an embodiment of the present invention.

FIG. 2 illustrates a simplified block diagram of imager 200 (e.g., an image sensor such as image sensor 14 of FIG. 1). Pixel array 201 includes a plurality of pixels containing respective photosensitive elements or regions arranged in a predetermined number of columns and rows. The row lines that are coupled to the pixels may be selectively activated by row driver 202 in response to row address decoder 203 and the column select lines may be selectively activated by column driver 204 in response to column address decoder 205. Thus, a row and column address may be provided for each pixel. Row driver 202 and column driver 204 may be activated in accordance with electronic rolling shutter readout methods, or global shutter readout methods in imagers 200 that support rolling shutter readouts.

Imager 200 is operated by a timing and control circuit 206, which controls decoders 203, 205 for selecting the appropriate row and column lines for pixel readout, and row and column driver circuitry 202, 204, which apply driving voltages to the drive transistors of the selected row and column lines. The pixel signals, which typically include a pixel reset signal Vrst& and a pixel image signal Vsig for each pixel are sampled by sample and hold circuitry 207 associated with the column driver 204. A differential signal Vrst-Vsig is produced for each pixel, which is amplified by amplifier 208 and digitized by analog-to-digital converter 209. The analog to digital converter 209 converts the analog pixel signals to digital signals, which are fed to image processor 210 which forms a digital image.

Analog-to-digital converter 209 may, in contrast to conventional capacitor-based ADC circuits, utilize pinned photodiodes to supply fixed amounts of charge into circuits that perform analog to digital conversion (ADC) as well as other circuit functions. Pinned photodiodes may be used for complete charge transfer to another node. Conventional capacitor circuits fail to achieve these features of completely transferring fixed amounts of charges from one node to another, at least because when transferring charges from one capacitor to another, the completeness of the charge transfer during a charge transfer interval is dependent on the relative voltage or charge levels of the two capacitors. When, for example, it is desirable to transfer the charges from a first capacitor or capacitive node to a second capacitor or capacitive node, and when the first capacitive node is at a lower voltage level than the second capacitive node, then the desired transfer may be unachievable without using a switch capacitor amplifier topology in traditional circuitry where an electrical connection between the first and second capacitive nodes is relied upon to transfer the charges.

Moreover, when the charge from a first capacitor is to be transferred to a second capacitor that has an existing charge or voltage level, charges will flow between the two capacitors when they are electrically connected, resulting in a mixing of charges from the two capacitors at each of the first and second capacitors. Notably, such a transfer between capacitors, in which charges are mixed, results in charges that were originally present at the second capacitor to be lost, or transferred to the first capacitor which was only intended to be a source of charges but not a destination, or sink, for the charges.

However, pinned photodiodes, may be used to achieve one-directional charge transfer to any circuit node. Pinned photodiodes may include a photosensitive region such as a photodiode region that is provided with a pinning layer with a built-in bias at a pinning voltage level Vpin that is determined by doping levels. Complete, one-directional charge transfer from a pinned photodiode to a circuit node may be possible when the circuit node has a potential at a level that is higher than the Vpin level for electron based pinned photodiodes.

Photodiode regions for charge collection of photon generated charge in the pinned photodiodes may be n-type regions or p-type regions formed in a semiconductor substrate below the surface (sometimes referred to as "buried" below the surface or "buried in the substrate). Surface pinning regions formed over the photodiode regions (sometimes referred to as "well regions" or "photodiode wells") of pinned photodiodes may be doped with dopants of an opposite dopant type than the photosensitive well regions themselves in order to generate a charge collection area with a specific built-in Vpin potential to hold charge. As an example, a p-type or p+ surface pinning layer may be formed over an n-type photodiode well region. Similarly, an n-type or n+ surface pinning layer may be formed over a p-type photosensitive region. Pinned photodiodes can either subtract or add charge (or in another view, voltage inversely proportional to node capacitance) from a node, based on the dopant type associated with the photodiode regions of the pinned photodiodes.

Specifically, when a pinned photodiode is formed with an n-type photodiode region, the majority charge carriers in the n-type photodiode region will be electrons. When charges in the pinned photodiode having a n-type photodiode region are transferred to another circuit node, electrons are transferred to the another circuit node, thereby adding the electron charges to the another circuit node. Transferring electrons from the pinned photodiode to a circuit node may reduce the voltage at the circuit node by an amount proportional to the number of electrons that were transferred to the circuit node.

Similarly, in pinned photodiodes having a p-type photodiode region, the majority charge carriers in the p-type photodiode region are "holes," which may act as if they have properties associated with positive charges. When the holes from a p-type photodiode region of a pinned photodiode are transferred to a circuit node, the addition of holes to the circuit node effectively remove electrons from the circuit node, which may thereby reduce the amount of charges on the circuit node, and which may increase the voltage at the circuit node.

Pinned photodiodes having n-type photodiode regions that transfer charges (specifically electrons, sometimes denoted as "e–") are sometimes referred to (in this disclosure) as "charge integrators," and pinned photodiodes having p-type photodiode regions that transfer "holes" and thereby remove electrons are sometimes are sometimes referred to as "charge subtractors." Pinned photodiodes having photodiode regions of either type may transfer charges in packets corresponding to a full well capacity of the photodiode regions in the pinned photodiodes. Compared to conventional signal processing circuitry using capacitor circuits to transfer charges, the relatively smaller size of charge packets that are transferred from pinned photodiodes may allow for lower power circuits, relative to traditional capacitor-based circuits.

Figure 3A:
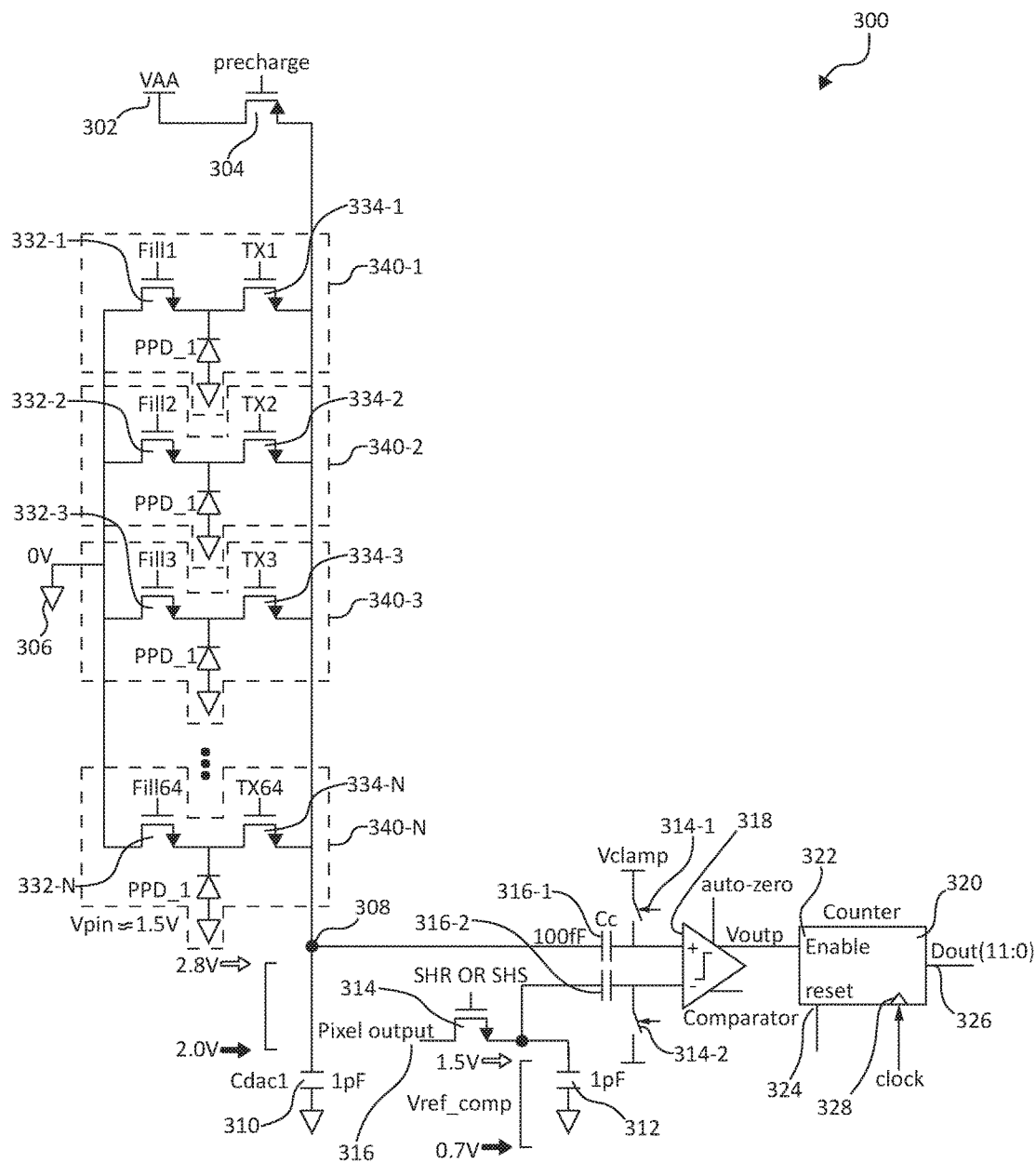
FIG. 3A is a schematic of a single slope analog-to-digital converter (ADC) with pinned photodiode charge transfer circuits in accordance with an embodiment of the present invention.

FIG. 3 illustrates a single-slope analog-to-digital converter (ADC) circuit in accordance with an embodiment. Analog-to-digital converter 300 may receive analog pixel signals from an image pixel in an image sensor pixel array. ADC converter 300 may include multiple transistors and pinned photodiode circuits that include one or more respective doped regions in a semiconductor substrate. The dopants used in the various transistor and pinned photodiode devices may be reversed, relative to the exemplary embodiments described below. As an example, when circuitry is described as including a transistor that, in the exemplary embodiment, is a p-channel or p-type transistor, and a pinned photodiode that, in the exemplary embodiment, has an n-type photodiode region for electron collection with a surface p-type pinning layer, it should be appreciated that the circuitry can alternatively be implemented with the transistor being an n-channel or n-type transistor and with the pinned photodiode having a p-type photodiode region for hole collection with a surface n-type pinning layer. When the dopant regions of the devices in the circuitry are "reversed" in this way, supply voltages and control signals may also be adjusted to suit the properties of the devices with the "reversed" dopant regions.

A pixel supply voltage VAA may be provided to the ADC converter 300 at a supply terminal 302. VAA may be a positive pixel supply voltage. A pre-charge transistor 304 may selectively couple the supply voltage terminal 302 to a floating node 308. Pre-charge transistor 304 may be a p-channel transistor (such as a planar PMOS transistor) having a gate that is asserted when a logic "low" or ground voltage is applied to the gate of the transistor 304. Node 308 may be referred to as floating because it may not be connected, at least not constantly, to any voltage source. Therefore, the floating node 308 may be effectively isolated from other nodes in the converter 300, in that charges on the floating node 308 may remain stable when the control signals to the various transistors, that result in the connection of the floating node 308 to any other node, are de-asserted.

Pinned photodiode devices PPD_1 in ADC converter 300 may correspond to n-type photodiode regions provided with a p-type pinning layer as described above. In other words, the PPD_1 pinned photodiodes may be electron accumulation devices having n-type photodiode well regions, with a p-type pinning layer that is formed over the photodiode well region and inherently contributes to setting a constant built-in pinning voltage determined by doping levels in the n-type photodiode, surface p-type pinning layer, and surrounding p-type substrate. The built-in pinning voltage Vpin (not marked in FIG. 3) of the PPD_1 pinned photodiodes may determine the conditions in which a full charge transfer from any one of the PPD_1 pinned photodiodes is possible. Specifically, when a node such as floating node 308 has a voltage potential level that is greater than the pinning voltage Vpin of a given pinned photodiode PPD_1, a complete transfer of the electrons from the PPD_1 node to the floating node 308 may be possible. In the descriptions below, it will be assumed that the pinning voltages at pinned photodiode devices of either dopant type (i.e., pinned photodiodes with n-type photodiode regions and p-type pinning layers or pinned photodiodes with p-type photodiode regions and n-type pinning layers) are constructed with a suitable built-in voltage at their pinning layer that enables the complete transfer of charges from the pinned photodiodes to the node at which the charges are to be received.

As illustrated in FIG. 3, multiple pinned photodiodes PPD_1 may be provided in parallel charge transfer circuits 340. In the most basic operating mode of the ADC circuitry 300, only a single charge transfer circuit 340 is required. However, the inclusion of multiple parallel charge transfer circuits 340 (sometimes referred to herein as "charge transfer stages" 340) may improve the speed at which the ADC circuit 300 can operate, by enabling a faster integration of charges on a floating node 308 through the multiple charge transfers from each of the parallel charge transfer stages 340 to the floating node 308. Charge transfers to and from the multiple parallel charge transfer stages 340 may be simultaneous. Or, each of the parallel charge transfer stages 340 may be independently controllable to transfer charges to and from its respective pinned photodiode PPD_1, regardless of the control signals applied to any other charge transfer stage 340.

In certain embodiments, it may be desirable to group sets of parallel charge transfer stages 340 and provide the groups of parallel charge transfer stages 340 with the same control signals. As an example, if an ADC circuit 300 includes 64 parallel charge transfer stages 340, eight groups of 8 parallel charge transfer stages 340 may be formed, with each group of parallel charge transfer stages 340 receiving common control signals which effectively operate each of the charge transfer stages 340 simultaneously, and in an identical manner. Parallel charge transfer stages 340 may, in this way, be divided into one, two, or any number of groups.

Each charge transfer stage 340 may include a fill transistor 332 that connects a ground supply terminal 306 to the pinned photodiode PPD_1 when the fill transistor 332 gate is asserted, thereby turning on the fill transistor 332. Ground supply terminal 306 may provide a constant supply voltage of 0V, or any other suitable voltage. Ground supply terminal 306 may be an adjustable supply terminal whose voltage can be adjusted during operation of the ADC 300. Fill transistors 332 may be viewed as transfer gates between the ground supply terminal 306 and the pinned photodiodes PPD_1 in their respective charge transfer stages 340. Fill transistors 332 may be formed in a manner similar to an anti-blooming gate is formed relative to the pinned photodiodes in the image pixel array (not shown).

Activation of the fill transistors 332 may cause charges to accumulate in the pinned photodiodes PPD_1. In the exemplary embodiment of FIG. 3, where the pinned photodiodes PPD_1 have n-type photodiode wells formed with p-type pinning layers over the n-type photodiode wells, activation of the fill transistors 332 may cause electrons to accumulate in the pinned photodiodes PPD_1. The amount of charge transferred into the PPD_1 when the fill transistor is activated may be based on the duration of the interval during which the fill transistor 332 is activated, the voltage level on the fill transistor drain, and on the full well capacity of the pinned photodiode that is determined by the doping level of the photodiode.

Each charge transfer stage 340 may also include a transfer transistor 334 that connects the pinned photodiode PPD_1 to the floating node 308 (sometimes referred to herein as the Cdac1 node) when the transfer transistor 334 gate is asserted, thereby turning on the transfer transistor 334. Asserting the transfer transistor 334 may allow the charges accumulated in the pinned photodiode PPD_1 to be completely transferred to the floating node 308.

In a given charge transfer stage 340, the respective pinned photodiode PPD_1, the fill transistor 332, and transfer transistor 334 are ideally the same devices as used in the image pixel array from which the ADC 300 receives pixel reset and pixel signal levels. Fill transistor 332 transistor may correspond to the anti-blooming AB gate for a pixel which drains excess charges in a pixel photodiode to a supply voltage to prevent excess charges from contaminating other nodes in the pixel or neighboring pixels. Transfer transistor 334 may correspond to the pixel transfer gate which transfers accumulated photogenerated charges from the pinned photodiode of an image pixel to a pixel floating diffusion node.

In this way, pixel structures that are already designed and optimized for use in the image sensor pixels that produce image signals may be leveraged elsewhere on the image sensor die (or on a separate die, in a stacked-die embodiment) in processing circuitry such as the ADC 300. Implanting the various regions of semiconductor substrate to produce the transistors and pinned photodiodes in the charge transfer stages 340 may be performed using substantially the same methods by which the doped regions for corresponding structures in the pixels of the image pixel array are formed and implanted.

The floating node 308 may be used to generate a single slope ramp for use in the operation of ADC 300. This ramp values generated at the floating node 308 may be compared to the pixel value stored on the Vref_comp capacitor 312. Specifically, a pixel sample-and-hold output 316 from the image pixel array may be transferred via a pixel output transfer transistor 314. Transistor 314 may be used to transfer either a pixel signal level corresponding to an amount of charge from the photodiode of a given pixel in the image pixel array, or a pixel reset level corresponding to an output level of a pixel that has been reset. Pixel reset levels may be converted using ADC 300 for use in correlated double sampling (CDS) imaging. Both pixel reset and pixel signal levels are digitized and subsequent digital CDS circuitry (not shown) may be used to generate a final pixel digital value, often by subtracting the pixel reset level from the pixel signal level.

Figure 3B:
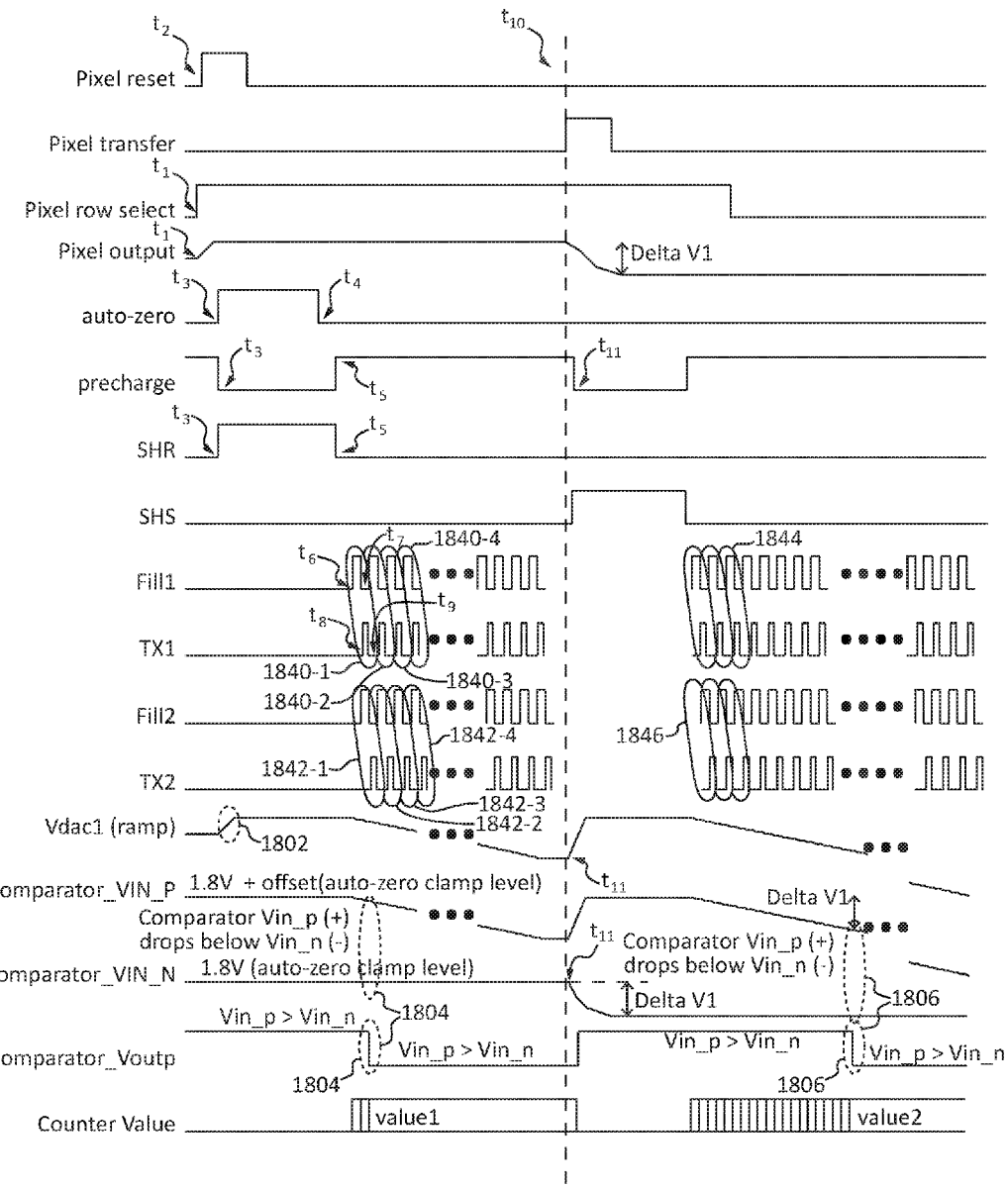
FIG. 3B is a timing diagram for operating the single slope ADC with pinned photodiode charge transfer circuits of FIG. 3A in accordance with an embodiment of the present invention.

Prior to the conversion operations of ADC 300, the pixel row select may be activated at time t1 of FIG. 3B, which produces a corresponding signal at the pixel output received by the sampling transistor 314. At t2 of FIG. 3B subsequent to t1, the pixel reset signal is asserted, causing the pixel output to reflect the pixel reset level.

Figure 4A:
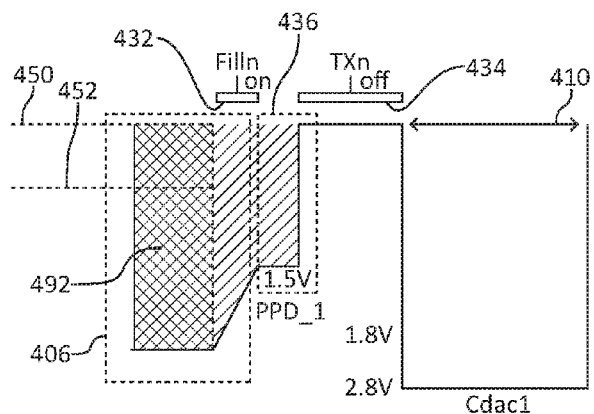
FIGS. 4A-4D illustrate steps for filling a pinned photodiode charge transfer circuit and transferring charge packets to a summing node in accordance with an embodiment of the present invention

The ADC 300 operation may begin with the Cdac1 node 308 being pre-charged from the supply terminal 302 via the pre-charge transistor 304, to a pre-charge voltage. The pre-charge operation may correspond to the asserted signal on the pre-charge line between t3 and t4 of FIG. 3B, during which the PMOS transistor 304 gate signal is deasserted to precharge the Vdac1 node (i.e., event 1802 of FIG. 3B). The pre-charge voltage may be any level, but for the purposes of illustration will be assumed to be 2.8V. Floating node 308 is pre-charged while the comparator 318 is auto-zeroed (also at time t3, until time t4 of FIG. 3B), when applicable based on the specific implementation of ADC 300, while the input capacitors 316-1 and 316-2 are clamped (i.e., the clamping switches 314-1 and 314-2 are closed to connect the Vclamp supply voltage terminals to the capacitors 316), and while the pixel reset level is sampled on the Vref_comp capacitor 312 (i.e., when a reset level provided at the pixel output 316 is transferred to the Vref_comp capacitor 312 via the pixel output transfer transistor 314). The sampling of the pixel reset level may occur in the interval between t3 and t5 when the SHR signal provided to the sampling transistor 314 is asserted as shown in FIG. 3B. After the pre-charge operation, the PPD_1 device in at least one charge transfer stage 340 may be filled with electrons, in the most basic mode of operation. FIGS. 4A-4D are potential diagrams (sometimes referred to as a "fluid diagrams") that illustrate how a pinned photodiode PPD_1 may be filled with electrons which are then transferred to a floating circuit node, in accordance with an embodiment. Turning to FIG. 4A, a generic charge transfer stage 340 is illustrated with the fill transistor 332 being represented by the fill gate 432. The pinned photodiode PPD_1 may be filled up with electrons by keeping the drain of the fill transistor 332 at a ground voltage (such as 0V, for example) while asserting the gate of the fill transistor 332 to turn the transistor on, as is illustrated at time t6 of FIG. 3B where the Fill1 signal provided to the fill transistor 332-1 in the charge transfer stage 340-1 is asserted. In FIG. 4A, the fill gate 432 is asserted or activated, allowing the supply voltage electrons 492 in the supply region 406 of the diagram (corresponding to the ground supply 306 of FIG. 3), to flow through the fill transistor (i.e., through the channel below the fill gate 432) and into the pinned photodiode PPD_1 well region 436. Because the transfer transistor 334 (shown in FIG. 4A as transfer transistor gate 434) is de-asserted, electrons in the pinned photodiode PPD_1 are unable to travel through the channel below the transfer transistor gate 434 into the floating node 310 (shown in FIG. 4A as Cdac1 well region 410).

Figure 4B:
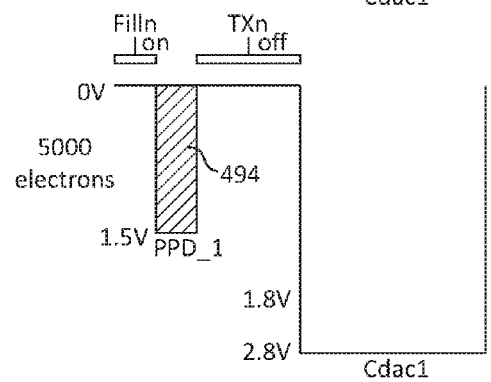
Figure 4C:
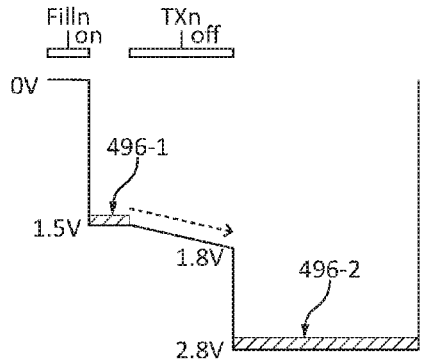
Figure 4D:
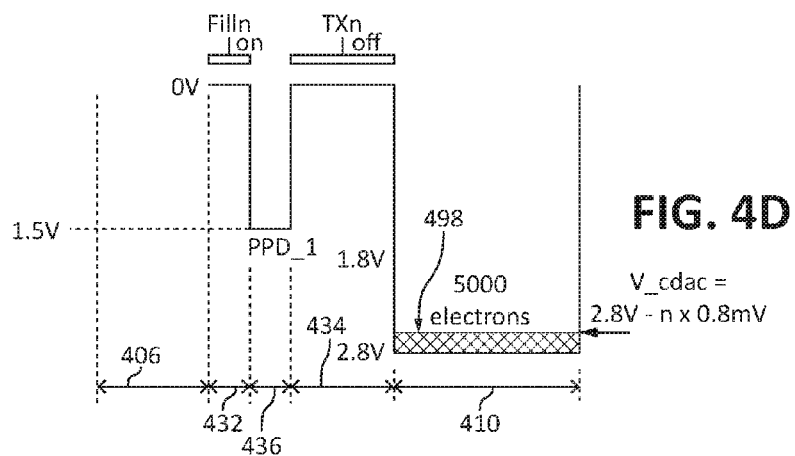

FIG. 4B illustrates the subsequent state of the charge transfer stage 340, specifically illustrating the fill gate 432 being de-asserted (such as at t7 of FIG. 3B where the Fill2 signal provided to the fill transistor 332-1 in the charge transfer stage 340-1 is de-asserted), in which the pinned photodiode PPD_1 well may be isolated from the supply region 406 (whose shaded charges are not illustrated in FIGS. 4B-4D, so as to avoid unnecessarily obscuring the relevant features of the drawings). In FIG. 4B, the pinned photodiode PPD_1 may be filled to its full-well capacity, or the maximum amount of majority charge carriers that can be stored in the n-type photodiode well of the pinned photodiode PPD_1. In the exemplary embodiments described herein, it may be assumed that the full well capacity of pinned photodiode PPD_1 is 5,000 electrons. However, variations in the full well capacity of a pinned photodiode PPD_1 may be determined by the formation of the pinned photodiode structure during silicon processing. Moreover, the thermal energy of electrons flowing through the channel under the fill transistor gate 432 of the fill transistor 332 introduces thermal noise (sometimes referred to herein as "kTC noise") which may cause the exact amount of charge or the exact number of electrons in the "filled" pinned photodiode PPD_1 of FIG. 4B to vary. FIG. 4C illustrates how, when the gate 434 of a transfer transistor 334 in a charge transfer stage 340 is asserted, turning the transfer transistor 334 on, the charges 494 that filled up the pinned photodiode PPD_1 are transferred to the floating node 308 well region 410 (such as at time t8 of FIG. 3B, where the TX1 signal provided to the transfer transistor 334-1 in charge transfer stage 340-1 is asserted). Charges 496-1 may flow from the pinned photodiode PPD_1 well region 436 across the channel under the transfer transistor 334 gate 434 into the floating node 308 well region 410. Charges 496-2 that are transferred into the floating node 308 well region 410 may be prevented from transferring back into the PPD_1 well by the potential barrier between the floating node 308 well region 410 and the pinned photodiode well region 432, even when the transfer transistor gate 434 is asserted as illustrated in FIG. 4C.

FIG. 4D illustrates how, subsequent to the complete charge transfer of FIG. 4C, the transfer transistor 334 gate 434 may be deassserted at time t9 of FIG. 3B where the TX1 signal provided to the transfer transistor 334-1 in charge transfer stage 340-1 is de-asserted, with the transferred charges 498 corresponding to a full-well capacity of the pinned photodiode PPD_1 are transferred or inserted into the floating node 308 well region 410. Because the full-well capacity of the pinned photodiode corresponds is used in each full-transfer of a charge transfer stage 340, each full-well capacity of a pinned photodiode PPD_1 may be treated as a charge packet. Transferring a charge packet from a pinned photodiode PPD_1 of a single charge transfer stage 340 to the floating node 308 may cause the voltage at the floating node 308 to drop or decrease by 0.8 mV from its previous voltage, assuming a full well capacity of 5,000 electrons and a 1 picofarad capacitance of floating node 308 (calculated by solving for V using the aforementioned C=Q/V equation). In ADC circuitry that uses electron accumulation pinned photodiodes (i.e., photodiodes that have an n-type photodiode well), counter 320 may decrement a count value, because the voltage at the floating Cdac1 node 308 with which the sampled voltage across Vref_comp capacitor 312 is compared is a decreasing voltage. The voltage at the floating Cdac1 node 308 decreases when the pinned photodiodes PPD_1 have n-type photodiode wells, because negative charge packets (i.e., packets of electrons having a size corresponding to a full well capacity of one or more photodiode wells) are successively transferred to the floating Cdac1 node 308 using the charge transfer stages 340.

The successive transfer of negative charge packets to the floating Cdac1 node 308 may be used to generate a decreasing ramp signal that begins with an initial value based on the initial pre-charge of the floating Cdac1 node 308 by the supply voltage 302 via the pre-charge transistor 304. At each clock cycle, one or more charge transfer stages 340 may be used to transfer negative charge packets to the floating Cdac1 node 308. The counter 320 may, at each cycle of the clock provided at the clocking input of counter 320, decrement the counter from a maximum value corresponding to the bit-resolution of the ADC 300. At each clock cycle, a charge transfer stage 340 may be used to transfer a negative charge packet corresponding to a full photodiode PPD_1 well to the floating Cdac1 node 308. In this way, at each clock cycle the voltage of the floating Cdac1 node 308 may be lowered by an amount based on a pinned photodiode PPD_1 full well capacity, as the count maintained by the counter 320 is decremented by one.

As mentioned previously, when counter 320 is implemented as a decrementing circuit, the initial value from which the counter 320 begins decreasing corresponds to the bit-resolution of the ADC 300. As an example, when the counter 320 is implemented as a decrementing circuit in a 10-bit ADC, the initial value from which the counter 320 starts decrementing is 1024 (corresponding to the maximum range of decimal values that can be represented by 10-unsigned data bits). Similarly, when the counter 320 is implemented as a decrementing circuit in a 12-bit ADC, the initial value from which the counter 320 starts decrementing is 4096 (corresponding to the maximum range of decimal values that can be represented by 12-unsigned data bits). The counter value maintained by the counter 320 may be provided at the output 326 of the counter 320, as an n-bit value in an ADC 300 with an n-bit resolution.

In certain embodiments, such as when the pinned photodiodes PPD_1 are implemented as p-type wells with an n-type pinning layer, the charges accumulated in the pinned photodiodes PPD_1 with the p-type wells may be holes, which, when transferred to the floating Cdac1 node 308, may increase the voltage at the floating Cdac1 node 308. Floating Cdac1 node 308 may have an effective capacitance illustrated by capacitor 310. When pinned photodiodes PPD_1 are implemented as p-type wells with an n-type pinning layer, the counter 320 may be configured to function as an incrementing circuit, because the successive transfers of positive (hole) packets to the floating Cdac1 node 308 may generate an increasing ramp voltage at the floating Cdac1 node 308. Counter 320 may, at every clock cycle, increment a count value starting from zero, as long as it is enabled. When pinned photodiodes PPD_1 are implemented with p-type wells, the enabling input of counter 320 may be produced by a comparator that is enabled when the voltage at the floating Cdac1 node 308 (at which an voltage ramp that increases every clock cycle is produced, by the transfer of hole charge packets from the p-type well pinned photodiodes PPD_1) is less than the voltage across the Vref_comp capacitor 312. In other words, when the pinned photodiodes PPD_1 are formed with p-type wells that are filled with holes, which are transferred to the floating Cdac1 node 308 using a transfer transistor 334 in a charge transfer stage 340, the comparator 318 may have a negative input coupled to the coupling capacitor 316-1 illustrated in FIG. 3, and a positive input coupled to the coupling capacitor 316-2 illustrated in FIG. 3.

Figure 5:
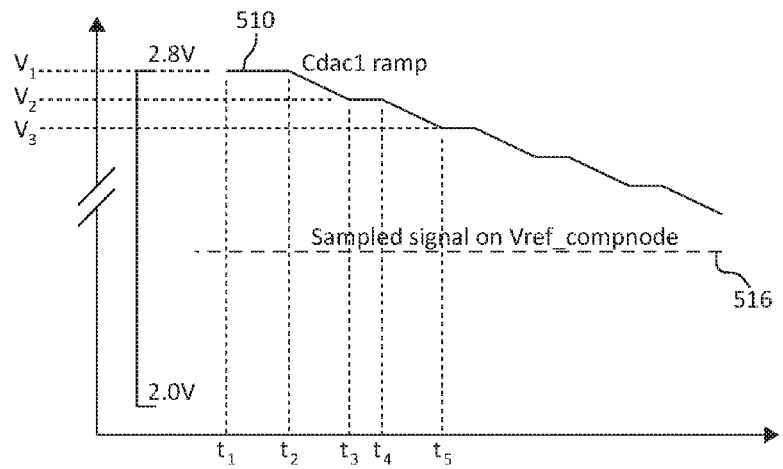
FIG. 5 is a graph showing the generation of a ramp voltage using the ADC of FIG. 3 in accordance with an embodiment of the present invention.

Returning to the exemplary embodiment illustrated in FIG. 3, where the pinned photodiodes PPD_1 in the charge transfer stages 340 are used to transfer electron packets to the floating Cdac1 node 308, a voltage ramp that decreases from a pre-charge voltage every clock cycle by an amount corresponding to the number of charge packets that are used to transfer charges to the floating Cdac1 node 308 may be generated at the floating Cdac1 node 308. FIG. 5 illustrates an exemplary decreasing voltage ramp 510 that may be generated at the floating Cdac1 node 308. V1 in FIG. 5 may correspond to the voltage level at floating Cdac1 node 308 after the gate of pre-charge transistor 304 is asserted, turning on pre-charge transistor 304 and thereby charging the floating Cdac1 node 308 to the supply voltage VAA 302 at time t1. For the purposes of illustration, VAA is illustrated in FIG. 5 as being 2.8 V, however any suitable voltage for VAA may be used.

At time t2, one or more charge transfer stages 340, each of which have respective pinned photodiodes PPD_1 filled with electrons (corresponding to the state illustrated in FIG. 4B), may transfer their respective one or more electron packets (sometimes referred to as negative charge packets) to the floating Cdac1 node 308. At time t3, the negative charge packets have been transferred to the floating Cdac1 node 308, and have reduced the voltage at the floating Cdac1 node 308 to a voltage V2 that is less than the pre-charge voltage V1. The difference between V1 and V2 may be determined by the number of charge transfer stages 340 that are used to transfer negative charge packets to the floating Cdac1 node 308 at time t2. As an example, if only a single charge transfer stage 340 is used to transfer a single negative charge packet, the difference between V1 and V2 may correspond to the decrease in voltage caused by transferring a number of electrons corresponding to a full-well capacity of the pinned photodiode PPD_1 of the single charge transfer stage to the floating capacitive node 308. Specifically, because C=Q/V can be re-written as V=Q/C, where Q is the amount (or change in the amount) of charge in coulombs, V is the voltage level (or change in the voltage level), and C is the capacitance, the change in voltage at the floating capacitive node 308 that results from transferring a charge packet may be described as $(n \times F\_w \times -Q\_e)/C$, where n is the number of charge transfer stages 340 that are used to transfer negative charge packets to the floating capacitive node 308, F_w is the number of electrons that can be stored in a pinned photodiode PPD_1 (sometimes referred to as the full-well capacity of the pinned photodiode PPD_1), where Q_e is the magnitude of a single electron charge (approximately $-1.6 \times 10^{-19}$ Coulombs), and where C is the capacitance of a node 308.

Using the same exemplary values as mentioned in the above examples, where F_w is 5,000, and C is 1 picofarad, when a single charge transfer stage 340 is used to transfer charge to the floating node 308 (i.e., when n is 1), the difference between V2 and V1 is approximately 0.8 mV (or, $8 \times 10^{-4}$ V). At time t4, one or more charge transfer stages 340 may be used to transfer additional negative charge packets to the floating node 308. The number of charge transfer stages 340 used to transfer additional negative charge packets to the floating node 308 at time t4 may be the same as, or may be different from, the number of charge transfer stages 340 used to transfer negative charge packets to the floating node 308 at time t2. In a preferred embodiment or bit-encoding scheme, where successive digital values (e.g., any first digital value and a second digital value that is greater than the first digital value by one) in the bit-encoding scheme correspond to analog voltage levels separated by a constant difference (or, step size), the number of charge transfer stages 340 that are used to transfer negative charge packets at time t2 may be the same as the number of charge transfer stages 340 that are used to transfer negative charge packets at time t4. At time t5, the transfer of negative charge packets to the floating Cdac1 node 308 may be complete and the voltage at the floating node 308 may have a level V3, corresponding to the change in voltage produced at the floating node 308 as a result of the negative charge packets that were transferred to node 308 at time t4.

The interval between t1 and t3 may be equal to the interval between t3 and t5 and may correspond to a clock period. The interval between t1 and t3, and the interval between t3 and t5 may be referred to as a charge transfer interval. A clock having a period equal to charge transfer interval may be provided to the counter 320 at its clocking input 328, in a preferred embodiment.

Returning to the exemplary analog-to-digital conversion of a pixel reset level on the Vref_comp capacitor 312, the pixel reset level may be represented by the sampled signal level 516 in FIG. 5. Generally, as long as the negative ramp signal 510 generated on the floating Cdac1 node 308 is above the sampled signal level 516, whether the sampled signal level 516 is a pixel reset level or a pixel signal level, the floating node 308 voltage level coupled through coupling capacitor 316-1 that is provided at the positive input of comparator 318 may be greater than the sampled voltage across Vref_comp capacitor 312 coupled through coupling capacitor 316-2 that is provided at the negative input of comparator 318. Consequently, as long as the negative ramp signal 510 generated on the floating Cdac1 node 308 is above the sampled signal level 516, the comparator 318 output provided at the enable input of counter 320 may be at a logic high level (a positive voltage level, in the present example), enabling the counter 320, which decrements a count value from an initial value (as discussed above, 1024 for a 10-bit resolution ADC 300, and 4096 for a 12-bit resolution ADC 300) at every cycle of the clock signal received at the clocking input 328 of counter 320.

When the negative ramp signal 510 drops below the sampled signal level 516, the voltage level at the positive input of the comparator 318 may drop below the voltage level at the negative input of the comparator 318, causing the output of comparator 318 that is provided to the enabling input of the counter 320 to flip from a logic high level to a logic low level (a ground voltage level, in the present example). The transition of the output of the comparator 318 from a logic high level to a logic low level may disable the counter 320 and indicate that the conversion is complete. When counter 320 is disabled, the count value maintained in counter 320 may be maintained, and may correspond to a digital value that corresponds to the sampled signal level across the Vref_comp capacitor 312. When counter 320 is disabled, circuitry controlling the ADC 300 may detect that the conversion operation is complete and proceed to subsequent conversions.

With the sampling and conversion operation of the pixel reset signal described above, this first conversion of the pixel reset signal level corresponds to converting the kTC noise associated with the Cdac1 node 308, the kTC noise associated with the coupling capacitors 316, and the kTC noise associated with the Vref_comp sampling capacitor 312 as well as the comparator 318 offset. For a subsequent, second conversion, floating Cdac1 node 308 may be pre-charged to the supply voltage 302 level via the pre-charge transistor 304, but the clamp switches 314 are not closed, as they were in the first conversion of the pixel reset signal level prior to sampling the pixel reset level on the Vref_comp capacitor 312 and generating the ramp at floating Cdac1 node 308, to connect respective ends of the coupling capacitors 316-1 and 316-2 to the Vclamp voltage. Instead, the coupling capacitors 316-1 and 316-2 are not clamped again after the conversion of the pixel reset signal, in order to maintain the kTC noise of the coupling capacitors 316. The sampling transistor 314 may then be used to sample a pixel signal level onto the Vref_comp capacitor 312.

Because the coupling capacitor 314-2 that is connected to the Vref_comp capacitor 312 is not clamped, the input to the negative input of comparator 318 may correspond to the difference between the reset and signal levels. Hence, the second conversion of the pixel signal corresponds to the conversion of the kTC noise associated with the floating Cdac1 node 308, the kTC noise associated with the Vref_comp capacitor 312, the comparator offset, and difference between the pixel resent and pixel signal levels. Digital correlated double sampling (CDS) between the results of the first conversion of the pixel reset level and the second conversion of the pixel signal level may then remove the comparator offset and kTC noise associated with the coupling capacitors 314.

The pixel signal level may be converted after time t10 of FIG. 3B in a manner similar to the conversion of the pixel reset level, at least in that the sampled voltage 516 across the sampling capacitor 312 may be compared to the negative ramp voltage 510 that is generated at the floating node 308, through the coupling capacitors 316-2 and 316-1, by comparator 318, which enables the counter 320. At time t10 of FIG. 3B, the pixel transfer may be asserted, which causes the pixel output level to decrease by an amount Delta V1 that is proportional to the signal charge at the floating diffusion node of the pixel. When the SHS signal is asserted at time t11, the pixel signal output may be sampled at the sampling capacitor 312, which may cause the voltage level at Comparator_VIN_N to drop by the amount Delta V1 starting at t11. Also at t11, the PMOS pre-charge transistor 304 gate signal is deasserted (i.e., precharge is deasserted at t11 of FIG. 3B) causing the voltage at Vdac1 to be reset to the pixel supply level VAA. Interleaved charge transfer operations 1844 and 1846 may commence, causing the voltage at the Vdac1 node 308, and consequently the Comparator_VIN_P node to drop, and causing the output of the comparator to be at a logic high level, enabling counter 320.

While enabled, counter 320 may decrement a count value by one, from an initial value corresponding to the bit-resolution of the ADC 300, at every cycle of the clock provided at the clocking input 328 of the counter 320. When the decreasing ramp voltage at the floating node 308 is less than the sampled pixel signal voltage level across the Vref_comp 312, the output of comparator 318 may transition from a logic high level to a logic low level as shown by event 1806 of FIG. 3B, thereby disabling the counter 320 and signaling the completion of the pixel signal voltage level conversion. The last value of the count value maintained by counter 320 before the counter 320 is disabled may correspond to a digital value corresponding to the analog voltage level across the Vref_comp capacitor 312. Using the exemplary diagram of FIG. 5, the voltage difference between charge transfer intervals (i.e., the interval between t1 and t3 and the interval between t3 and t5) may correspond to a common voltage difference between V1 and V2, and V2 and V3. This common voltage difference amount sets the LSB size for the ramp. For a 10-bit ADC 300, the ramp covers an input range of 1023 steps×0.8 mV, assuming that only one charge transfer stage 340 is used to transfer a charge packet to the floating Cdac1 node 308 during a charge transfer interval, which is approximately 878 mV. Because of the uncertainty in charge written into the pinned photodiode devices PPD_1, there may be uncertainty in the maximum value of the ramp at the end of any conversion. This uncertainty may be proportional to the square root of the number of transfers and the random uncertainty in pinned photodiode charge. Specifically, this uncertainty may be equal to the kTC noise associated with the number of charge transfer stages 340 used to transfer charge packets to the floating Cdac1 node 308 during a charge transfer interval, multiplied by the square root of the number of transfers needed to generate a full ramp of voltage levels (which corresponds to the bit-resolution of the ADC 300).

As an example, the maximum ramp value uncertainty assuming a single charge transfer stage is used to transfer a charge packet to the floating Cdac1 node 308 during a charge transfer interval for a 10-bit ADC may be determined by multiplying the kTC noise of 1.44 µV associated with the 9 electron kTC noise of a single charge transfer by the square root of 1024 (because 1024 is the number of steps in a full voltage ramp in a 10-bit ADC), or 46 µV. Similarly the maximum ramp value uncertainty assuming 10 charge transfer stages are used to transfer charge packets to the floating Cdac1 node 308 during a charge transfer interval for a 10-bit ADC may be given by 4.6 µV (noise associated with the 28 electron kTC noise of 10 charge transfer stages' charge packet transfers) multiplied by the square root of 1024, or 146 µV. Similarly the maximum ramp value uncertainty assuming 40 charge transfer stages are used to transfer charge packets to the floating Cdac1 node 308 during a charge transfer interval for a 10-bit ADC may be given by 9.1 µV (noise associated with the 57 electron kTC noise of 40 charge transfer stages' charge packet transfers) multiplied by the square root of 1024, or 0.29 mV.

Even if there are a few hundred electrons of noise in a charge transfer stage's charge transfer operation and the final noise in the ramp value is larger than the LSB of the ADC 300 at the end of the conversion, shot noise in the pixel signal is still much larger (878 mV/5000*sqrt(5000)=11.6 mV, assuming an imaging pixel full well of 5000 electrons).

This analysis may also be applied to a 12-bit implementation of ADC 300. Because of additional charge transfers (4095 total charge transfers for a full ramp of voltages), the voltage swing increases on Cdac1. Because the minimum voltage on Cdac1 is 1.5V (set by the Vpin potential to guarantee complete charge transfer), the maximum DAC range is 2.8V−1.5V=1.3V. To enable 4095 charge packet transfers, the Cdac1 value is increased to 4 pF. The corresponding LSB ramp size is 0.2 mV (i.e., a quarter of the LSB ramp size used in embodiments with a 1 pF capacitor, assuming a full well capacity of 5,000 electrons) and the corresponding max ramp voltage swing is 819 mV (i.e., 4,096×0.2 mV), when the Cdac1 value is 4 pF and a 12-bit counter 320 is used in ADC 300.

The size of the Cdac1 capacitor can be reduced for 12-bit ADC operation if the amount of fill charge is reduced. The fill charge refers to the amount of charge filled in a pinned photodiode PPD_1 in any given charge transfer circuit 340 during a charge transfer operation, and is based at least in part by the voltage at the ground supply 306. Rather than filling the PPD_1 with electrons while the ground supply 306 is maintained at 0V, ground supply 306 may be held at a higher voltage such as 0.75V using the same charge transfer operations described in connection with FIGS. 4A-4D. When the ground supply 306 is held at a higher voltage such as 0.75V, the effective fill level of electrons in the supply region 406 (i.e., the voltage level provided at the ground supply 306 of FIG. 3) may be visualized as filling the supply region 406 up to a voltage level 452 that results in the pinned photodiode PPD_1 well region 436 being filled only up to the level 452, as opposed to being filled to capacity (i.e., up to the level 450) when the supply voltage 306 provides 0V.

By reducing the amount of charge that pinned photodiodes PPD_1 in the charge transfer stages 340 are used to transfer in each transfer operation, the Cdac1 capacitor size may be reduced while maintaining the ability to store the charge from the 4096 charge transfer operations from the one or more charge transfer stages 340 during the operation of a 12-bit embodiment of ADC 300. Ideally, the range of voltages that the 12-bit ADC 300 can convert is the same as the range of voltages that the 10-bit embodiment of ADC 300 can covert. Though the amount of charge transferred by pinned photodiodes PPD_1 in each charge transfer operation of stages 340 may be reduced by increasing the voltage provided at supply 306, the range of voltages that can be generated at the floating node 308 (which at least partially determines the voltages that can be converted by the ADC 300) may be selected by the size chosen for capacitor Cdac1 310. Because the size of Cdac1 capacitor 310 determines the voltage produced by the charges transferred by stages 340 at the floating node 308, the size of Cdac1 capacitor 310 may be increased or decreased based on the desired range of voltages to be converted by ADC 300, the voltage provided at supply 306 to the charge transfer circuits 340, and the full-well capacity of the pinned photodiodes PPD_1 in the charge transfer circuits 340.

Variation in full well capacity of pinned photodiodes PPD_1 as a result of process variation is fixed, and calibration may be used to compensate for non-random variation in ADC LSB step size and Vref node across capacitor 312 when matching multiple ADC circuits is needed. In connection with the illustrative ramp generation of FIG. 5, it was mentioned that while only a single PPD device in a charge transfer stage 340 may be used to generate the negative slope ramp, multiple pinned photodiodes (PPDs) in multiple charge transfer stages 340 may be used to generate the negative slope ramp. In FIG. 5, during the intervals between times t1 and t2, and between times t3 and t4, one or more of the charge transfer stages 340 takes time to fill its respective PPD_1 device and then transfers the charges to the Cdac1 node 308 in the intervals between times t2 and t3, and between times t4 and t5. The difference between voltages V1, V2, and V3 may be determined at least in part by the number of charge transfer stages 340 that are used to transfer charges from their respective PPD_1 devices onto the floating Cdac1 node 308 at times t2 and t4.

However, multiple PPD_1 devices can be used in order to pipeline the fill operations and have a faster ramp, with shorter intervals between changes in the generated ramp voltage 510 (i.e. shorter intervals between times t1 and t2 and between times t3 and t4). As illustrated in FIG. 3, multiple charge transfer stages 340 may be provided. Functionality of the ADC 300 is enabled by the inclusion of at least a single charge transfer stage 340. However, the inclusion and use of multiple charge transfer stages 340 may be used to increase the ramp maximum speed (i.e., the minimum interval required for a ramp signal to generate all of the desired comparison values in the desired range of comparison voltages). The ramp maximum speed critical step is increase at least in part by successively turning on transfer gates 334 in respective charge transfer stages 340 to generate the ramp, as opposed to simultaneously turning on one or more transfer gates 334 to generate the ramp. With successive charge transfers to the floating node 308 by multiple charge transfer stages 340 being staggered in time (i.e., being non-simultaneous), the charge transfers from the supply 306 to the pinned photodiode devices PPD_1 in respective charge transfer stages 340 may also be staggered in time. Specifically, the fill gates 332 in respective charge transfer stages 340 may be successively activated to fill the pinned photodiodes PPD_1 to either their full well capacity or to any other capacity determined by the voltage provided at the supply 306.

The inclusion of multiple charge transfer stages 340 also affords the ADC 300 with built in redundancy that ensures operability of the ADC 300 in the event that some of the PPDs PPD_1 in the charge transfer stages 340 are faulty. Multiple charge transfer stages 340 also enable the ramp step size (i.e., the difference between V1 and V2, and between V2 and V3 in the illustration of FIG. 5) to be varied, specifically by increasing the number of charge transfer stages that transfer charges to the floating Cdac1 node 308 at a given time. To compensate for full-well capacity variation in the pinned photodiodes PPD_1 in the charge transfer stages 340, the ADC 300 may be operated to randomly select one or more charge transfer stages 340 from the multiple charge transfer stages 340 to generate each voltage step (i.e., each LSB for the conversion) to randomize noise caused by the pinned photodiode PPD_1 full well variation, which may reduce gain mismatch between multiple columns of ADCs 300, when multiple ADCs 300 are implemented on an image sensor.

One disadvantage of the architecture of FIG. 3 is the change in common mode for the comparator in its switching point between performing the conversion for reset and signal. Specifically, the switching point of the comparator at a low voltage levels (such as when the pixel reset value is converted) may be different from the switching point of the comparator at higher voltage levels (such as when the pixel signal value is converted). Special design considerations are needed to make sure the comparator does not generate an input offset that changes with the common mode level for the comparator switching point.

Figure 6A:
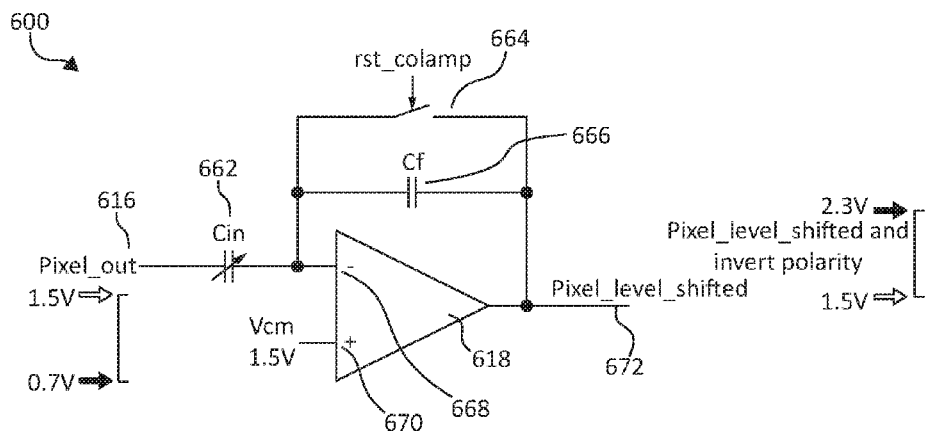
FIG. 6A is a voltage level shifter that changes the polarity and voltage level of an input voltage in accordance with an embodiment of the present invention.
Figure 7A:
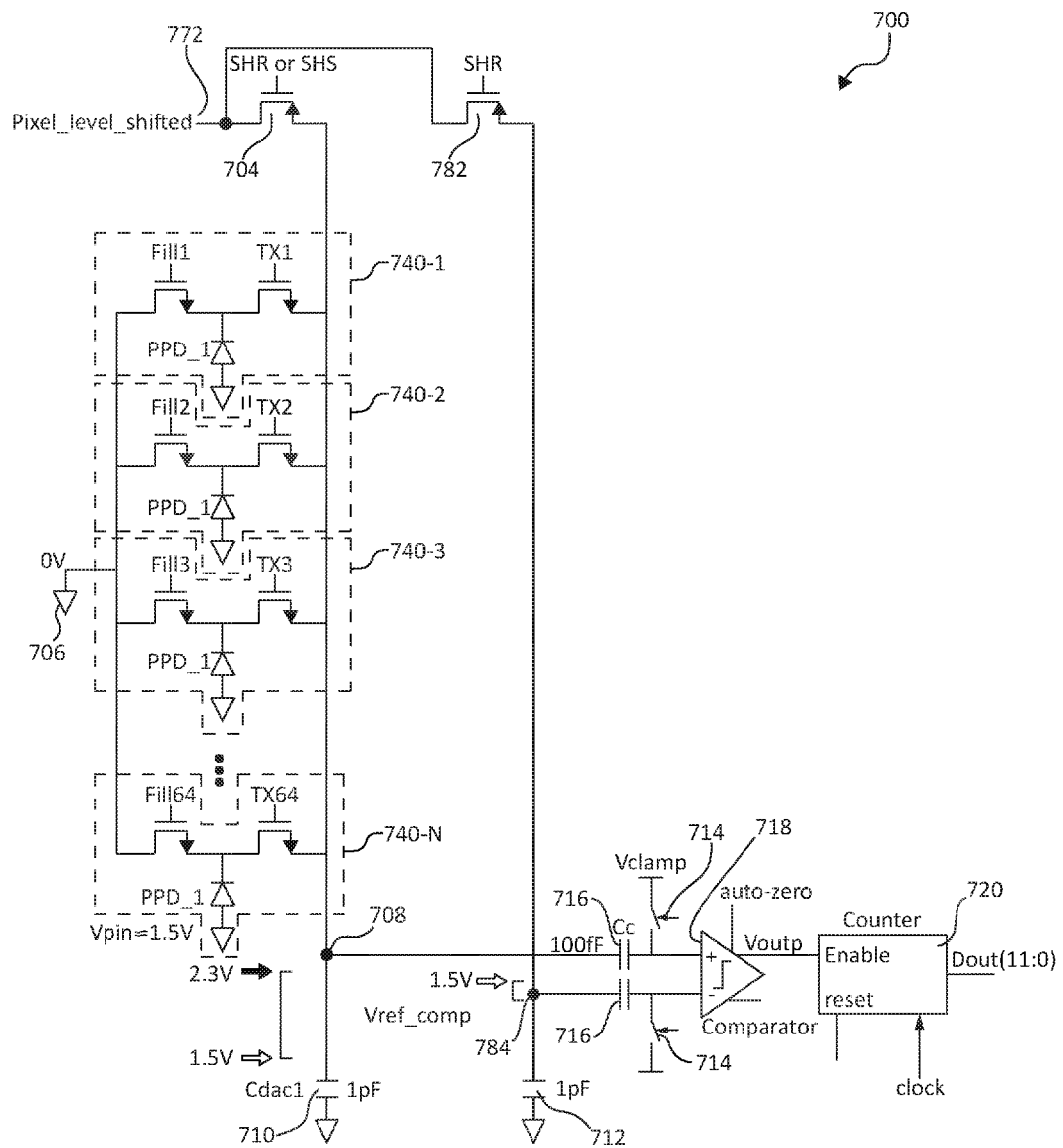
FIG. 7A is a schematic of a single slope ADC without a comparator signal dependent offset, with pinned photodiode charge transfer circuits in accordance with an embodiment of the present invention.

FIG. 6A illustrates a pixel signal level shifter 600 that when incorporated into an ADC 700 (of FIG. 7), obviates concerns about the comparator 318 of FIG. 3 having a first common mode switching level when converting a pixel reset charge value and having a second common mode switching level when converting a pixel signal charge value. The ADC 700 in FIG. 7 is provided the output 672 of the level shifter 600 at an input 772 that is provided at the respective source-drain terminals of the charging transistor 704 and the comparison node pass transistor 782. Operation of the ADC 700 in FIG. 7 is similar to the operation of ADC 300 of FIG. 3 described above, in that the conversion begins with the pixel reset charge being transferred to the Vref_comp capacitor 712 that is coupled to the negative input of the comparator 718 via one of the coupling capacitors 716.

However, in the FIG. 7 embodiment of ADC 700, the pixel reset charge that is transferred to the Vref_comp capacitor 712 has been inverted and level-shifted by level shifter 600 of FIG. 6A. An illustrative range of voltages that may be present at the input 616 of the level shifter 600 may be 1.5 V (for a pixel reset charge level) to 0.7 V (for a pixel signal charge level). Generally, the level shifter 600 in FIG. 6A may be used to invert and shift the input voltage range of 1.5 V to 0.7 V to an output voltage range of 1.5 V to 2.3V. Specifically, in response to receiving a voltage of 1.5V at the input 616, level shifter 600 may output a voltage of 1.5 V at the output 672 of level shifter 600. As the voltage at the input 616 decreases to 0.7 V, the voltage at the output 672 increases to 2.3 V. In other words, as the voltage at the input 616 decreases within a first range of input voltages, the voltage at the output 672 increases within a second range of output voltages.

The first and second ranges may be determined at least in part by the control signal provided to the variable capacitor 662 in level shifter 600. The variable capacitor 662 may be connected to a negative terminal 668 of an op-amp 618, which receives a common mode voltage Vcm at a positive terminal 670. The common mode voltage Vcm provided at the positive terminal 670 of op-amp 618 may determine, at least in part, the range of output voltages produced at the output 672 of level shifter 600. The level shifted pixel voltages stored on the floating Cdac1 node 708 must stay above the pin voltage Vpin of the PPD_1 devices in the charge transfer stages 740 (which, as an example may be 1.5 V) in order to enable complete charge transfer from the pinned photodiodes PPD_1 to the floating Cdac1 node 708. For additional margin in ADC 700, a slightly higher common mode voltage Vcm may be provided to the level shifter 600, (such as 1.7 V, when Vpin is 1.5 V) to make sure the conversion of the reset value or very low signal values does not drop below Vpin (or, 1.5V in this example).

Figure 7B:
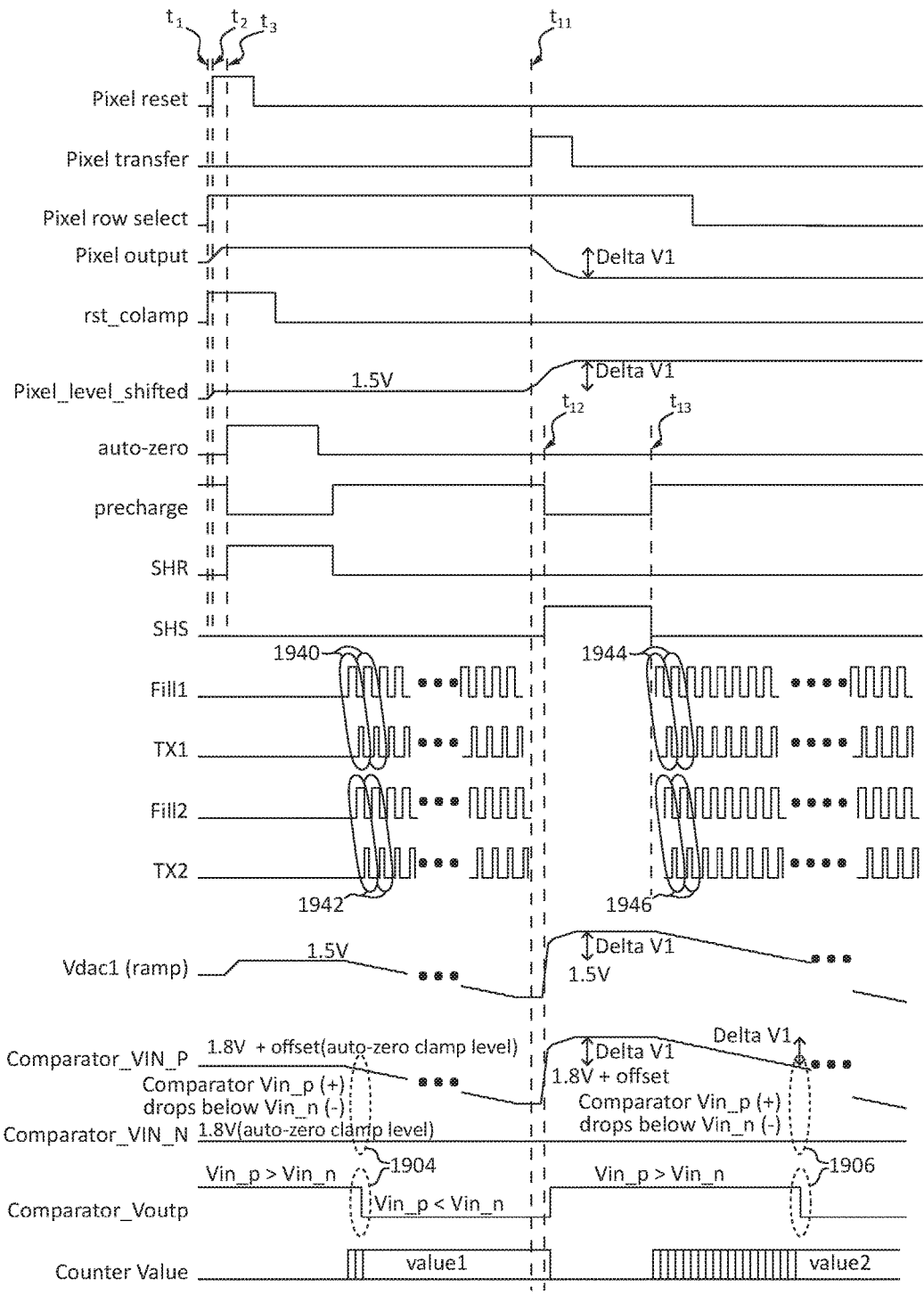
FIG. 7B is a timing diagram for operating the single slope ADC without a comparator signal dependent offset, with pinned photodiode charge transfer circuits of FIG. 7A in accordance with an embodiment of the present invention.

Between sampling operations of different pixels, the clamping switches 714 are enabled (i.e., to create a connection between the Vclamp supply and respective terminals of the coupling capacitors 716) as shown by the assertion of the auto-zero signal in FIG. 7B at time t3. After releasing the clamping switches 714, the pixel reset level may be transferred to floating Cdac1 node 708 and the Vref_comp comparison node 784 by asserting the transistors 704 and 782, respectively (at time t3 of FIG. 7B). Notably, the pixel reset level that is transferred to the floating Cdac1 node 708 and the Vref_comp comparison node 784 is an inverted and flipped voltage that is produced at the output 672 of the level shifter 600, indicated by the voltage level 1.5V at the Pixel_level shifted in FIG. 7B using the exemplary values of a pixel reset level of 0.7V. The conversion of the pixel reset level to a digital value is performed by the successive operation of at least one charge transfer stage 740 (represented as interleaved charge transfers 1940 and 1942) to the floating Cdac1 node 708 to generate a decreasing ramp signal 610 that in a manner similar to the method described in connection with FIG. 5. The charge transfers 1940 and 1942 need not be interleaved, but can instead be distributed in time in any other suitable manner. Because the pixel reset level is provided at both the floating Cdac1 node 708 and the Vref_comp comparison node 784, the counter 720 may be enabled for only a few clock cycles, during which at least one of the charge transfer stages 740 may be used to fill their at least one respective pinned photodiodes PPD_1 and synchronously transfer the charges from the at least one pinned photodiode PPD_1 to the floating Cdac1 node 708 to lower the voltage across Cdac1 capacitor 710, before being disabled at event 1904 of FIG. 7B when the voltage at the positive input of comparator 718 is exceeded by the voltage at the negative input of comparator (i.e., the voltage across the Vref_comp capacitor 712).

To sample and convert the pixel signal level, after the pixel reset level has been converted, the transistor 704 is enabled in ADC 700 at time t12 with the assertion of the SHS signal to transfer the pixel signal level (that has been level shifted by level shifter 600 subsequent to the transfer of the pixel signal at t11 by level shifter 600 when the Pixel transfer is asserted) to the floating Cdac1 node 708. In ADC 700, the coupling capacitors 716 are not clamped by enabling/closing the switches 716, after the pixel signal level conversion is performed (i.e., the auto zero signal is not enabled after t11 during the conversion process of the pixel signal level). Instead, the comparison node 784 maintains the pixel reset level across the Vref_comp capacitor 712, while only the floating Cdac1 node 708 receives the pixel signal level output by the level shifter 600.

Figure 6B:
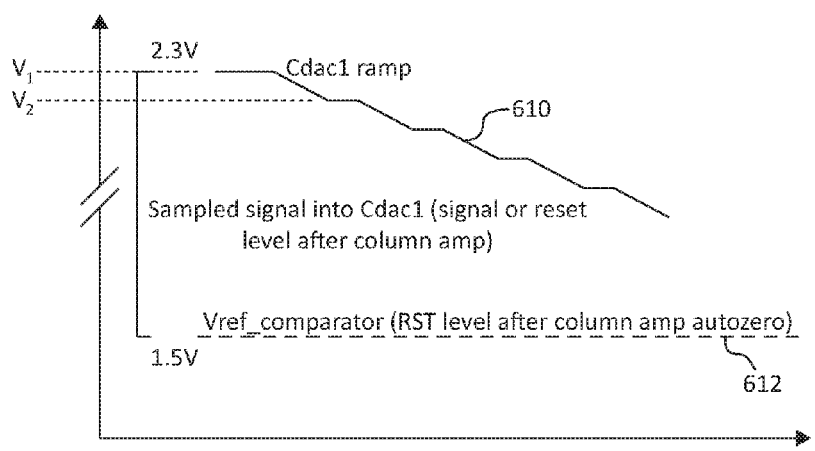
FIG. 6B is a graph showing the generation of a ramp voltage using a single slope ADC without a comparator signal dependent offset in accordance with an embodiment of the present invention.

Once the pixel signal level has been transferred to the floating Cdac1 node 708, the conversion of the pixel signal level may commence with the generation of a ramp voltage 610 illustrated in FIG. 6B. Specifically, the initial pixel signal level (such as V1 in FIG. 6B, for example) may be decreased by an amount based on the full-well or partial-well capacities of at least one pinned photodiode in at least one respective charge transfer stage 740, and also based on the size of the Cdac1 capacitor 710, to a voltage level V2.

Charge transfers from charge transfer stages 740 may occur synchronously (i.e., every clock cycle) and may decrease the voltage across the Cdac1 capacitor 710 by a fixed step size corresponding to the LSB value represented by the converted digital value. Charge transfers may also be interleaved as is illustrated in FIG. 7B where charge transfers 1944 and 1946 are interleaved to create the decreasing voltages at the Vdac1 node 708, which in turn effects a proportional change (specifically, decreasing voltage ramp) at the Comparator_VIN_P node. After every charge transfer from stages 740 (i.e., at every clock cycle, or after every charge transfer operation 1944/1946), a count value stored in the counter 720 may be incremented, provided that the voltage across the reference capacitor 712 (i.e., the voltage corresponding to the pixel reset level) is exceeded by the voltage across the Cdac1 capacitor 710 after the charges have been transferred by the at least one charge transfer stage 740 used to transfer charge to the floating node 708. The count value stored in the counter 720 is output when the voltage across the Cdac1 capacitor 710 is exceeded by the voltage across the Vref_comp capacitor 712 (i.e., just as the ramp voltage 610 at node 708 decreases beyond the reset level held at node 784) as is illustrated by the event 1906 of FIG. 7B. In this way, the count value maintained by the counter 720 is proportional to the number of voltage steps (or, charge transfers from at least one charge transfer stage 740) that are required to lower the pixel signal voltage to the pixel reset voltage, which is in turn proportional to the magnitude of the pixel signal voltage.

As an example, when a given pixel is operated in low-light conditions, the pixel signal provided at the input 616 of the level shifter 600 may be close to or slightly below 1.5 V (i.e., close to or below the pixel reset level of 1.5 V); consequently as described above, the voltage produced at the output 672 may be close to or slightly above 1.5 V. Because the voltage close to 1.5 V at the output 672 is provided at the source-drain terminal of transistor 704 and then asserted at the floating node 708 when the gate of transistor 704 is activated, the number of charge transfer operations to floating node 708 by stages 740 before the voltage across the Cdac1 capacitor 710 is exceeded by the voltage across the Vref_comp capacitor 712 (i.e., the pixel reset level 612 output by the level shifter 600) may be small. When only a small number of synchronous charge transfers are required to reduce the voltage across the Cdac1 capacitor 710 below the voltage across the Vref_comp 712, the count value maintained in the counter 720 may also be small.

When a given pixel is operated in bright-light conditions, the pixel signal provided at the input 616 of the level shifter 600 may be close to or slightly above 0.7 V; consequently as described above, the voltage produced at the output 672 may be close to or slightly below 2.3 V. Because the voltage close to 2.3 V at the output 672 is provided at the source-drain terminal of transistor 704 and then asserted at the floating node 708 when the gate of transistor 704 is activated, the number of charge transfer operations to floating node 708 by stages 740 before the voltage across the Cdac1 capacitor 710 is exceeded by the voltage across the Vref_comp capacitor 712 (i.e., the pixel reset level 612 output by the level shifter 600) may be large. When only a large number of synchronous charge transfers are required to reduce the voltage across the Cdac1 capacitor 710 below the voltage across the Vref_comp 712, the count value maintained in the counter 720 may also be large.

Returning to the issue of the comparator 318 in ADC 300 potentially having different common mode switching values depending on whether a pixel reset or a pixel signal level is being converted, the comparator 718 in ADC 700 does not have any such issues. Because the voltage at the comparison node 784 is constant for both the conversion of the pixel reset level and the pixel signal level, the switching point (or, the voltage below which one of the inputs to the comparator 718 must drop, to flip or switch the output value of the comparator 718) of the comparator 718 may be relatively constant. The switching point constancy is enabled at least because the value across the Vref_comp capacitor 712 may be constant for both the conversion of the pixel reset level and the pixel signal level, as the clamping switches 714 are not activated and the transfer transistor 782 is not reasserted after the pixel reset level that has been shifted by the level shifter 600 has been asserted at the comparison node 784.

Comparators such as comparators 318/718 may be provided offsets to calibrate the switching behavior at a given signal level. However, the switching behavior of the comparator is not well defined (due to noise, at least) when the comparator is switched at another signal level that is different than the given signal level at which the comparator 318/718 was calibrated with offsets.

Figure 8A:
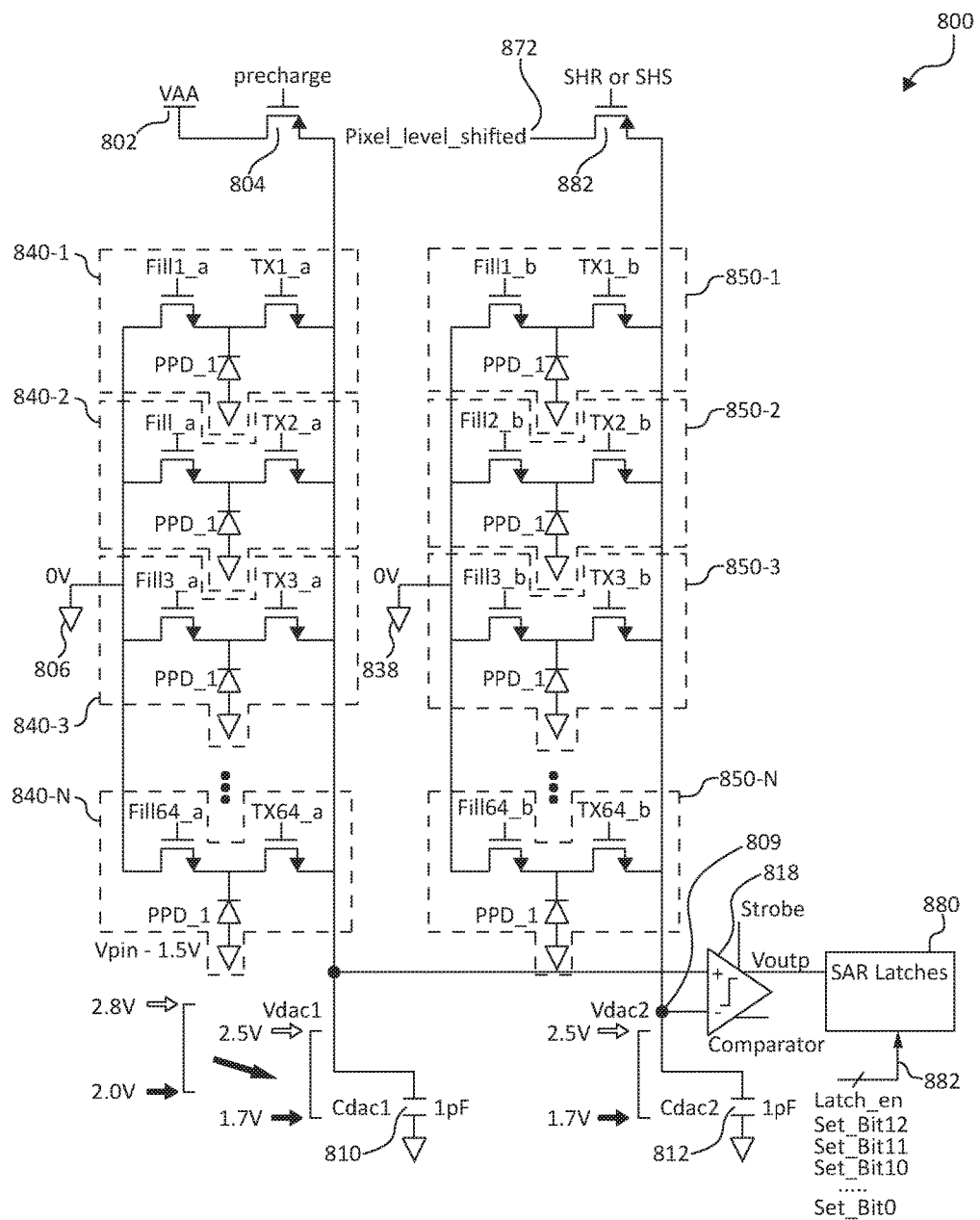
FIG. 8A is a schematic of a charge cell based successive-approximation-register (SAR) ADC with pinned photodiode charge transfer circuits in accordance with an embodiment of the present invention.

Charge transfer circuits such as 340 and 740 in FIGS. 3 and 7, respectively, may be used for implementing a successive-approximation-register (SAR) ADC 800, illustrated in FIG. 8A. FIG. 8C illustrates a graph of the voltages across the capacitors 810 and 812 in an exemplary operation of the ADC 800. The SAR ADC 800 includes two sets of charge transfer circuits 840 and 850. The charge transfer circuits 840 and 850 may include n-type photodiode wells in their respective pinned photodiodes PPD_1 that are used to transfer packets of negative charges (i.e., electron packets) to the Vdac1 node 808 and the Vdac2 node 809, respectively.

The pixel signal provided at the input 872 may be a pixel signal (or pixel reset level) directly read out from an image pixel, but may also be a level shifted pixel signal (or level shifted pixel reset level). A simplified level shifter 801 may also be used to provide the level shift to the pixel signal or pixel reset level. Level shifter 801 of FIG. 8B may be used to shift the signal 816 produced by an image pixel. The signal 816 may be a pixel signal level or a pixel reset level. A pixel value 816 (i.e., the output of an image pixel, or "Pixel_out") may be provided at an input 816 coupled to a positive input of an amplifier 878 of the level shifter 801. A fixed voltage source 872 may be coupled at a negative input of amplifier 878. The fixed voltage source 872 may be coupled between the negative input of amplifier 878 and the output 872 of amplifier 878.

Figure 8B:
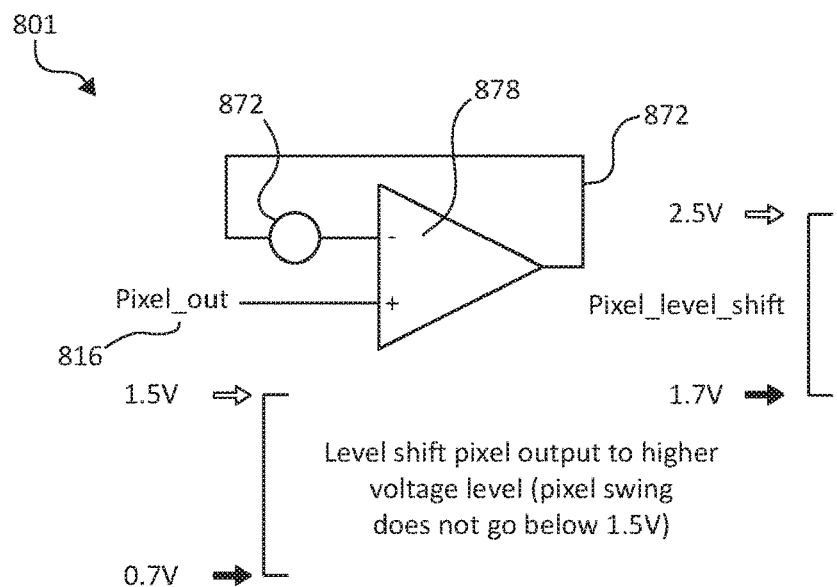
FIG. 8B is a schematic of a voltage level shifter that changes the voltage level of an input voltage in accordance with an embodiment of the present invention.
Figure 8C:
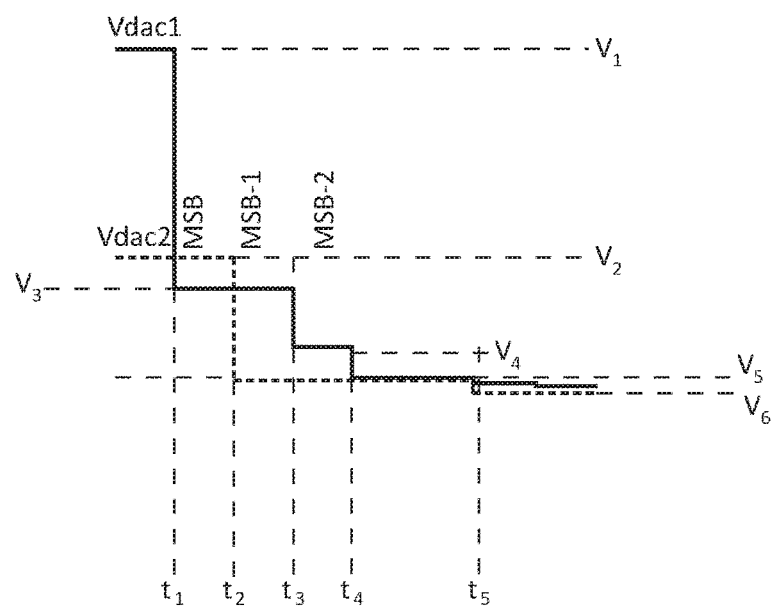
FIG. 8C is a graph showing the voltages generated at summing nodes in the SAR ADC of FIG. 8A in accordance with an embodiment of the present invention.

The level shifter 801 of FIG. 8B may be used to apply a fixed voltage offset, such as 0.5 Volts, 1 Volt, 1.5 Volts, or any other voltage offset, to the image pixel output 816 provided at the positive input of amplifier 878. In the example of FIG. 8B, the level-shifted signal produced at the output 872 of amplifier 878 may be offset from the image pixel output 816 by 1 Volt. In other words, for an input 816 to level shifter 801 of 0.7 Volts, the output 872 of level shifter 801 may be 1.7 Volts; for an input 816 to level shifter 801 of 1.5 Volts, the output 872 of level shifter 801 may be 2.5 Volts. In this way, even when a fully saturated pixel signal level is provided at the input 816 to the level shifter 801 (i.e., when the input 816 is provided a low voltage), the level-shifted version of the pixel signal level may be sufficiently above the pinning potential applied to the pinned photodiodes PPD_1 in charge transfer stages 840 and 850 (assumed to be at a pinning potential level of 1.5 Volts, for illustrative purposes).

The size of the charge packets transferred by any one of the charge transfer stages 840 or 850 may be determined at least in part by the voltage provided at ground supplies 806 or 838, respectively. The size of capacitors Cdac1 810 and Cdac2 812 at the Vdac1 node 808 and the Vdac2 node 809 respectively may determine, at least in part, the change in voltage at the nodes 808 and 809 that results from a charge packet from the charge transfer stages being transferred to one of the nodes. For a fixed packet size, a smaller capacitor Cdac1 810 may increase the change in voltage produced at the Vdac1 node 808. Similarly, a larger capacitor Cdac1 810 may decrease the change in voltage produced at the Vdac1 node 808. The resolution of the ADC 800 (i.e., whether ADC 800 is a 10-bit, 12-bit, or any other bit-resolution ADC) within a given voltage range of values that can be converted by ADC 800 may be adjusted by varying the voltages provided at ground supplies 806 and 838, and/or by varying the capacitances of the capacitors 810 and 812. The number of SAR latches 880 and the amount of signals in the control bits 882 provided to the SAR latches 880 may be based at least in part on the bit-resolution of the ADC 800.

Operation of ADC 800 may commence when a level shifted pixel signal/reset voltage is provided at the output 872 of the level shifter 801. A transfer transistor 882 may be used to pass the pixel voltage from the output 872 of level shifter 801 to the Vdac2 node 809. The Vdac2 node 809 may be coupled to a Cdac2 capacitor 812. The voltage at Vdac2 809 may be the voltage across the Cdac2 812 capacitor. Asserting the gate of the transfer transistor 882 may charge the Vdac2 node to the level shifted pixel voltage level. While the Vdac2 node 809 is charged to the level shifted pixel voltage level at the amplifier 878 output 872, the Vdac1 node 808 may be charged to the voltage level at pixel supply voltage terminal 802 by asserting the gate of the pre-charge transistor 804. The method of operating ADC 800 may be detailed in the timing diagram of FIG. 8D. Between time t1 and t4, the pixel may be reset (when the pixel reset signal is asserted), and the pixel reset level may be sampled onto the Cdac2 capacitor 812 between time t3 and time t5 at the Vdac2 node 809 (when the SHR signal is asserted).

A precharge transistor 802 may be coupled between the supply terminal 802 and the Vdac1 node 808, and may be used to charge the Vdac1 node 808 to a pixel supply voltage VAA at time t2, when the pre-charge transistor 804 gate signal is deasserted to turn on the pre-charge transistor 804, prior to the conversion of the shifted pixel reset level provided at input 872. As shown on the Pixel_output and Pixel_level shifted lines of FIG. 8D, when at time t1 the pixel reset is asserted, the Pixel_output rises to a voltage that is approximately 1.5 V, namely to the reset level of the pixel. The Pixel_level shifted line may shift the pixel reset level that is close to the 1.5 V by 1 V, to 2.5 V, and provide the shifted voltage to the input 972 to the sampling transistor 982.

At time t3, the precharge transistor may be activated to charge the Vdac1 node 808 to the pixel supply voltage level. Consequently, the voltage level at the Vinp node that is coupled to the Vdac1 node 808 rises to the pixel supply voltage level. For simplicity of explanation, assume the Vdac1 808 voltage swing is shifted down from 2.8V-2V to 2.5V-1.7V, to match approximately the range of the Vdac2 node which ranges from 2.5V to 1.7V. This offset at the Vdac1 node 808 may be implemented by charge transfers from charge transfer circuits 840. As with the single slope ADC in FIG. 3, the ADC LSB size is set by the DAC capacitor size and PPD_1 charge capacity. In an example to illustrate the operation of ADC 800, the LSB is 0.8 mV and the full scale Vref of the ADC is 878 mV.

After the Vdac1 node 808 and the Vdac2 node 809 have been charged to the levels provided at pixel supply voltage terminal 802 and the level shifted output 872 of amplifier 878, the comparator 818 may compare the voltages across the capacitors Cdac1 810 and Cdac2 812). The voltages across capacitors Cdac1 810 and Cdac2 812 may be referred to as the voltages at Vdac1 808 and Vdac2 809, respectively. The pre-charge level of Vdac1 is shown as V1 in FIG. 9. Prior to time t1, the pre-charge level V1 may be established at Vdac1 808 and the pixel voltage level V2 may be established at Vdac2 809. Prior to time t1, the comparator 818 output may be 1, indicating a higher voltage level at Vdac1 808 relative to the voltage level at Vdac2 809.

Figure 8D:
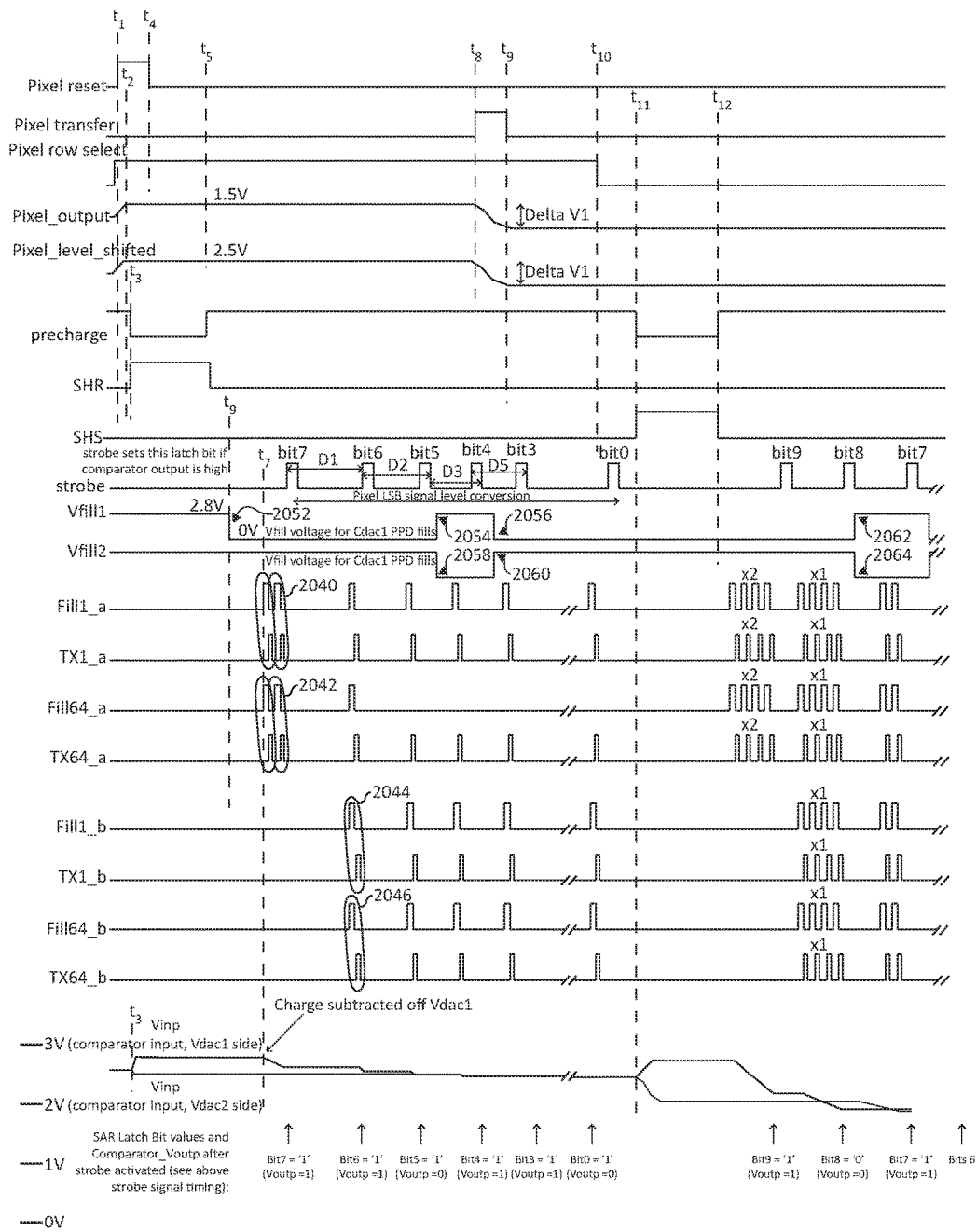
FIG. 8D is a timing diagram for operating the charge cell based SAR ADC with pinned photodiode charge transfer circuits of FIG. 8A in accordance with an embodiment of the present invention.

The Vinn node that is coupled to the Vdac2 node 809 may be at the pixel reset level after the SHR signal is asserted at time t3. At time t6, the fill voltage Vfill1, corresponding to the voltage provided at the fill supply terminal 806 may be dropped from 2.8 V to 0 V in the transition 2052. However, the voltage levels that are used for the transition 2052 are merely illustrative. The Vfill1 and Vfill2 voltages (the latter representing the voltage at the supply 838 for the charge transfer circuits 850), may be adjusted so that the amount of charge in each charge fill operation of the charge transfer stages 840 or 850 may be adjusted. At time t7, the charge transfer stages coupled to the Vdac1 node 808 may commence charge transfer operations 2040 and 2042. In the example of FIG. 8D, 64 of the charge transfer stages (i.e., stages 840-1 to 840-N, when N is 64) may be used to transfer charges to the Cdac1 capacitor 810 at time t7.

The transfer of charges may proceed as described in connection with the charge transfers 1840 of FIG. 3. SAR latch values may be determined for the pixel reset levels according to the flow chart of FIG. 8E. At step 2090, a first number X of PPD devices in charge transfer stages 840 may be transferred a second number Y amount of times to the Cdac1 capacitor 810. The product of X and Y may be the net number of charge transfers that occur in step 2090. At step 2092, the voltage at the Vdac1 node 808 may be compared to the voltage at the Vdac2 node 809 by the comparator 818.

If, as a result of the comparison, it is determined that the Vdac1 node 808 has a voltage level higher than the voltage level at the Vdac2 node 809, step 2094 may be performed. In step 2094, the N-th bit (i.e., the MSB, for the first iteration of the method in FIG. 8E) may be set to 1. N may then be decremented so that subsequent iterations of the method of FIG. 8E set the N-1-st bit. Finally, the net number of charge transfers may be adjusted by adjusting either the number X of PPD devices in charge transfer stages 840 that are to be subsequently filled, or the number of times Y that said PPD devices in charge transfer stages 840 are to be billed, or both X and Y. As an example, if X was 128 and Y was 4 at step 2090 prior to step 2094, at step 2094, X may be changed to 64, while Y is kept as 4. X may alternatively be kept at 128 while Y is changed to 2, or X may be reduced to 32, while Y is raised to 4. Generally, X and Y may be chosen such that the net number of charge transfers in immediately prior instances of step 2090 (or immediately prior instances of step 2098) is halved. After step 2094, step 2090 may be performed again.

If, however, as a result of the comparison it is determined that the Vdac1 node 808 has a voltage level lower than the voltage level at the Vdac2 node 809, step 2096 may be performed. In step 2096, the N-th bit (i.e., the MSB, for the first iteration of the method in FIG. 8E) may be set to 0. N may then be decremented so that subsequent iterations of the method of FIG. 8E set the N-1-st bit. Finally, the net number of charge transfers may be adjusted by adjusting either the number X of PPD devices in charge transfer stages that are to be subsequently filled, or the number of times Y that said PPD devices in charge transfer stages are to be billed, or both X and Y, though these numbers will relate to the number and operations of charge transfer stages 850 that are coupled to the Vdac2 node 809. Similar to step 2094, X and Y may be chosen such that the net number of charge transfers in immediately prior instances of step 2090 (or in immediately prior instances of step 2098) is halved. After step 2096, step 2098 may be performed, in which a number X of charge transfer stages 850 are used to transfer charges to Vdac2 809 Y number of times. After step 2098, step 2092 may be performed.

From time t5 to time t10, the pixel reset level may be converted. Charge transfer operations 2040 and 2042 from the charge transfer stages 840 may occur during this interval to transfer charges to the Vdac1 node 808 (i.e., when step 2090 of FIG. 8E occurs), and charge transfer operations 2044 and 2046 may occur during this interval to transfer charges to the Vdac2 node 809 (i.e., when step 2098 of FIG. 8E occurs). The Vfill1 and Vfill2 voltages for the supplies 806 and 838 respectively, may be adjusted simultaneously. As an example, the transitions 2054 and 2058, 2056 and 2060, and 2062 and 2064 may be coordinated. At said transitions, the Vfill1 and Vfill2 voltages for the supplies 806 and 838 may be switched from a low voltage level to a high voltage level, or vice versa. At time t8, the pixel signal level may be transferred to a floating diffusion node of the pixel. The pixel output ("Pixel_output") may shift by an amount Delta V1. The shifted pixel output (i.e., "Pixel_level_shifted" output from the level shifter 801) may also shift by an amount Delta V1 to a level that is 1 V (using the exemplary value used for description) higher than the level of the pixel output. At time t10, the pixel row select may be deasserted. At time t11, the precharge control voltage to the precharge transistor 804 may be deasserted, thereby precharging the Vdac1 node to the pixel supply level VAA. Also at time t11, the SHS signal provided to sampling transistor 882 may be asserted, transferring the shifted pixel level provided at input 872 to the Vdac2 node 809. From time t11 onward, the SAR conversion of the pixel signal level may proceed in the manner detailed in FIG. 8E.

Figure 8E:
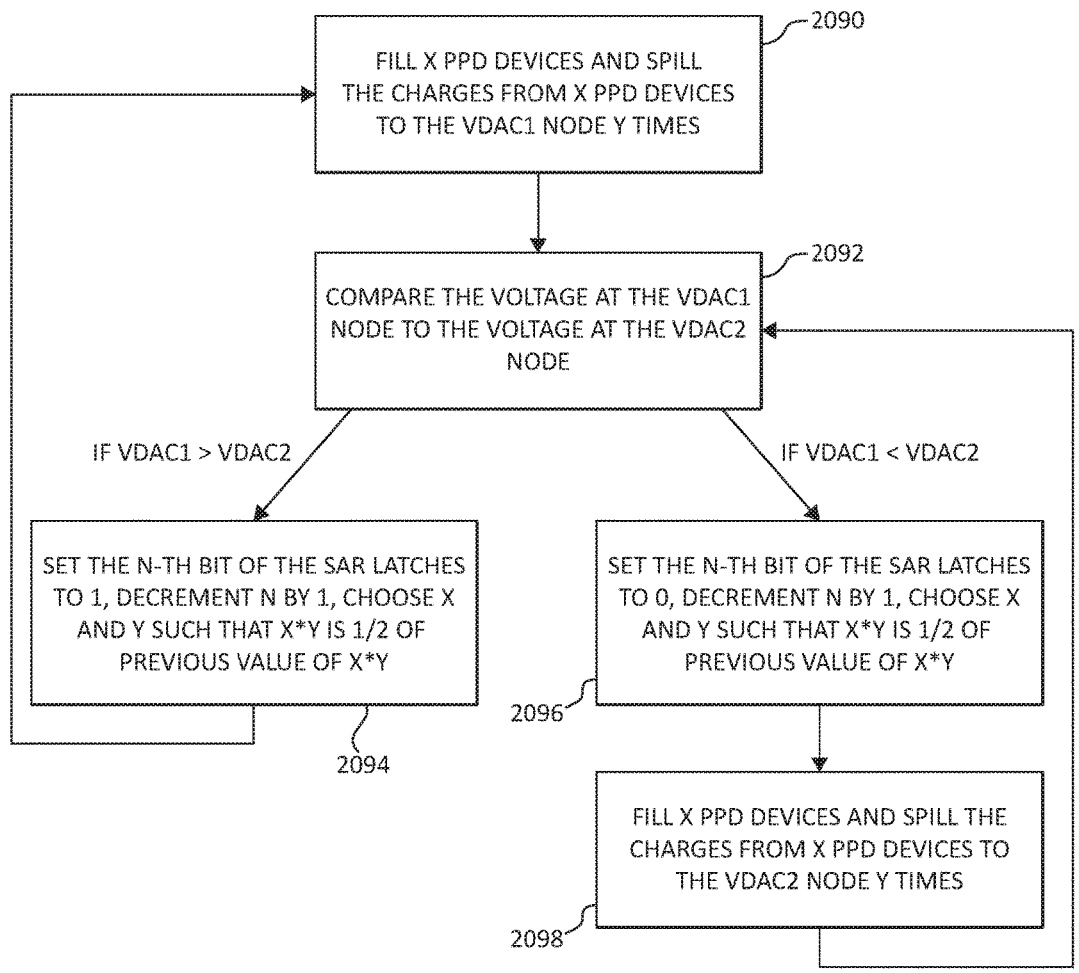
FIG. 8E is a flowchart of steps for setting the bits and operating the pinned photodiode based charge transfer circuits of the SAR ADC of FIG. 8A in accordance with an embodiment of the present invention.

An illustrative example of the method of FIG. 8E is presented below to clarify the operation of the SAR ADC 800. To determine the most-significant-bit (MSB) of the digital value representing the pixel voltage level V2 at Vdac2 809, multiple charge transfer stages 840 may be used to fill pinned photodiodes PPD_1 and transfer charges from the pinned photodiodes PPD_1 to the Cdac1 capacitor 810. In an illustrative example where at least 64 charge transfer stages 840 are provided in an ADC 800 of FIG. 8A, 64 charge transfer stages 840 may be filled (i.e., the pinned photodiodes PPD_1 in 64 charge transfer stages 840 may be filled by asserting the gates of the fill transistors coupled between said pinned photodiodes and the supply terminal 806), and then transferred/dumped to the Cdac1 capacitor 810 (i.e., after the pinned photodiodes PPD_1 in 64 charge transfer stages 840 are filled, the charges in the pinned photodiodes PPD_1 may be transferred to the Cdac1 810 capacitor by asserting transfer transistors coupled between said pinned photodiodes and the Cdac1 capacitor 810). The 64 charge transfer stages 840 may be filled and dumped to the Cdac1 capacitor 810 an additional 7 times (for a total of 8 total transfers from the 64 charge transfer stages 840) to lower the pre-charge voltage V1 to a voltage V3 at time t1.

After the 64 charge transfer stages 840 have been used to transfer their respective charge packets to the Cdac1 capacitor 810 eight (8) times, the comparator 818 may compare the voltages at the Vdac1 node 808 and the Vdac2 node 809.

In response to determining that the voltage at the Vdac1 node 808 is greater than the voltage at the Vdac2 node 809, the comparator 818 may output a logic high voltage level (i.e., a logic "1" voltage level) to the SAR latches 880. In response to receiving a logic high voltage level from the comparator 818 after the first charge dump at time t1, the SAR latches 880 may store a logic high voltage at a latch that represents a MSB of a multi-bit digital value or quantity.

In response to determining that the voltage at the Vdac2 node 809 is greater than the voltage at the Vdac1 node 808, the comparator 818 may output a logic low voltage level (i.e., a logic "0" voltage level) to the SAR latches 880. In response to receiving a logic low voltage level from the comparator 818 after the first charge dump at time t1, the SAR latches 880 may store a logic low voltage at the latch representing the MSB of the multi-bit digital value.

Voltage at the Vdac2 node 809 being greater than the voltage at the Vdac1 node 808 at time t1 indicates that the charge dumped onto the Vdac1 node 808 corresponding to an amount of charge represented by a multi-bit digital value with a logic "1" only at its most significant bit is greater than the pixel signal (i.e., the voltage at the Vdac2 node 809 at time t1). In traditional SAR-based ADCs, a subsequent comparison would involve producing a voltage representing an intermediate voltage between the first tested voltage (i.e., the voltage V3 at time t1, corresponding to a digital value with a logic "1" only at its most significant bit) and the voltage indicating a digital value made entirely of logic "0" values (i.e., the voltage V1). This often occurs by adding a voltage to the previously generated voltage for comparison to the pixel voltage level.

For SAR ADC 800 however, generating a voltage that is greater than V3 at a time subsequent to time t1 may not be possible, at least when using the charge transfer stages 840 to change the voltages at the Vdac1 node 808. Because the charge transfer stages 840 and 850 transfer electron packets to the Vdac1 808 and Vdac2 809 nodes respectively, the voltage levels at nodes 808 and 809 may only be reduced by the charge transfer stages 840 and 850, but not raised.

To enable SAR ADC conversion, however, the comparison of the pixel voltage level to a voltage level greater than the current voltage must still occur (at least when the voltage at the Vdac2 node 809 is greater than the voltage at the Vdac1 node 808 and the comparator 818 output is a logic low level or logic "0"). However, instead of increasing the voltage at the Vdac1 node 808 by a given amount, the voltage at the Vdac2 node 809 may be reduced by the given amount. One or more charge transfers from one or more charge transfer circuits 850 coupled to the Vdac2 809 node can used to decrease the voltage at the Vdac2 node. Charge transfer circuits 850 may decrease the voltage at the Vdac2 node 809 by an amount required to determine whether or not the second-most-significant bit (sometimes referred to as MSB-1) should be set to be a logic high value at the latches 880.

To determine the MSB-1 bit in a corresponding one of the latches 880, 64 of the charge transfer circuits 850 may be filled and dumped to the Vdac2 809 node 4 times at time t2 (i.e., half of the number of charge transfers compared to the charge dump at t1, from the same number of charge transfer circuits used in the charge dump at t1).

Figure 9:
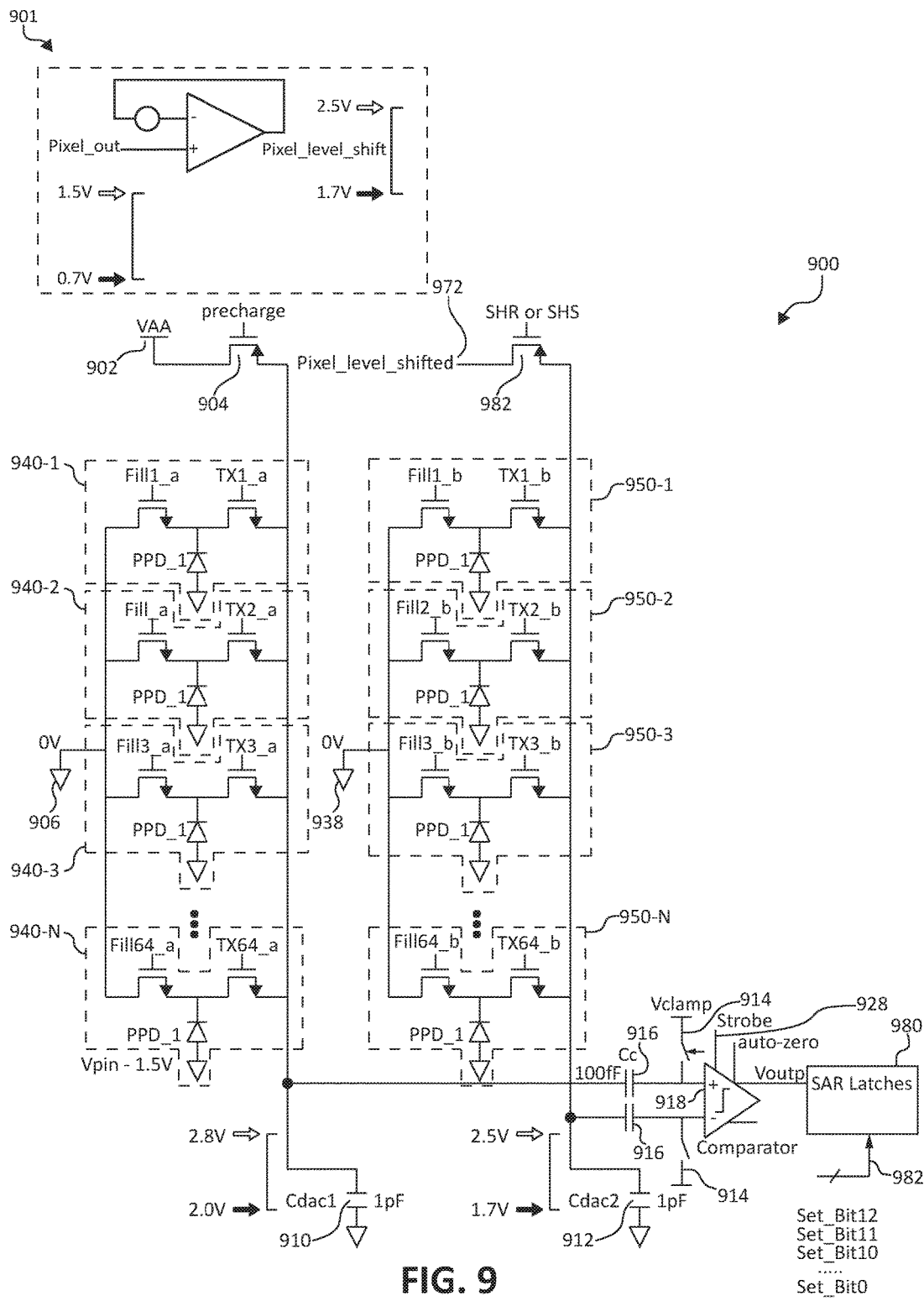
FIG. 9 is a schematic of a charge cell based SAR ADC with pinned photodiode charge transfer circuits and an auto-zero comparator in accordance with an embodiment of the present invention.

In the example shown in FIG. 9, between times t2 and t3, the Vdac1 voltage level V3 is greater than Vdac2 level V4, and the MSB-1 bit in the SAR latches 880 is accordingly set to "1." Next, the bit MSB-2 is determined by shifting Vdac1 by ⅛ the ADC reference range to a voltage V4 at time t3. To shift Vdac1 by ⅛ the ADC reference range, 128 PPD_1 charge packages from charge transfer circuits 840 may be transferred to Cdac1. To achieve this, the entire bank of 64 PPD_1 may be filled and dumped to the Vdac1 808 node 2 times.

Note that the MSB-3 bit determination may require just 64 PPD_1 transfers (i.e., a single transfer of charge packets from 64 charge transfer circuits 840/850) at time t4. The subsequent bit determinations require only a subset of the PPD bank to be transferred (i.e., only 32, 16, 8, 4, 2, 1 charge transfer circuits 840/850 need to be used to transfer charge packets a single time).

The advantage of this SAR architecture using PPD charge packets is size relative to a binary scaled capacitor based approach (especially M-i-M capacitors) and this approach does not require accurate capacitor matching or capacitor voltage linearity. For advanced technology nodes, capacitor options are limited and voltage linearity of available MOS capacitors limits SAR bit depth.

As with the single slope ADC design of FIG. 3, the ADC reference of FIG. 8A may be changed by modifying the fill voltage for the PPD or the size of the Cdac capacitor. Also, the number of charge transfer stages 840/850 in the ADC 800 can be changed to make a faster or slower SAR depending on area constraints.

In order to reduce routing congestion in the circuit especially in a column parallel configuration, the "Fill" and "transfer" control signal that respectively control the fill and transfer transistors in a charge transfer stage 840/850 may be globally controlled for all columns and the fill voltage for the bank of PPD can be controlled locally. By controlling the PPD fill voltage (drain node of the "Fill" transistors), the local circuit can set how much charge is added to the PPD (zero charge or fixed charge) while the global control signals can be set to enable transfer regardless of the internal ADC state (the state of the comparison between Vdac1 808 and Vdac2 809 nodes determining the node that receives charge packets from the charge transfer circuits 840/850).

Figure 10:
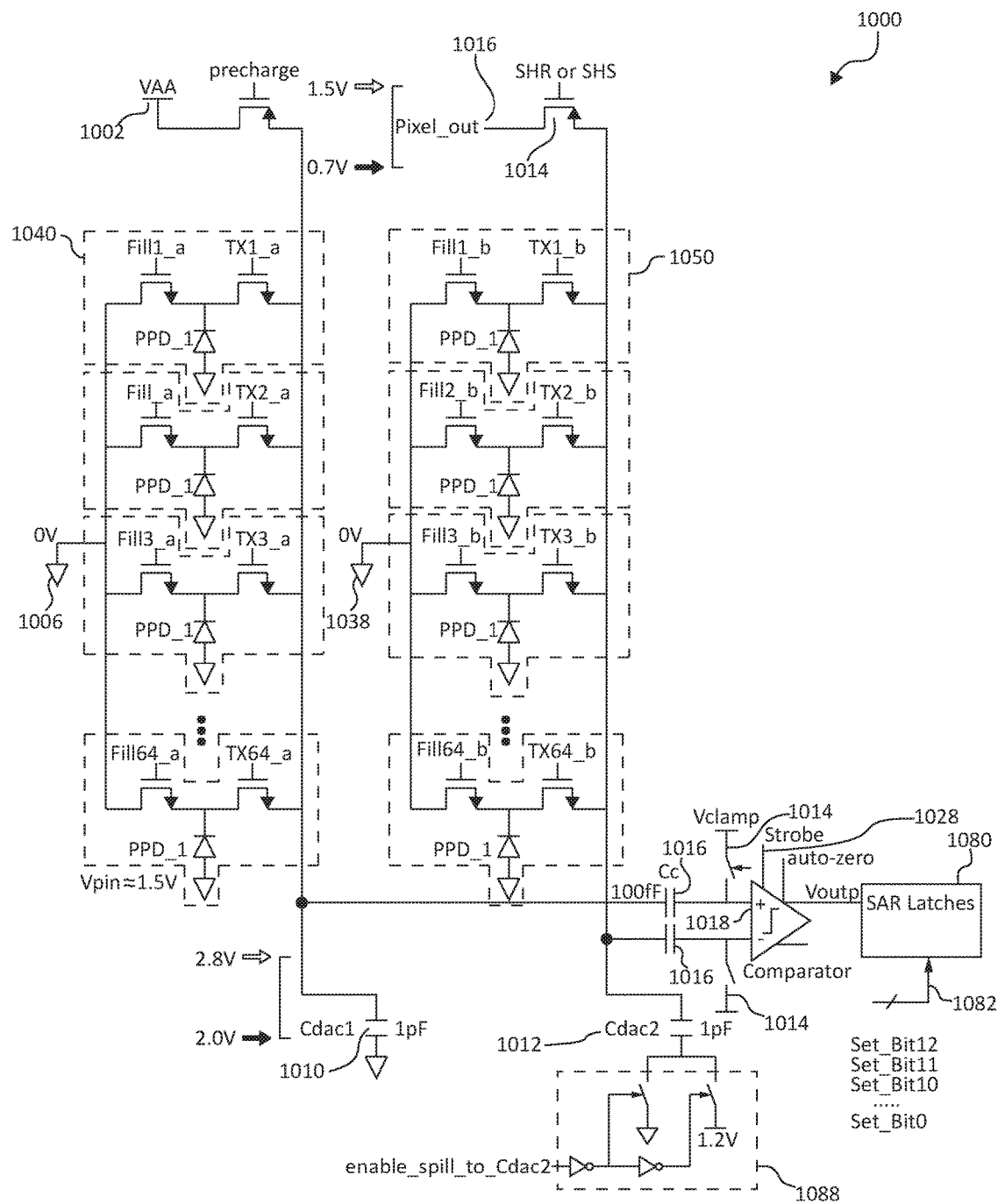
FIG. 10 is a schematic of a charge cell based SAR ADC with pinned photodiode charge transfer circuits and an auto-zero comparator that receives a pixel voltage level directly from a pixel in accordance with an embodiment of the present invention.

FIG. 10 illustrates an implementation 900 of the SAR ADC 800 with more details about the auto-zero 928 of the comparator 918 and clamping capacitors 916 at the input of the comparator 918 to decouple the Vdac1 908 voltage common mode from the Vdac2 809 common mode level. In the SAR ADC designs of FIGS. 8A and 8C, the comparator 818/918 must be designed to suppress any offsets from changes in common mode. Again, this requirement is because the SAR ADC 800/900 uses a differential topology where the comparator switching point changes depending on the signal level being converted.

The clamp switches 914 and comparator auto-zero 928 (the latter of which may be omitted) are activated when the Cdac1 capacitor 910 is pre-charged to VAA (i.e., the supply 902 voltage level) and the pixel level shifted reset voltage (provided by the output of the amplifier in the level shifter 901) is sampled on the Cdac2 capacitor 912. Then, the SAR conversion may be performed. For the next SAR conversion (i.e., after the conversion of the level-shifter pixel reset signal is complete) the Cdac1 capacitor 910 is pre-charged again to the supply 902 level VAA and a pixel level shifted signal voltage is sampled on the Cdac2 capacitor 912, without the clamps to the Cc capacitors being activated (similar to the single slope ADC sampling scheme).

Note that an inverting amplifier could be used as well (like used in FIG. 6A for the single slope ADC) as long as the ADC 800/900 logic is adapted to the change in signal and reset polarity.

Note that with timing changes, the SAR can operate during most significant bit determination in a single sided mode (where only Cdac1 910 changes voltage during conversion) as opposed to a double sided mode (where both Cdac1 910 and Cdac2 912 change voltage during conversion). This is possible by operating Cdac1 in an iterative fashion after determining the first few most significant bits (2 or 3) and then subsequently pre-charging Cdac1 910. After precharging Cdac1 910, then the charge transfer stages 950 bank may iteratively transfer charge to Cdac1 910 according to how the MSBs are set. Then the remaining least significant bits are determined in the double side mode where small voltages happen on both Cdac1 910 and Cdac2 912. The smaller voltage changes on Cdac2 912 reduce the required operating input range for the comparator 918.

For the iterative MSB determination described above, extra time is needed to reload the ADC 900 with the MSB charge on Cdac1 910 and re-load the input on Cdac2 912. In order to speed up the first pass determination of these bits, it is possible to change the value of Cdac1 910 and Cdac2 912 to smaller value during the first pass in order to require less charge packet transfers to them (e.g. ½ smaller caps require ½ the number of packet transfers). Then Cdac1 910 and Cdac2 912 are returned to their final capacitance value for the remaining bits in order to achieve the target ADC noise requirement.

An improvement on the design of FIG. 9 is shown in FIG. 10. The design of FIG. 10 does not require the level shifter 801/901 on the pixel input. The original purpose of the level shifter 801/901 is to keep the Cdac2 812/912 node at a high enough voltage (i.e., greater than the pinning potential of the pinned photodiodes PPD_1 in the charge transfer circuits 950) during operation to allow charge transfer from the pinned photodiodes PPD_1 in the charge transfer circuits 950 to Cdac2 912. That requirement can also be met by shifting the voltage on the bottom of Cdac2 capacitor (1012 in FIG. 12) to a higher voltage during charge transfer, using a voltage shifter 1088 that is coupled to the Cdac2 capacitor 1012. After the voltage shifter 1088 has been used to shift the voltage at the bottom of the Cdac2 capacitor voltage up, the bottom of Cdac2 is return to 0V during other operations (sampling the pixel input, clamping the comparator, or during comparator strobe).

Figure 11:
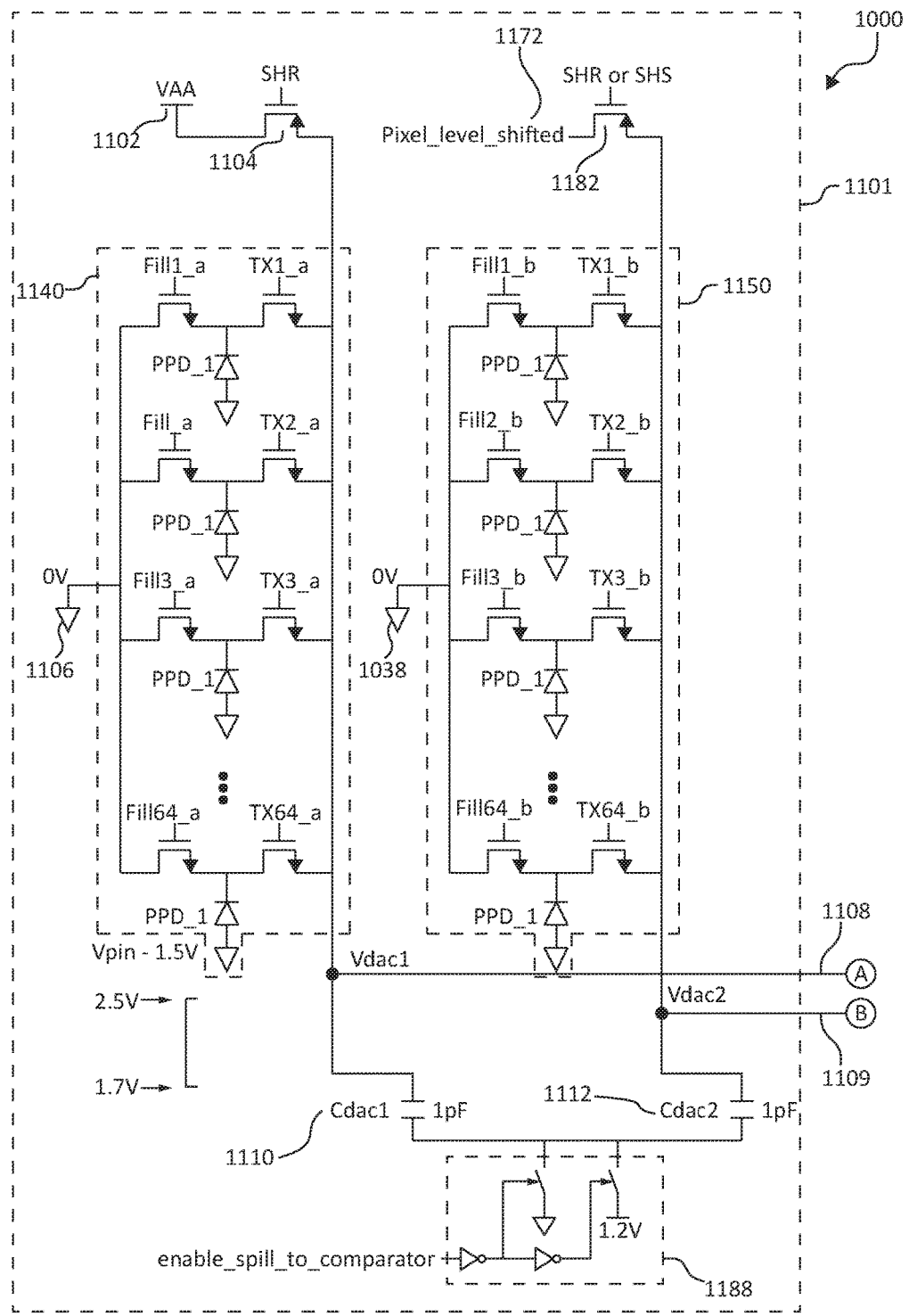
FIG. 11 illustrates a charge cell based comparator that can be used with the SAR ADC of FIG. 10 in accordance with an embodiment of the present invention.
Figure 11:
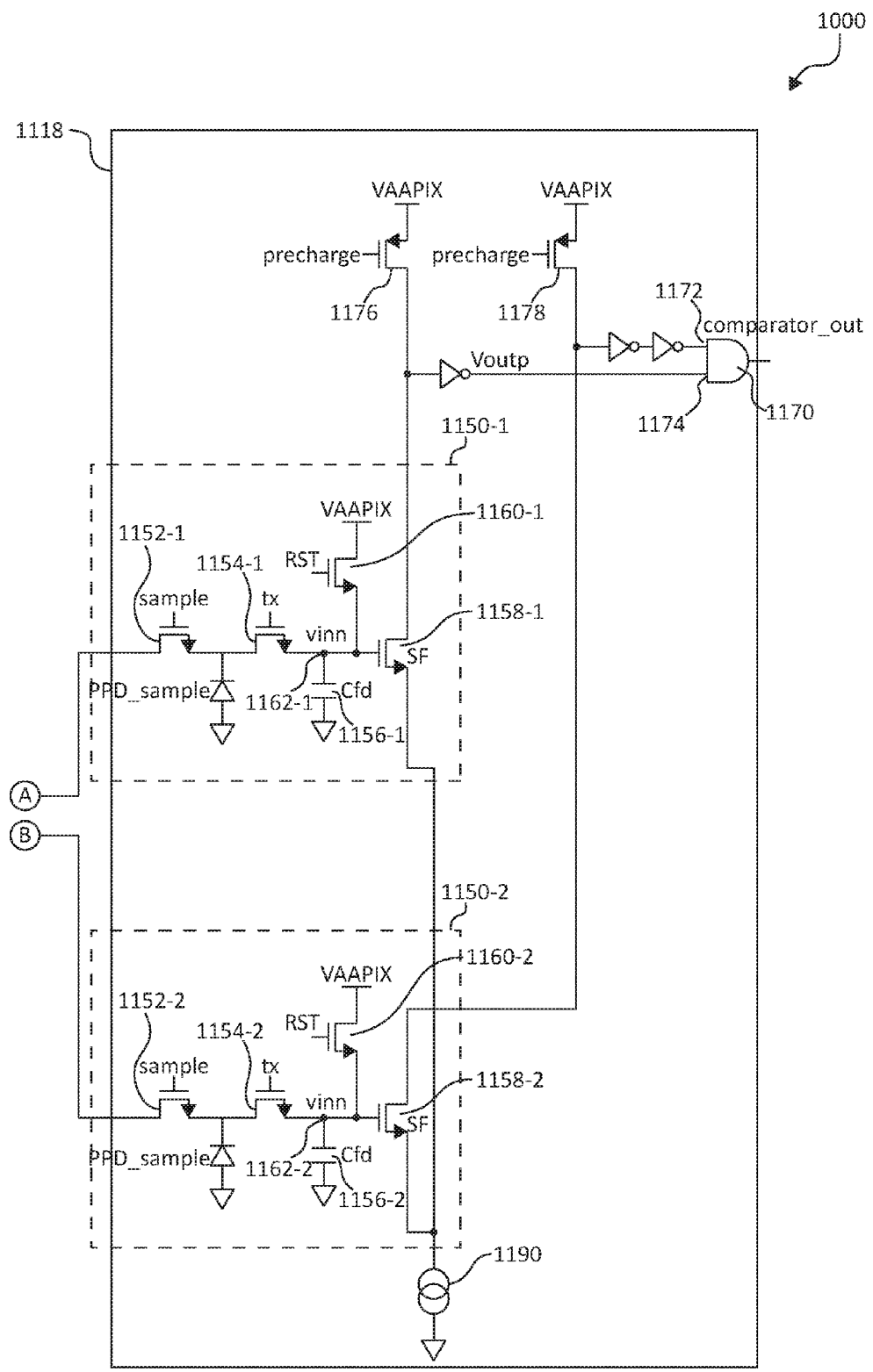

A comparator topology 1100 that is not sensitive to common mode offsets and uses the PPD charge transfer circuits is shown in FIG. 11. It is connected to the SAR ADC 1101 on the left (i.e., the components 1102-1112 1140, 1150, 1172, 1182, and 1188 may be substantially identical to similarly numbered components in FIGS. 9 and 10). The comparator 1118 operates by sampling charge from both Cdac1 1110 and Cdac2 1112 into PPDs (i.e., PPD_sample pinned photodiodes in the pseudo-pixel circuits 1150). The charge from these sampling PPDs is transferred to floating diffusion 1162 structures as used in a pixel and the source followers 1158 are configured together to determine which of the capacitors of Cdac1 1110 and Cdac2 1112 has the higher voltage.

In order to sense the charge on Cdac1 1110 and Cdac2 1112, they are first level shifted down using the voltage shifter 1188 so that the maximum voltage on either capacitor 1110 or 1112 is 1.5V. This level shifter 1188 is achieved with a standard coupling technique by changing the voltage on the bottom of the Cdac capacitors 1110 and 1112 as shown in FIG. 11. With Cdac1 and Cdac2 voltages below 1.5V, both can sample charge on the PPD devices labeled PPD_sample by asserting the gate of sample transistors 1152 in the pseudo-pixels 1150. The capacitor with the highest voltage will transfer the least number of electrons to the respective PPD_sample device. Then, the floating diffusions 1162 labeled vinp and vinn are reset to VAAPIX (2.8V). Then, the charge is transferred to vinp and vinn from the respective PPD_sample device by asserting the gate of a transfer transistor 1154 in the respective pseudo-pixel 1150.

Note that the source follower 1158 drains are connected to separate output lines that are pre-charged to 2.8V (VAAPIX) by pre-charge transistors 1176 and 1178, and the sources are tied together to a current source 1190. After charge is transferred to vinp and vinn, the pre-charge signal (i.e., the signal provided to the gates of pre-charge transistors 1176 and 1178) is disabled and the source follower 1158 with the highest gate voltage (i.e., the lowest number of charges at the respective floating diffusion 1162) will discharge the line to 0V. The source follower 1158 with the lower gate voltage will be off because its source voltage is set high enough to turn off the source follower 1158 and keep its output set to the high pre-charge voltage. Some capacitance on the drains of the source follower 1158 is needed to create more margin in the circuit between the "off" source follower and "on" source follower.

Ideally, the capacitance Cfd 1156 is kept very low to maximize voltage resolution of the comparator 1118 (i.e., a capacitance that changes voltage by less than 200 uV per electron). Also, it is important to minimize the signal sampled in the PPD_sample device because the difference in charge sampled from Cdac1 and Cdac2 creates an error signal in the conversion. If 10 comparisons are performed per conversion and the maximum error accumulated during the conversion is ½ LSB (each LSB equal to PPD_1 full capacity or 5000 electrons in this example), then the PPD_sample should only sample (5000/2)/10 electrons or 250 electrons. Other tradeoffs like PPD_1 size or charge used to set each DAC step can be maximized to reduce error from the comparator sample operation removing charge.

Figure 12:
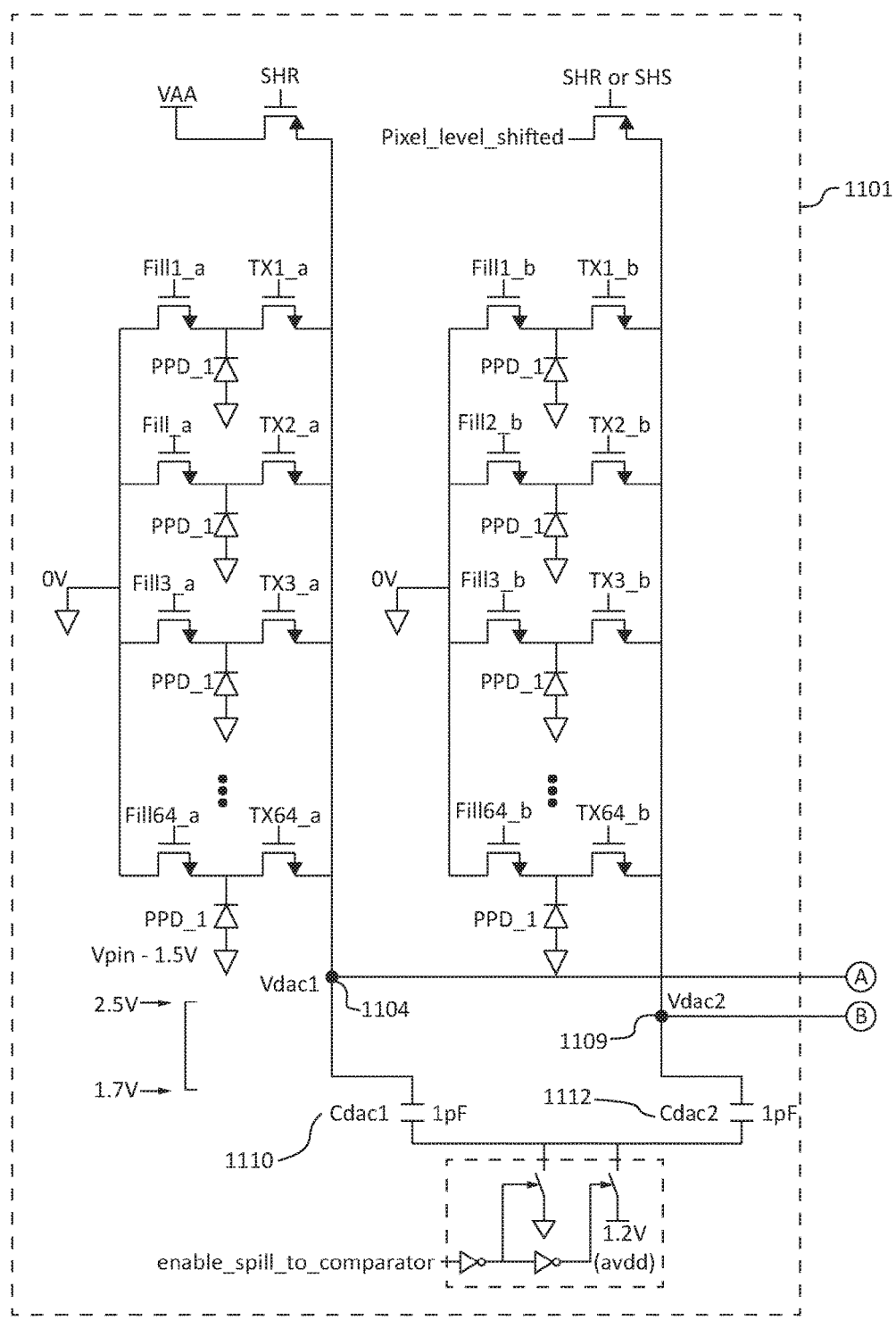
FIG. 12 illustrates a charge cell based comparator that includes floating gate transistors that can be used with the SAR ADC of FIG. 10 in accordance with an embodiment of the present invention.
Figure 12:
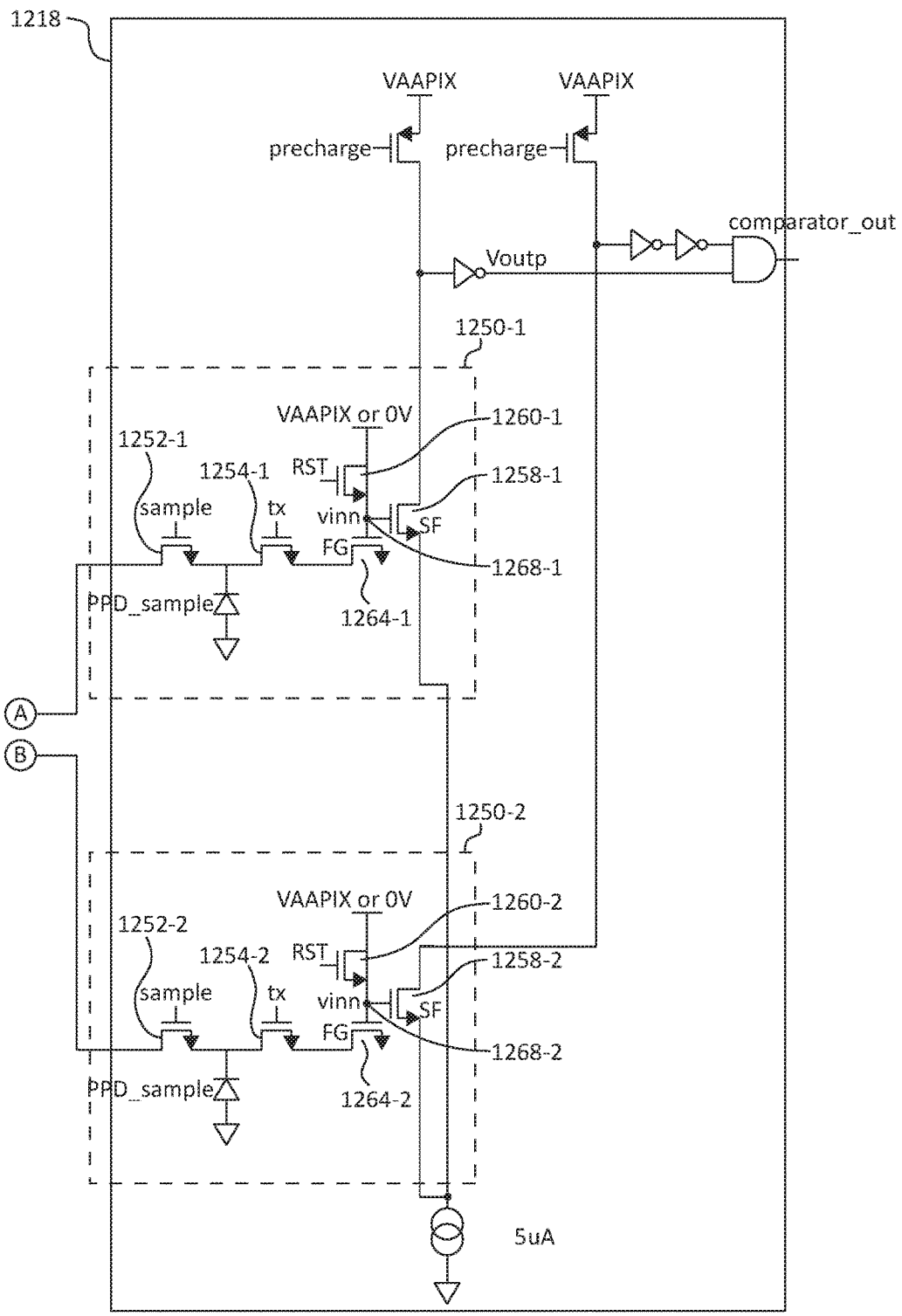

If this comparator design replaces the FD node with a "floating gate" NMOS transistor 1264, as shown in the comparator 1218 of FIG. 12, then the charge sampled into the circuit can be returned to the Cdac1 1110 and the Cdac2 1112 capacitors. The floating gate of transistor 1264 is initially set to a high voltage VAAPIX (2.8V) by the asserting the gate of the reset transistor 1260. It does not contain charge in its channel. Then charge is transferred to the channel with the transfer transistor 1254 gate pulsed high and the circuit behaves like the operation above with the floating gate of transistor 1264 driving the source follower 1260 gate (any charge transferred under the floating gate will pull the source follower gate voltage down). At the end of the comparison, the transfer gate 1254 is turned on and the floating gate of the transistor 1264 is set to 0V. Then, the channel charge is transferred back to the PPD_sample in the pseudo-pixel 1250 device. Cdac1 and Cdac2 bottom plates are returned to 1.2V to level shift them back to a higher voltage. Then, the gate of the sample transistor 1252 is turned on to transfer the PPD_sample charge back to the Cdac nodes 1110 and 1112. With this operation, the comparison is non-destructive and does not create an error charge on the Cdac nodes 1110 and 1112.

The charge summing technique described in connection with the above embodiments which use charge transfer circuits with pinned photodiodes to transfer/dump the electron packets onto a node is also useful for building signal integrators as well. To enable a delta sigma ADC, for example, both an integrator and a decimator/subtractor are needed to respectively sum and subtract signals. A pinned photodiode that accumulates holes is needed to subtract signal (i.e., remove electrons) from an integrator summing node.

Figure 13A:
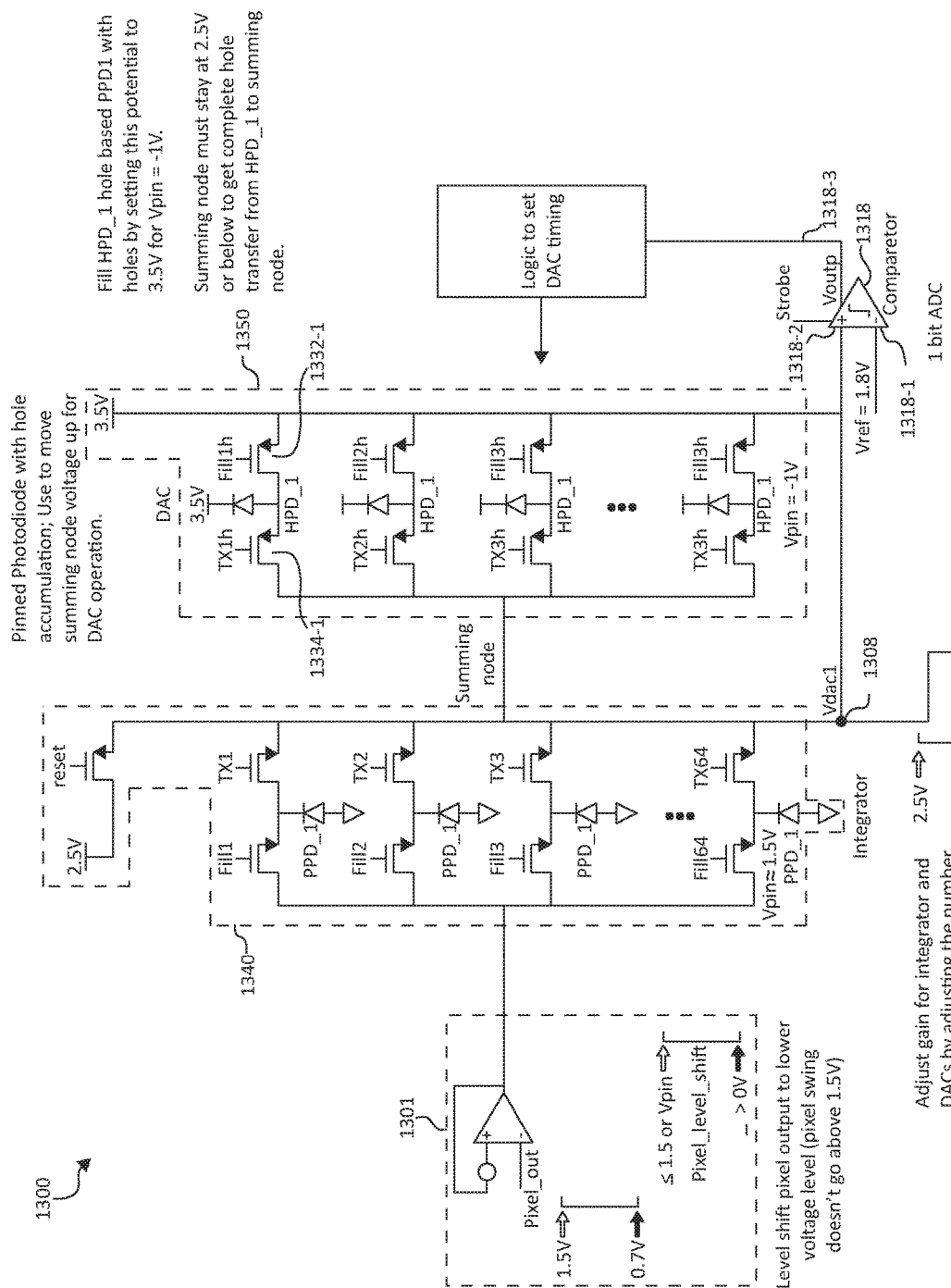
FIG. 13A is a schematic of a first order delta-sigma ADC with electron-based and hole-based pinned photodiode structures in accordance with an embodiment of the present invention.

FIG. 13A shows a first order delta sigma modulator 1300 that uses a charge transfer circuits on the left bank 1340 of charge transfer circuits to inject electrons charge packets onto the summing node 1308 and that uses a right bank 1350 of charge transfer circuits with hole based pinned photodiodes (labeled "HPD_1") to inject holes onto the summing node 1308. Notably, PMOS transistors may be used for the fill and transfer transistors 1332-1 and 1334-1 connected to the hole based pinned photodiodes in the right bank of charge transfer circuits. In order to fill a HPD with holes, a voltage of 3.5V is connected to the source of the fill transistors such as 1132-1 and the gate of the fill transistor 1132-1 is asserted (i.e., the gate of the fill transistor 1132-1 is biased with a logic "low" level voltage, given that the fill transistor 1132-1 is a PMOS transistor). After a HPD is filled with holes, the holes (now referred to as a "hole charge packet") may be transferred to the summing node Vdac1 1308 when the DAC operation is needed. Complete charge transfer of holes only happens when the DAC summing node 1308 is less than 2.5V because the pin potential of the HPD is −1V.

The higher 3.5V is shown for illustration purposes only. The Vpin for the electron based PPD in the left bank 1340 and hole based HPD in the right bank 1350 may be adjusted to smaller magnitudes to enable operation between 0V and 2.8V only. For example if the magnitude of both Vpins is 1.0V, then the summing node can operate between 1.8V (VAAPIX−1V) and 1.0V where complete charge transfer is possible (electrons from PPD and holes from HPD) for correct operation.

Notably, the HPD_1 device design is not needed for imaging and is only needed to store and transfer holes. A hole based pinned photodiode may be fabricated in an Nwell (tied to high voltage) with an analogous n+ surface pinning layer and p implanted pinned photodiode. These circuits can also be designed to be tolerant to some PPD lag from partial charge transfer.

Gain of the integrator is set by the number of the PPD_1 transfers (i.e., electron charge packet transfers) from the charge transfer circuits in the left bank 1340 of charge transfer circuits. The pixel buffer (or inverting amplifier) 1301 generates a level shift of the pixel output Pixel_out to a range from 1.5V to 0.0V where the PPD_1 devices will fill up with electrons in proportion to the pixel output level (ideally the high voltage output from the pixel is equal to Vpin). The DAC level subtracted from the integrator summing node is proportional to the number of HPD_1 transfers on the right side of the summing node. The gain of the integrator is also set by the Cdac1 size. The amount of gain in the input signal path and DAC path is determined by the conventional system design of this circuit.

The front end of the integrator can also be used to sum pixel values as they write their values into the PPD_1 devices. This summing operation can also use different weights for the pixel values summed by controlling the number of PPD_1 transfers.

Figure 13B:
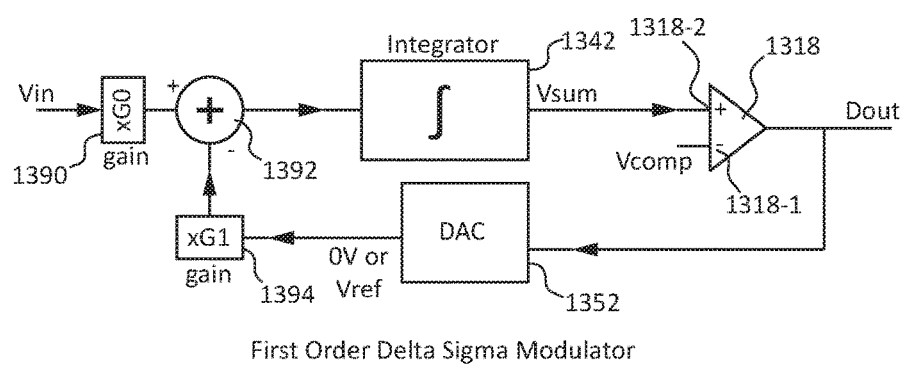
FIG. 13B is a block diagram showing the functional blocks of the first order delta-sigma ADC of FIG. 13A in accordance with an embodiment of the present invention.

The delta sigma modulator of FIG. 13A may be modeled using the block diagram of FIG. 13B. The pixel buffer 1301 that provides the input voltage may be represented by the gain block 1390 that applies a gain to the Vin signal (or, a level shift, in the case of the circuitry of FIG. 13A). The comparator 1318 may receive the Vref voltage (shown in FIG. 13B as Vcomp) and the summing node value Vsum (corresponding to the voltage at the Vdac1 node 1308 of FIG. 13A. The DAC 1352 may correspond to the hole based pinned photodiode charge transfer circuits in the right bank 1350 of FIG. 13A. The integrator 1342 may correspond to the electron based pinned photodiode charge transfer circuits in the left bank 1340 of FIG. 13A. The gain block 1394 may represent a gain that is provided to the DAC 1352 output. The node 1392 may show that the DAC value is subtracted, while the Vin input value is added (after being scaled by their respective gain blocks 1394 and 1390) before being provided to the integrator 1342.

The first order delta sigma modulator of FIG. 13B is shown with gain blocks 1390 and 1394 in the input path (xG0) and feedback path (xG1) for generality. As an example, gains for both paths may simply be 1. The integrator sums the input voltage value until the comparator threshold is reached and then subtracts off the ADC voltage reference value. After the ADC reference value is subtracted, the integrator continues to sum the input voltage until the comparator threshold is reached again. Typically, a digital counter or digital summing circuit counts the number of times the comparator threshold is reached. This counter is viewed as simple digital low pass filter that is a "box filter" because each output equally increases the count value by 1 as opposed to weighting the filter input values to achieve a different frequency response. With the addition of the DAC feedback, the average integrator output voltage over time (modulated by the input voltage and DAC voltage signals) will approach the same value as Vin (or proportional to Vin) and the number of times the comparator threshold is reached relative to the total number of summing operations is representative of the digital value. In fact, the ratio of the total number of comparator 1's generated to the total number of comparison operations multiplied by the ADC reference voltage approximately equals the input signal voltage (or proportional to Vin). The high integrator gain at low frequencies and larger total number of samples increases the accuracy of the modulator.

Figure 13C:
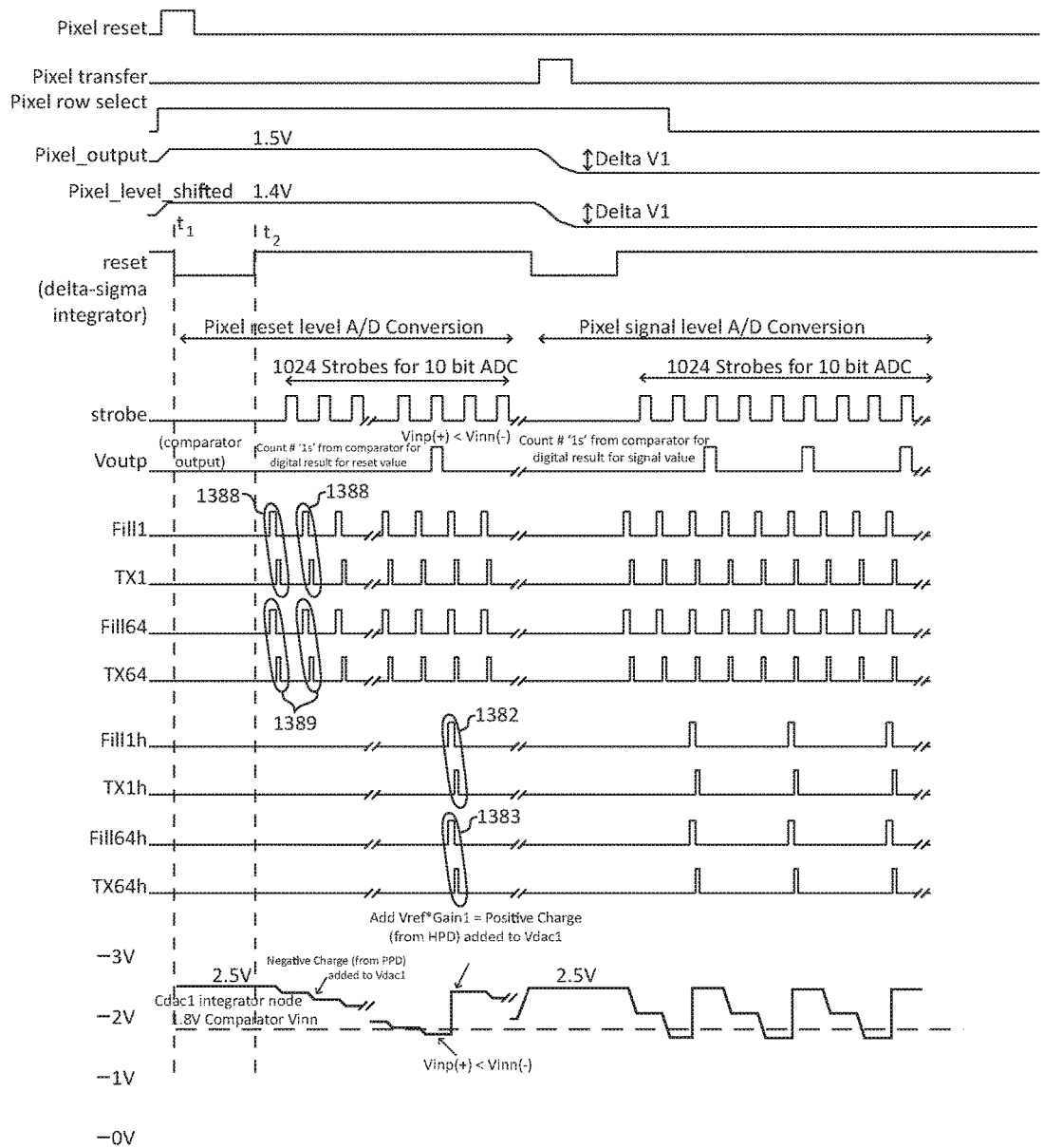
FIG. 13C is a timing diagram for operating the first order delta-sigma ADC with electron-based and hole-based pinned photodiode structures of FIG. 13A in accordance with an embodiment of the present invention.

The comparator output can also be viewed as a 1-bit ADC that is converting the integrator output. The "0" output represents a signal value of 0V and the "1" represents a signal value of Vref (full scale ADC response). Because the signal is between 0V and Vref, the ADC-DAC combination is feeding back to the integrator the quantization error (difference between ADC digital representation and the analog input value). Because the modulator is clocked (for each summing operation) at a frequency much higher than the signal (set by the over sampling ratio), this quantization error is being created at higher frequencies than the input signal and is being partially low pass filtered by the integrator. While the integrator output voltage average converges to the input signal (the combination of the integrator and feedback produces high signal gain at low frequencies that results in the integrator output average equaling the input signal), the integrator output has higher frequency quantization noise superimposed on it that is not filtered by the integrator. The digital filter following the comparator removes some of this high frequency noise by performing a low pass filter operation on the stream of 1's and 0's from the comparator. Thus, the strategy used is to create a sequence of digital values from the comparator that represents the input signal level, push the quantization noise to higher frequencies outside of the signal bandwidth of interest and subsequently filter out the higher frequency noise content. For the ADC timing diagram of FIG. 13C the Cdac1 node is first reset to 2.5V (as an example) with the deassertion of the reset signal to the reset transistor coupled between the 2.5V supply voltage and the summing node Vdac1 1308 in the integrator 1340, from time t1 to time t2. Then the input signal is sampled into the PPD_1 circuit with the Fill1/TX1 to Fill64/TX64 bank of signals (e.g., the charge transfers 1388 and 1389, while the charge transfers from the remaining charge transfer stages in the integrator 1340 are omitted from the illustration of FIG. 13C for simplicity). For example, for a Cdac1 value of 0.2 pF and input voltage level that generates in the PPD 5000 electrons, a signal level drop of 256 mV is generated on Cdac1 for 64 input samples taken at once. The voltage on the output of the integrator Cdac1 is shown at the bottom of the timing figure. After the input signal is sampled into the integrator Cdac1, the comparator is strobed to see if the input is smaller than the comparator reference set at 1.8V. If the input is smaller than 1.8V, then positive charge is added to the Cdac1 node (via charge transfers 1382 and 1383 from hole based pinned photodiodes, for example) to increase the voltage on the Vdac1 node 1308. For example, multiple transfers of the hole based HPD are used to transfer enough charge to move the Cdac voltage by 0.7V that represents the ADC reference.

The input signal is sampled into the integrator again with the subsequent drop in output of another 256 mV and the comparator is strobed once again. This cycle continues until the comparator threshold is crossed and in the next input sample phase, positive charge is added to Cdac1 to shift the voltage by the ADC reference voltage that equals 0.7V in this example. To sample positive charge to Cdac1, the signals Fill1h/TX1h to Fill64h/TX64h are pulsed. It is assumed that the hole HPD holds about 13,600 units of positive charge (holes) for this example only to generate the 0.7V shift for 64 hole based HPDs charge transfer. This cycle of input sampling and comparison continues until the oversampling ratio is achieved (e.g. 1024 clocks) for the target ADC resolution.

Figure 14:
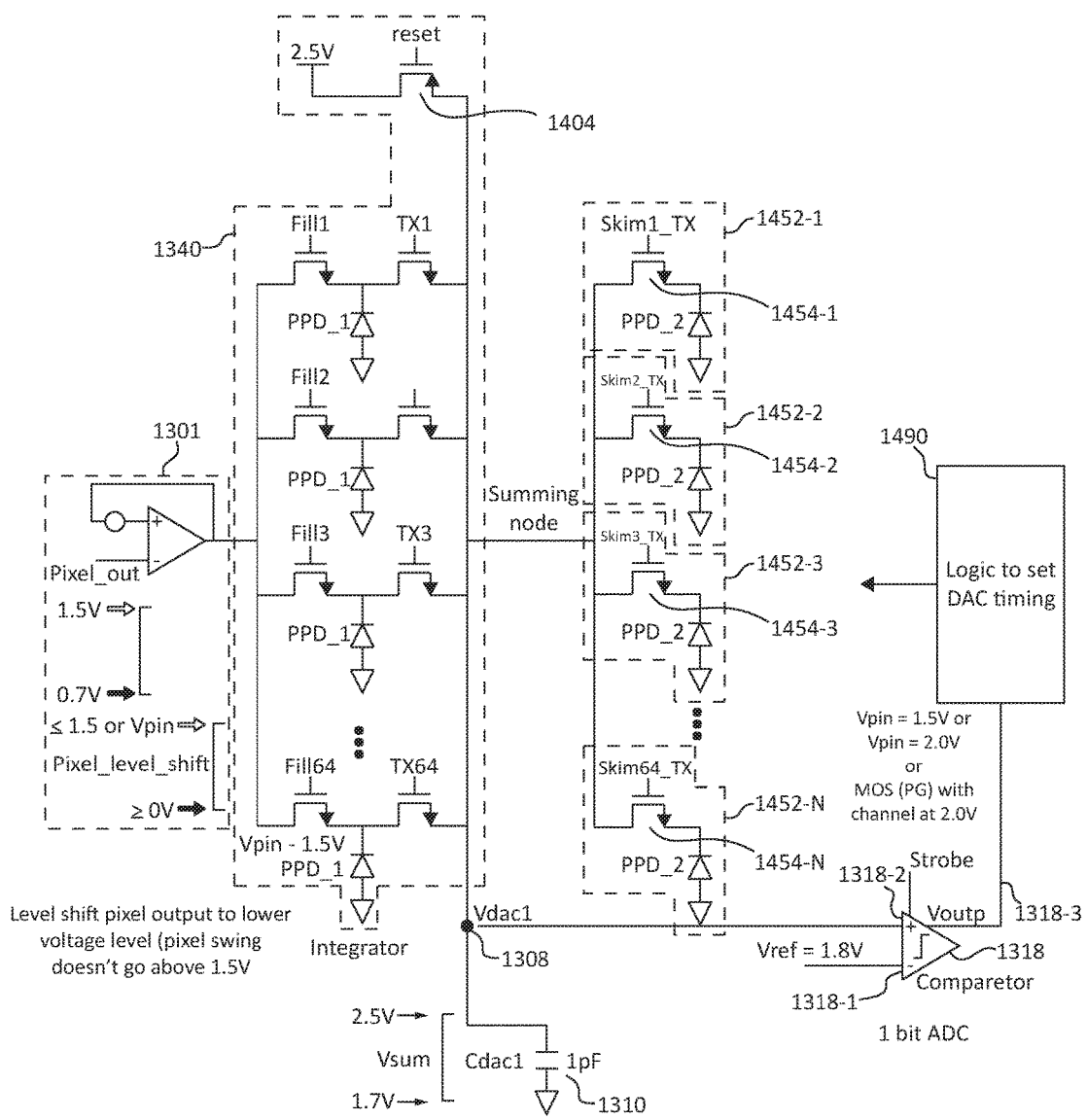
FIG. 14 is a schematic of a first order delta-sigma ADC without hole-based pinned photodiodes in accordance with an embodiment of the present invention.

An implementation of the first order delta sigma modulator 1300 that does not require hole based PPD devices is shown in FIG. 14. A second set of PPD_2 device stages 1452 with a higher photodiode pinning potential of 2V is connected to the integrator 1340. When the integrator fills up with charge, the comparator flips (i.e., the value produced at comparator output 1318-3 may change). At this point, the Skim_TX voltage provided at the gates of the skimming transistors 1454 is set to a value (2.8V) that creates a barrier (1.8V) between the Cdac capacitor 1310 and PPD_2 that allows excess electrons beyond a certain charge capacity to flow into the PPD_2 devices in stages 1452. The Skim_TX transistor 1454 may be turned off again and the electrons are then removed from the integrator by precharging it again (i.e., the precharge transistor 1404 may be activated). After precharge is complete, the charge in PPD_2 is transferred back to the Cdac capacitor 1310 by setting the Skim_TX gate of the skimming transistors 1454 to a high voltage (>3.0V) that does not create a barrier. Hence, the DAC value is subtracted from the integrator signal and only the residue charge (from PPD_2) is remaining in the integrator as with normal delta sigma modulator operation. Integration continues until the next comparator flip.

Figure 15:
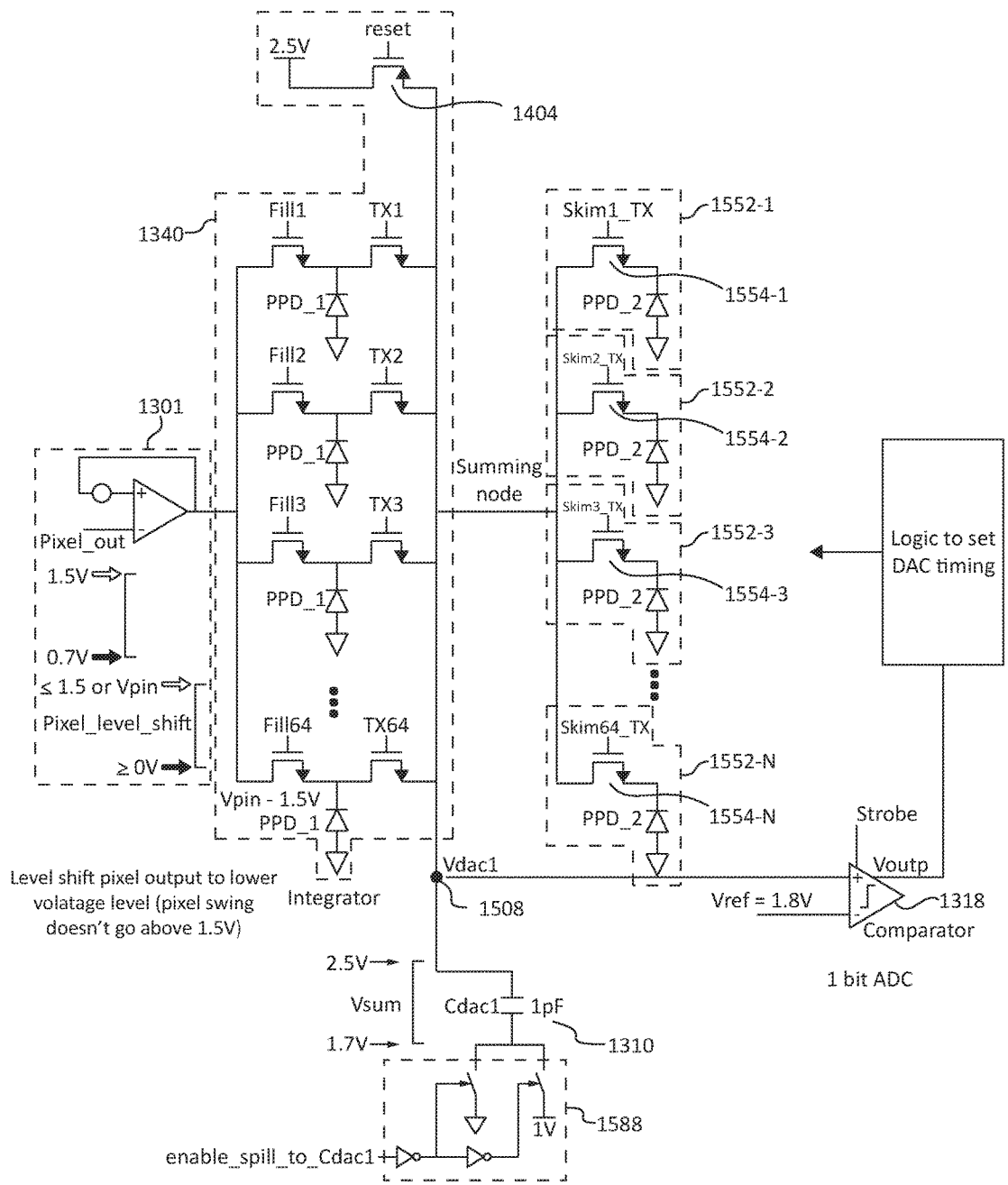
FIG. 15 is a schematic of a first order delta-sigma ADC of FIG. 14 that has a constant pinning voltage level provided to all of the pinned photodiode devices in accordance with an embodiment of the present invention.

FIG. 15 shows an implementation of a first order delta sigma modulator 1500 that does not require a second Vpin potential. It shifts the bottom plate of the Cdac1 capacitor to a higher voltage using a voltage level shifter 1588 to enable charge transfer from the PPD_1 devices in the integrator 1340. Then, the bottom plate is returned to its lower voltage for the comparison operation. If the comparator 1318 flips, then the Skim_TX voltage at the gates of the skimming transistors 1554 in PPD_2 device stages 1552 is set to a value (2.3V) that allows excess charge to flow into PPD_2 that has the same pin potential (Vpin) as PPD_1 (e.g. 1.5V). After precharge is complete (i.e., after the reset transistor 1404 is activated), the charge in PPD_2 is transferred back to the Cdac node by setting the Skim_TX gate of the skimming transistors 1554 to a high voltage (i.e., a voltage greater than 2.5V).

It is also possible to set the Cdac1 1510 bottom plate to a third possible voltage during the precharge operation and comparator operation (e.g. 0.5V). Then during the Skim_TX operation when charge is being skimmed off or removed from Cdac1 1510, the Cdac1 1510 bottom plate is set to 0V. This option gives more design flexibility in setting the barrier between Cdac1 1510 and PPD_2 as well as the effective ADC reference.

It is expected that the thermal energy of electrons will create some uncertainty in charge crossing the barrier and "skimmed" off the Cdac1 1510 node. However, this uncertainty in electrons skimmed off will be averaged out over time as multiple cycles are done in the delta sigma modulator.

Figure 16A:
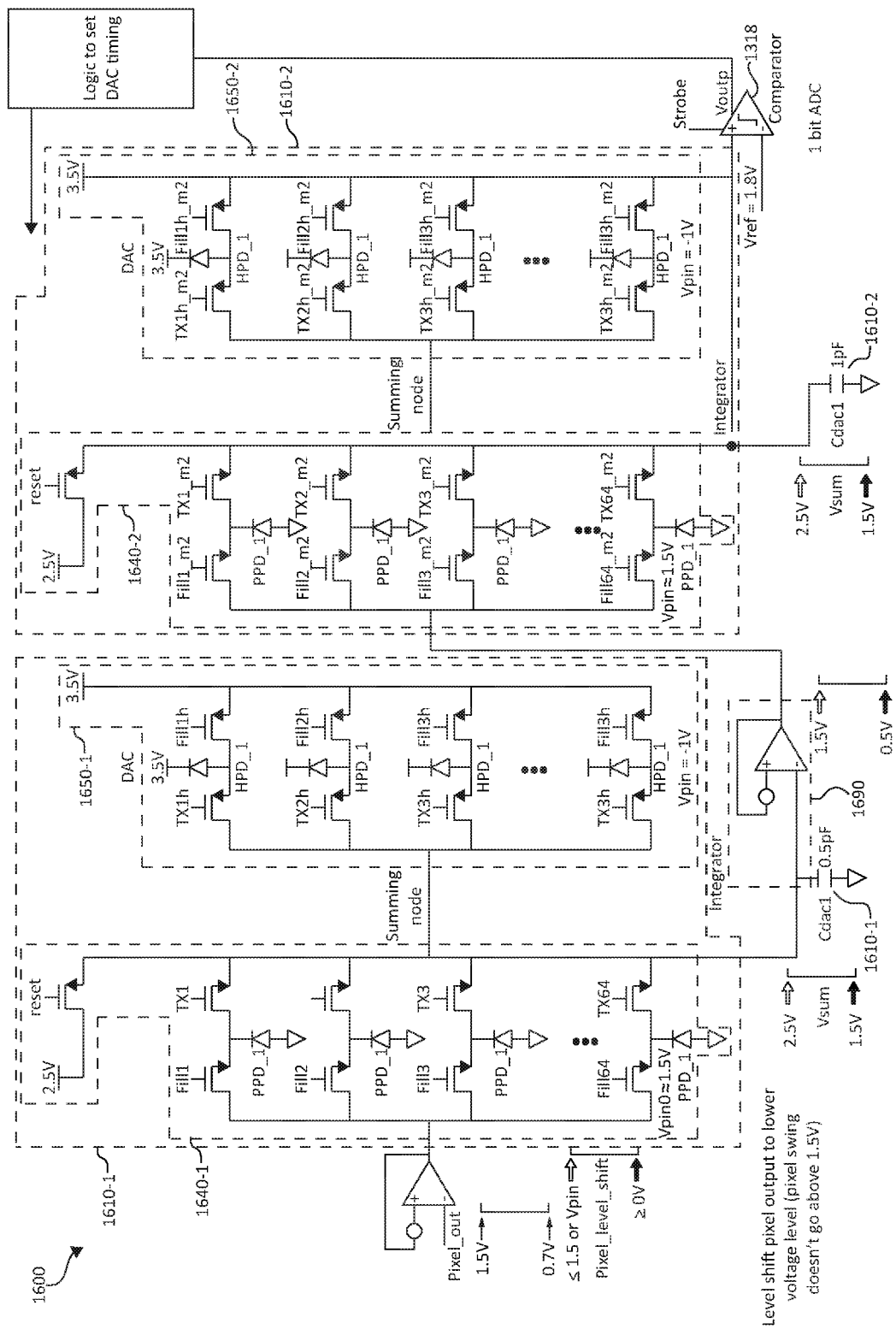
FIG. 16A is a schematic of a second order delta-sigma ADC with electron-based and hole-based pinned photodiode structures in accordance with an embodiment of the present invention.
Figure 16B:
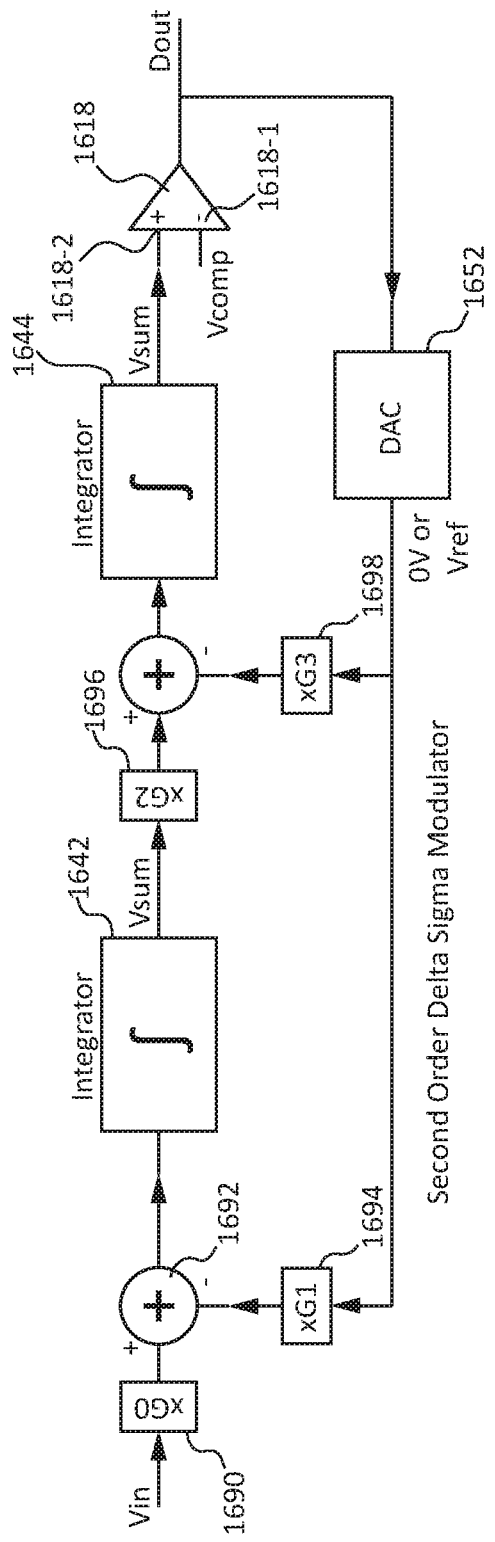
FIG. 16B is a block diagram showing the functional blocks of the second order delta-sigma ADC of FIG. 16A in accordance with an embodiment of the present invention.

In order to increase the accuracy of the A/D operation, the overall low frequency gain of the circuit that pushes the quantization noise to higher frequencies can be increased by cascading integrators to form a second order sigma delta modulator as shown in FIGS. 16A and 16B. FIG. 16B shows a block diagram view with additional gain is shown with the xG2 gain block 1696 and the xG3 gain block 1698. Part of the reason for the different gain values is to prevent the integrator from moving out of range for operation of the circuits forming the integrator (also, these are set to control the magnitude of the frequency noise components of the quantization noise and the stability of the modulator). By cascading modulators the quantization noise is also moved to higher frequencies and the increased gain also allows the integrator outputs and fed back average comparator output to more accurately track the input signal level. Along with the low pass digital filter, this topology can increase the accuracy of the A/D conversion.

A second order delta sigma modulator 1600 is shown in FIG. 16. It is made by replicating the first order modulator circuit. A first-order modulator circuit 1620-1 may include a first integrator 1640-1 and a first subtractor 1650-1 that are both coupled to a summing capacitor 1610-1. A first-order modulator circuit 1620-2 may include a second integrator 1640-2 and a second subtractor 1650-2 that are both coupled to a summing capacitor 1610-2. A unity gain buffer 1690 may be coupled between the modulators 1620-1 and 1620-2. Ideally, the unity gain buffer 1690 shifts the level of the first integrator 1640-1 by exactly 1 V so that the PPD_1 devices in the second integrator 1640-2 input fill up with electrons in proportion to the first modulator 1640-1 output. Again, the gain coefficients of the two integrators input and feedback paths (i.e., the gain coefficients of integrators 1640-1 and 1640-2) is set by the number of transfers to each summing node from the inputs to each stage and feedback DAC.

Figure 16C:
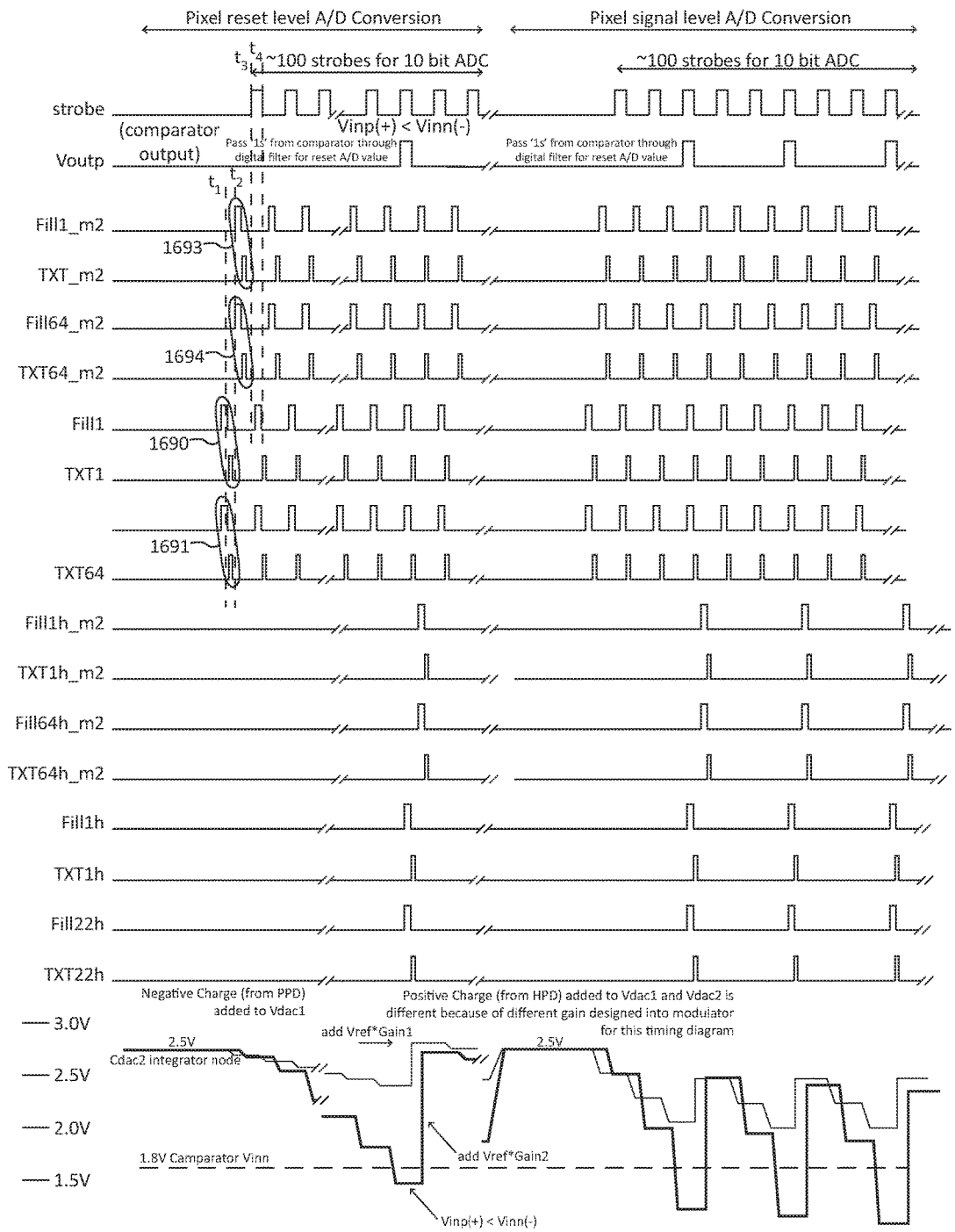
FIG. 16C is a timing diagram for operating the second order delta-sigma ADC with electron-based and hole-based pinned photodiode structures of FIG. 16A in accordance with an embodiment of the present invention.

The second order delta sigma ADC timing diagram in FIG. 16C for FIG. 16A shows the input sampling signals for the first (Fill1/TX1-Fill64/TX64, shown as charge transfers 1690 and 1691) and second integrator blocks (Fill1_m2/TX1_m2-Fill64_m2/TX64_m2, shown as charge transfers 1693 and 1694). First, both modulators 1620-1 and 1620-2 Cdac nodes are reset to 2.5V (i.e., the Cdac1 capacitors 1610-1 and 1610-2 are both reset to the supply voltage by the deassertion of the reset signal, which is not shown in the timing diagram for simplicity). The first modulator adds the input voltage from the pixel to the first integrator node (i.e., the Cdac1 capacitor 1610-1) by means of charge transfers 1690 and 1691 from time t1 to time t2, for example. At the end of the first modulator input sampling phase, the second modulator samples the first modulator output by means of charge transfers 1693 and 1694 form time t2 to time t3, for example. Then the comparator is strobed at the output of the second modulator from time t3 to time t4. The waveforms at the output of the first and second modulator output are shown in the figure as the values of the Cdac1 integrator node (for Cdac1 1610-1) and the Cdac2 integrator node (for Cdac1 1610-2). If the comparator output threshold is reached, positive charge is added to both first and second modulator Cdac nodes through charge transfers from the hole based pinned photodiodes. The amount of charge added can be set by the number of hole based HPDs enabled to transfer charge. This amount can be different for the first and second modulator.

Figure 16D:
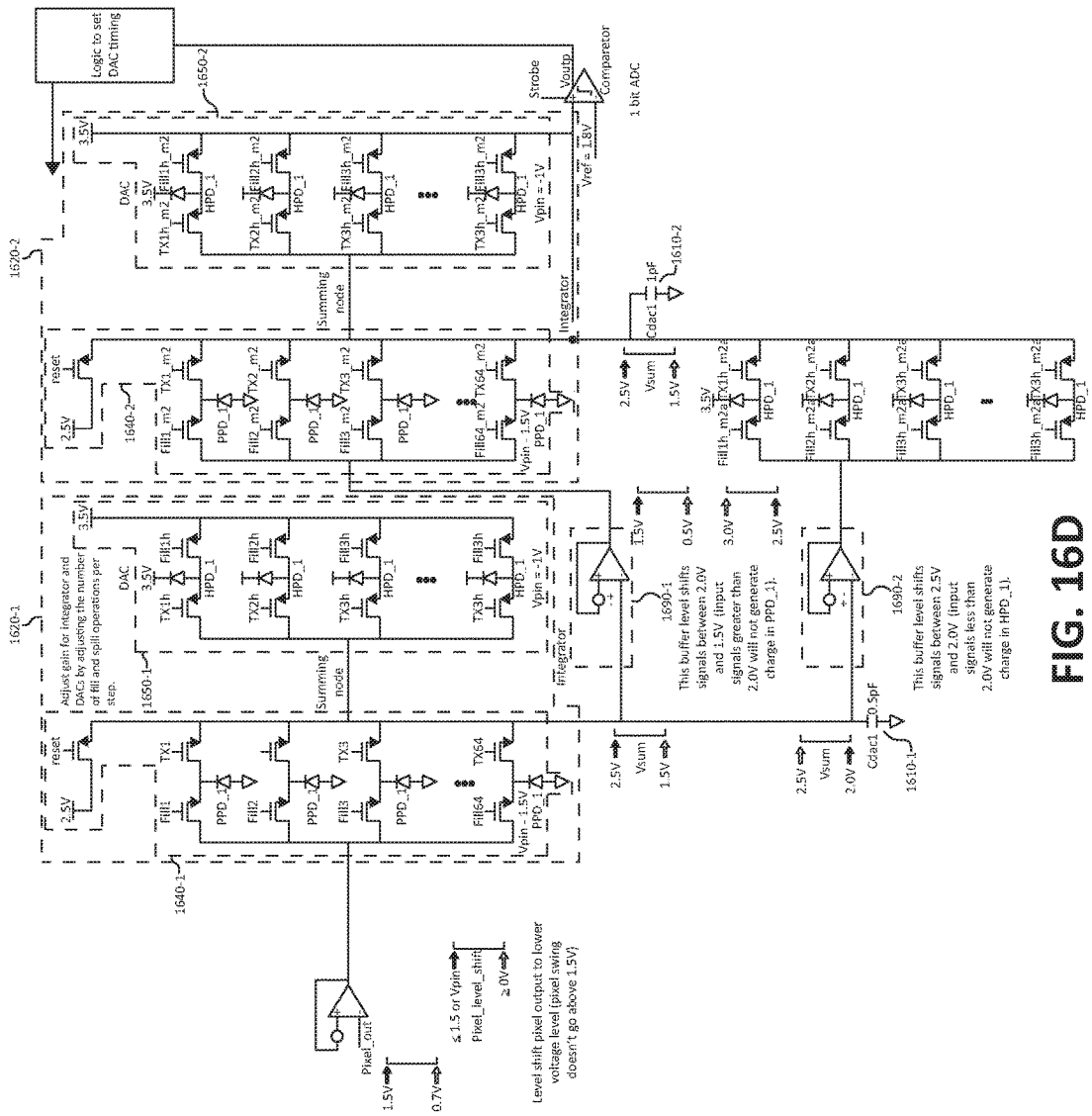
FIG. 16D is a schematic of a second order delta-sigma ADC with electron-based and hole-based pinned photodiode structures with improved signal range in accordance with an embodiment of the present invention.

The second order delta sigma ADC with improved signal range is shown in FIG. 16D. It allows the output of the first modulator 1620-1 to rise above the Cdac reset level (e.g. 2.0V) to allow either positive or negative charge to be added to the second modulator 1620-2. The top amplifier 1690-1 in the modulator works on input signals between 2.0V and 1.5V to level shift them to 1.5V and 1.0V respectively. This level shift puts the output of the amplifier in the range of the electron based PPD devices to add electrons to the integrator. The bottom amplifier 1690-2 operates on input signals between 2.0V and 2.5V to level shift them to 2.5V and 3.0V respectively. This level shifts puts the output of the amplifier in the range of the hole based HPD devices to add holes to the integrator. The second modulator 1620-2 output operates in the range between 2.5V and 1.5V. The comparator has its threshold set at 1.8V. When the output of the second modulator drops below 1.8V, positive charge is added to both first and second modulator Cdac nodes 1610-1 and 1610-2. The amount of charge added can be set by the number of hole based PPDs enabled to transfer charge. This amount can be different for the first and second modulator. This difference in the amount of voltage added to the first and second order modulator is needed to make sure the circuit stays within the operating range for the amplifier and integrators.

For example, xG0 and xG1 for the first modulator is equal to 0.3× where the voltage added to the integrator (through charge transfer) from the input signal and Vref feedback path is multiplied by a factor of 0.3 by modulating the number of times each is sampled into the integrator (also determined by charge capacity of the PPD/HPD and Cdac size). Also, as an example, xG2 and xG3 for the second modulator is equal to 0.7× where the voltage added to the second integrator from the first modulator output and Vref feedback path is multiplied by a factor of 0.7 by modulating the number of times each is sampled into the integrator.

Figure 16E:
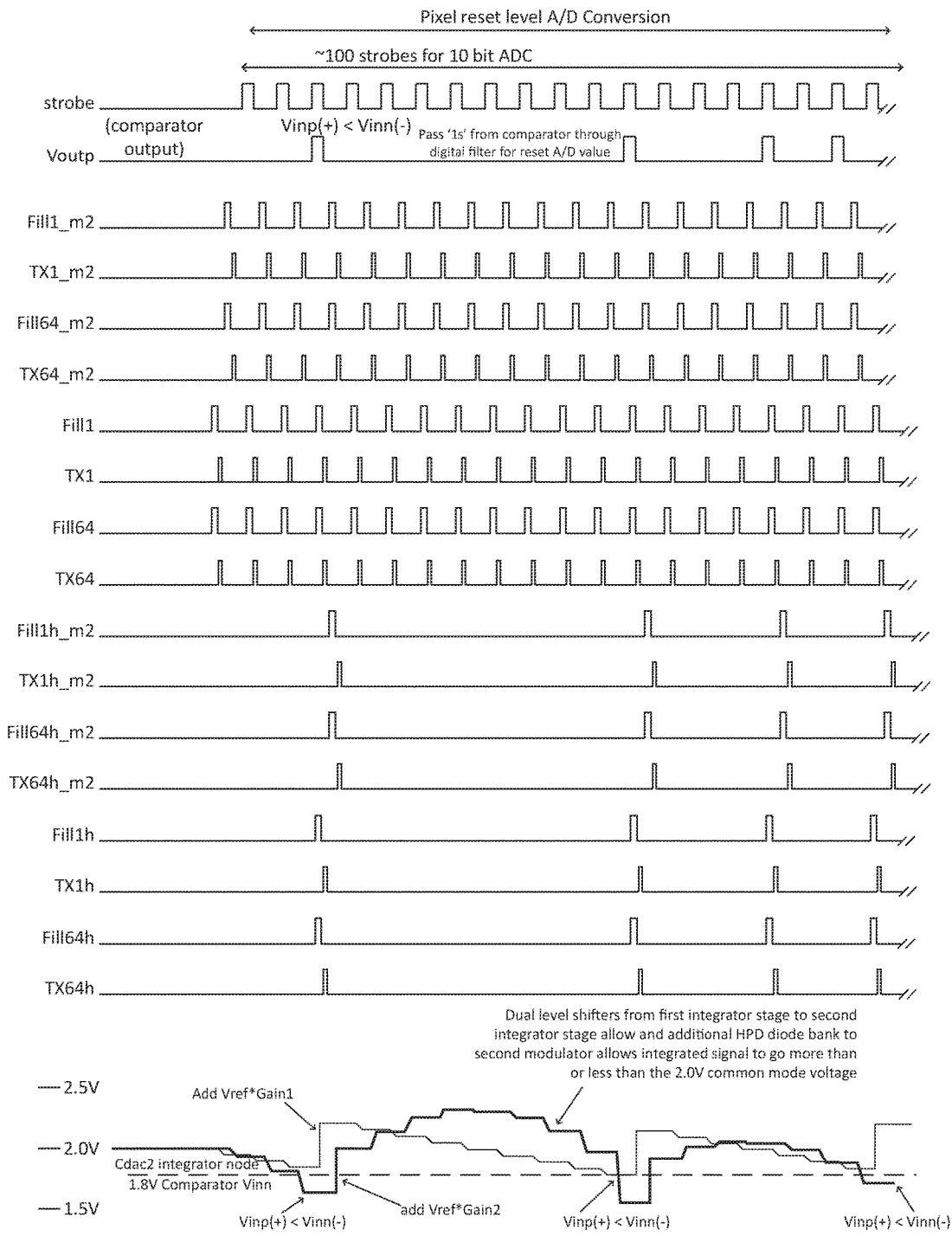
FIG. 16E is a timing diagram for operating the second order delta-sigma ADC with electron-based and hole-based pinned photodiode structures of FIG. 16D in accordance with an embodiment of the present invention.

The timing diagram of FIG. 16E for the improved signal range delta sigma ADC shows the second integrator output that can increase or decrease in voltage based on the input level of the first integrator output level. Because of feedback in the circuit topology, the output of the second integrator will trigger the comparator so that the filtered sequence of the comparator output of 1's and 0's multiplied by the ADC reference voltage will represent the signal level.

Figure 17A:
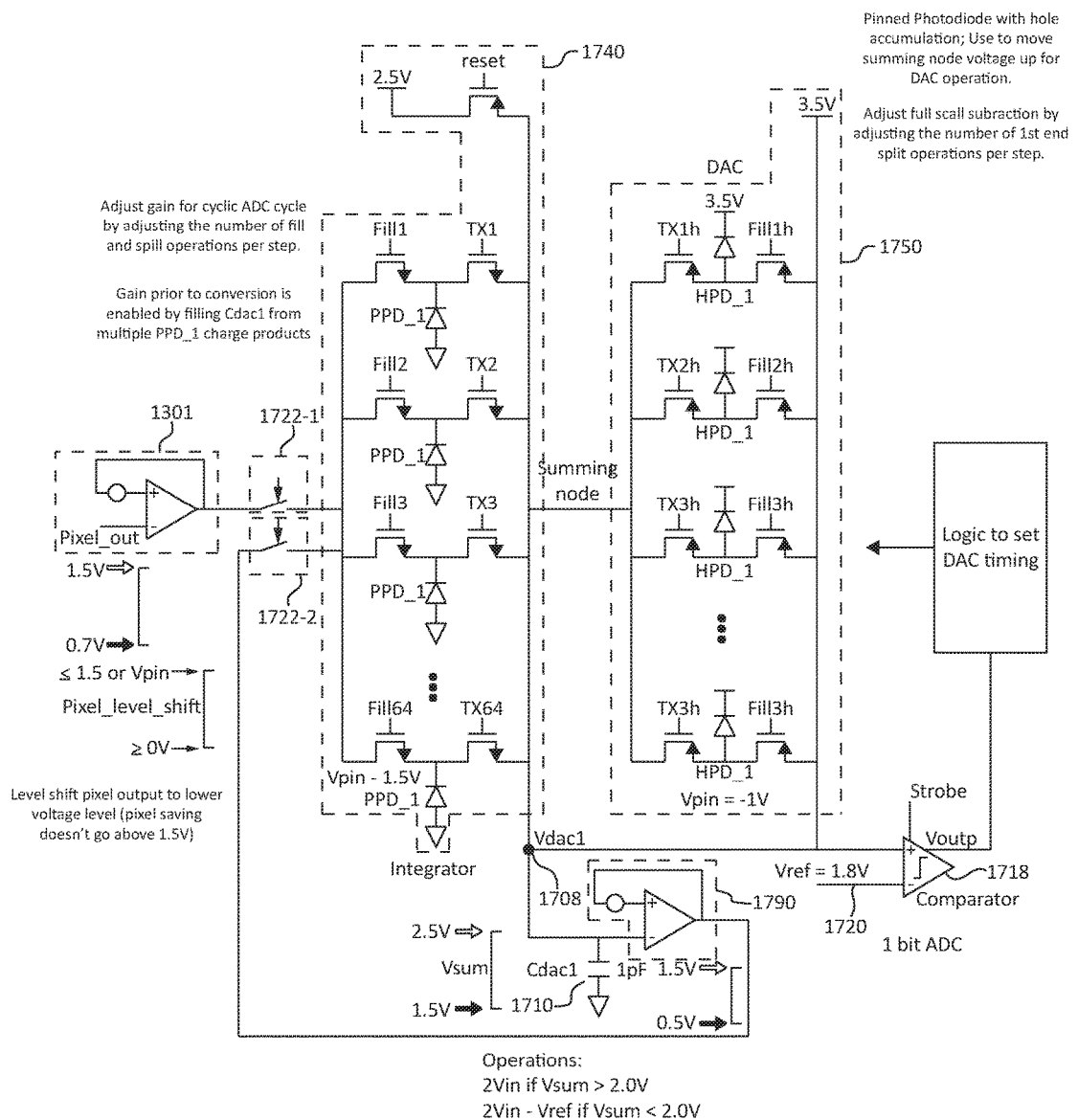
FIG. 17A is a schematic of a cyclic ADC with pinned photodiode charge transfer circuits in accordance with an embodiment of the present invention.

A cyclic ADC 1700 is shown in FIG. 17A. The basic operations are multiplying the integrated value by 2 if the value is greater than the ADC comparator reference level at input 1720 or multiply the integrated value by 2 and add the ADC reference if it is less than the ADC comparator reference level at input 1720. A unity gain buffer 1790 is used to level shift the output of the summing node by 1V to allow the PPD_1 devices to fill up with electrons in proportion to the DAC output. The multiply by 2 operation is achieved by setting the number of PPD_1 devices in the charge transfer stages 1740 and transfer operations used to spill electrons into the summing node 1708. The subtraction of the reference level is achieved by multiple HPD_1 device transfers from the charge subtractor stages 1750 used to spill holes into the summing node 1708.

Figure 17B:
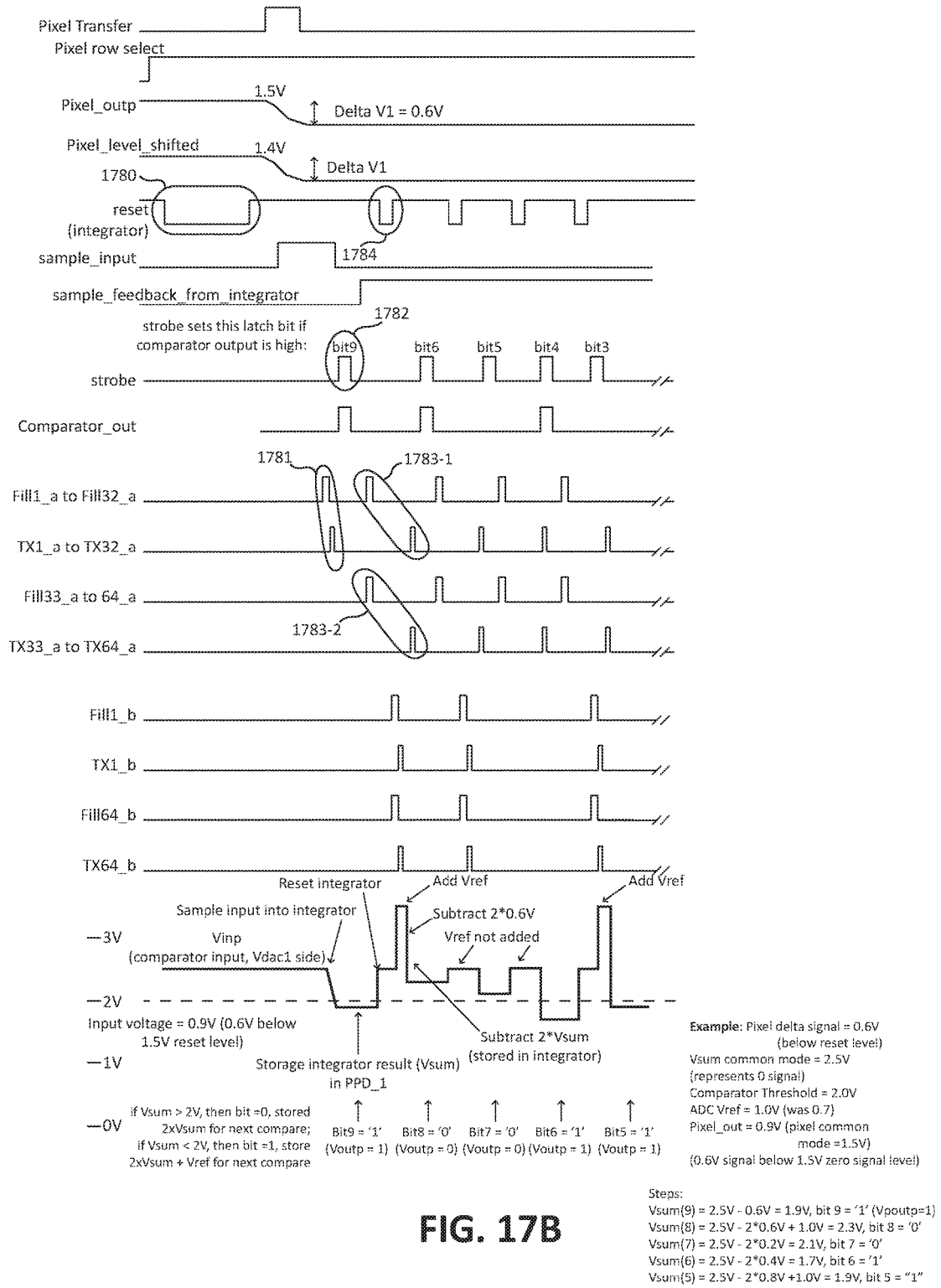
FIG. 17B is a timing diagram for operating the cyclic ADC of FIG. 17A in accordance with an embodiment of the present invention.

The cyclic ADC shown in FIG. 17A samples the input into the modulator through the select switches 1722-1 and 1722-2 with timing shown on FIG. 17B. In particular, the switch 1722-1 is used to sample the an input provided by pixel buffer 1301. When the switch 1722-1 is used to connect the pixel buffer 1301 to the integrator 1740, the "sample_input" signal may be asserted as shown in FIG. 17B. The switch 1722-2 may be used to sample the feedback from the unity gain level shifting buffer 1790, and is used to connect the output of buffer 1790 to the integrator 1740 when the "sample_feedback_from_integrator" signal is asserted in FIG. 17B. Conversion of the pixel signal level only is shown (0.6V signal below the reference). Operation of the cyclic ADC is based on first determining the MSB to see if the signal level magnitude is greater than the ADC reference voltage divided by 2. The integrator is first reset to 2.5V that represents the level with 0 signal in event 1780. The integrator output signal swing has a maximum of 1V down to 1.5V from 2.5V. The comparator reference is set at 2.0V that represents the half the ADC reference level (1V). The cyclic algorithm operates such that after the MSB is determined the result is subtracted from the integrator (0 signal if the MSB is 0 and half the reference if the MSB is 1). In order to determine the next bit, the remaining residue is compared to the MSB-1 comparator reference level (Vref/4). In order to re-use the same reference level used for the MSB bit, the residue is instead multiplied by 2 to effectively determine the MSB-1 bit. As a result the overall equivalent operation is to multiply the residue by 2 and subtract the ADC reference level (2×Vref/2=Vref).

After the initial pixel input signal is sampled through activation of Fill1 to Fill32 such as event 1781, the comparator is strobed in event 1782. Then, the integrator output is sampled into the PPD bank with 2× the number of PPDs used to double the integrator value. This integrator sample process uses the signal Fill1× to Fill64×0 (2 times as many Fill signals as used for the initial sample of the input) as shown in events 1783-1 for charge transfer stages 1 to 32 and 1783-2 for charge transfer stages 33 to 64. The value is held in the PPD as the Cdac integrator capacitor is preset back to 2.5V in event 1784, which occurs between the assertion of the fill signals in events 1783-1 and 1783-2 and the assertion of the transfer signals in events 1783-1 and 1783-2. Then, the PPD values are transferred using the TX1 to TX64 signals by asserting the transfer signals in events 1783-1 and 1783-2. If the integrator output is below the comparator threshold from the previous strobe operation, the hole based HPD PPD adds charge to the Cdac node to move the Cdac node by the ADC reference voltage by pulsing the Fill1h/TX1h to Fill64h/TX64h signals. In the timing diagram, the Cdac node is shown with the ADC reference being added first and then the 2× signal level charge being subtracted next but these can happen simultaneously.

The timing diagram shows the example of a signal level that is 0.6V below the reference level (1.5V). The first 5 bit conversions for the ADC are shown but additional bits of resolution are possible.

Figure 18:
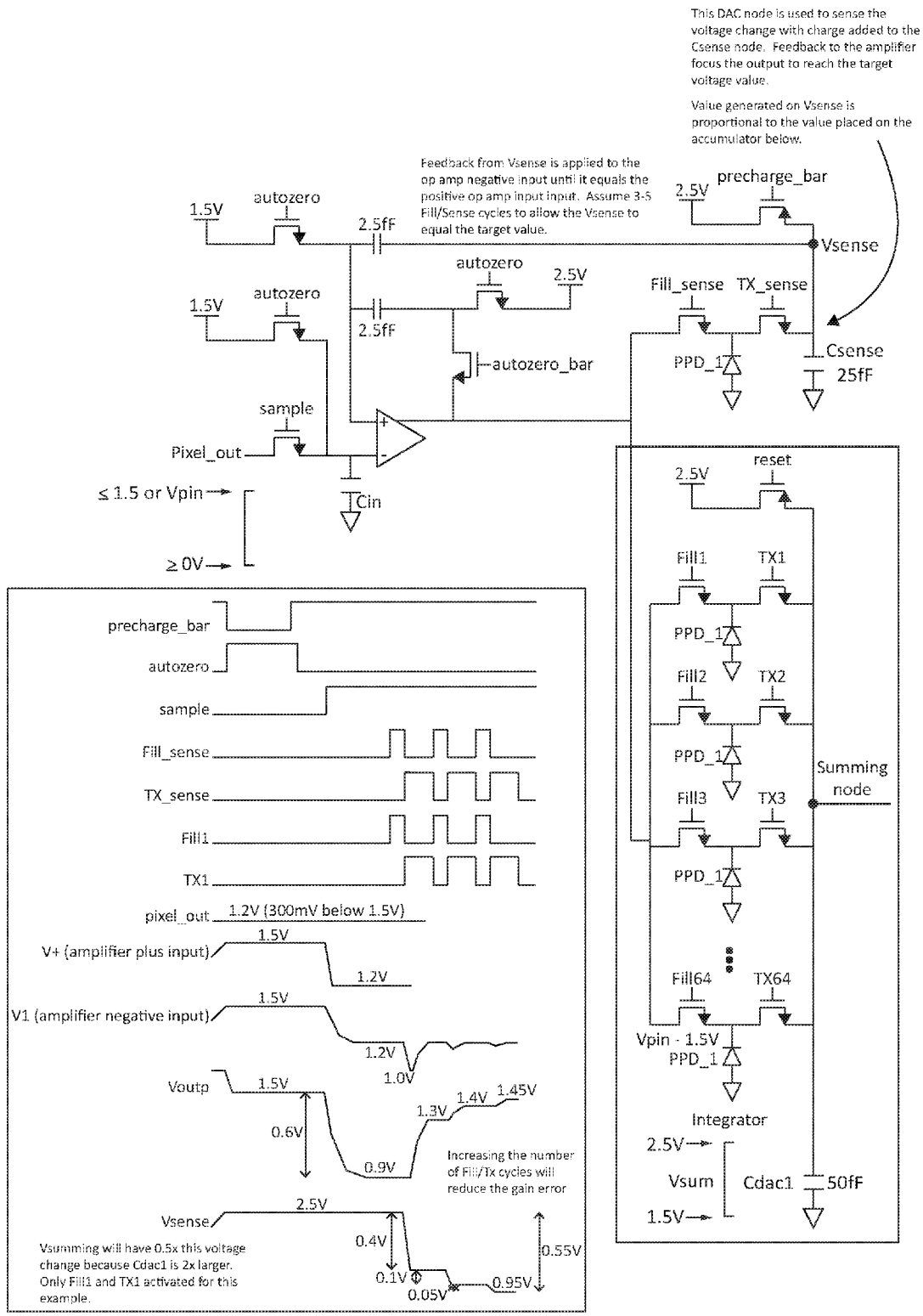
FIG. 18 is a schematic and timing diagram for a pre-emphasis circuit for compensating for non-linear signal outputs over an input signal range in accordance with an embodiment of the present invention.

Because the circuits that sample the input signal level into the integrator need to have a linear relationship between the input voltage and output voltage over the entire range of input signal value, a pre-emphasis circuit is needed to compensate for the PPD non-linear charge handling capacity. The circuit of FIGS. 18 and 19 both compensate for this non-linearity. The circuit FIG. 18 compensates for signals that only add electrons to the Cdac node for an always decreasing signal level. The circuit of FIG. 19 compensates for signals that can add positive signal or negative signal to the Cdac node relative to a common mode for either an increasing or decreasing signal level.

The first example of the pre-emphasis circuit uses a sensing node Vsense to feedback to the input of a switched capacitor amplifier to modulate the amount of charge transferred to the sensing node to ensure the output achieves the target voltage change. The amplifier compares the sense node output to the input voltage to adjust the amplifier output that is drives the input to the PPD during the fill phase. Then, this charge is transferred to the capacitor on the C sense node. This step is repeated multiple times (e.g., 4 to 5 times). As charge is transferred to the sense node, the same operation is happening in parallel on the accumulator summing node that resides in the target circuit (ADC) that needs the pre-emphasis input correction. When the sense node reaches the target voltage change, the output of the switch capacitor amplifier goes to a high enough voltage to not create charge in the PPD.

At the start of the pre-emphasis operation, the C sense node is precharged to 2.5V and the amplifier circuit is auto-zeroed to set the proper operating voltage levels. Then, the switches to the amplifier for autozero are turned off and the Pixel_output input signal is connected to the amplifier positive input and the output of the amplifier is connected to the feedback capacitor (2.5 fF in this example). The "zero" signal level for the input to the amplifier is 1.5V. The amplifier output is also set to 1.5V from the auto-zero operation. When the Fill_sense signal is turned on, this 1.5V level will not inject charge into the PPD because it equals the PPD Vpin voltage. However, for signal levels that drop below 1.5V that are input to the amplifier through the sample switch, the output of the amplifier will drop to a low voltage. In the timing diagram, the input signal swing is 0.3V for the Pixel_output at 1.2V relative to the 1.5V zero signal reference.

The amplifier output initially drops by twice the input signal or 0.6V for the topology shown and this gain in signal magnitude is set by the "feedback" factor in the circuit. The "feedback" factor is determined by the size of the feedback capacitor and the total capacitance on the negative input to the amplifier. Because the feedback capacitor is 2.5 fF and the overall capacitance of the negative input to the amplifier is in the schematic is approximately 2.5 fF (assuming other capacitance associated with the circuit connected to the negative input node are much smaller), only half of the amplifier output signal is fed back to the negative input. Because the feedback will force the negative input to equal the positive input to the amplifier, the amplifier output gains the signal by 2 with the Voutp changing from 1.5V to 0.9V (0.6V change). Thus, the circuit amplifies the input signal by 2 as charge is accumulated on the Csense node but there is no amplification of the signal in the accumulator (gain=1) because the Cdac1 node is sized to compensate for this gain in the sense circuit (Cdac1 is size 2× bigger than Csense).

When the amplifier output is driven into the PPD_1 by turning on the Fill_sense and the resulting charge is transferred to the Csense capacitor from the TX_sense gate turning on, it is shown in the timing diagram that the Vsense node changes from 2.5V to 2.1V or by only 0.4V. Because the capacitor feedback from the Csense node to the amplifier negative input is 2.5 fF, the signal change initially is negative 0.2V (half of the 0.4V change). The amplifier output responds by changing by a positive 0.4V to equalize the negative amplifier input to the positive amplifier input. As shown in the timing diagram, the Voutp signal moves up from 0.9V by 0.4V to 1.3V. Then, this output level is sampled again by the PPD and charge is transferred to the Csense node. Because the signal being sampled into the PPD node is closer to the Vpin voltage, less charge is ultimately transferred to the Csense node. In this step, the signal change is only 0.1V on the Csense node as it moves down from 2.1V to 2.0V. During the feedback process again, the amplifier output changes by 0.1V from 1.3V to 1.4V. These steps continue for a fixed number of cycles and the Csense node approaches the target value of 0.6V below the initial level of 2.5V. The amplifier output is also driving the accumulator input in the target circuit to achieve a linearly proportional amount of charge transfer on the Cdac1 node. Thus the signal input into the accumulator is linearly proportional to the input voltage to the circuit.

Figure 19:
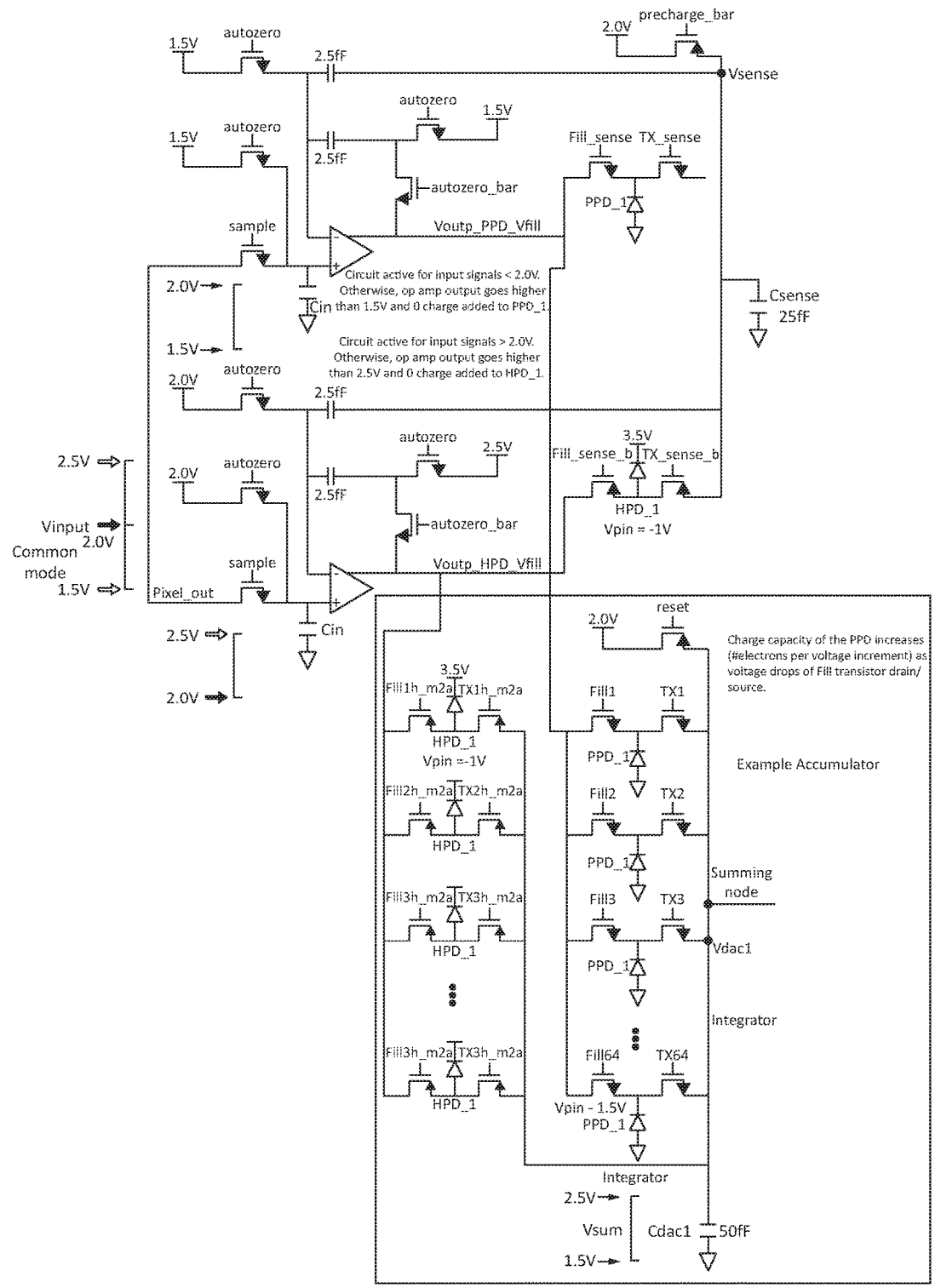
FIG. 19 is a schematic of a pre-emphasis circuit for adding positive or negative compensation signals to an ADC capacitive node in accordance with an embodiment of the present invention.

The circuit of FIG. 19 allows positive or negative signals to be added to an accumulator. The circuit is similar to the previous pre-emphasis circuit but contains a sense node that is connected to both electron based PPD and hole based HPD devices. Also, the accumulator that is driven has both electron based PPD and hole based HPD devices.

The sense circuit is set for a common mode input voltage of 2.0V. Negative signals relative to this common mode level are allowed from 2.0V to 1.5V. Positive signal relative to the common mode level are allowed from 2.0V to 2.5V. The top amplifier operates on the negative signals between 2.0V and 1.5V. The bottom amplifier operates on the positive signals between 2.0V and 2.5V. Most input signals will be processed by only the top or bottom amplifier but for signals close to the input common mode it is expected that both may operate in parallel. Both top and bottom operating in parallel is not a problem because feedback will eventually allow the output on Csense to converge to the target voltage.

The common mode for the top amplifier that processes negative signals has the amplifier auto-zero output voltage equal to 1.5V. Any negative input signals relative to the common mode voltage will push this voltage to a lower level and the PPD will fill with electrons. These electrons get transferred to the Csense node and feedback operates as in the previous "single" polarity design.

The common mode for the bottom amplifier that process positive signals has the amplifier auto-zero output voltage equal to 2.5V. Any positive input signal relative to the common mode voltage will push this voltage to a higher level and the hole based HPD will fill with positive holes. These holes will get transferred to the Csense node and feedback operates in a similar fashion as the electron based pre-emphasis circuit.

Note that the Csense node is initially precharged to 2.0V and allowed to swing between 2.5V and 1.5V. This signal swing range still allows electron or holes to be fully transferred from the PPD/HPD devices. The integrator in the target accumulator also has this same allowed signal swing.

Figure 20:
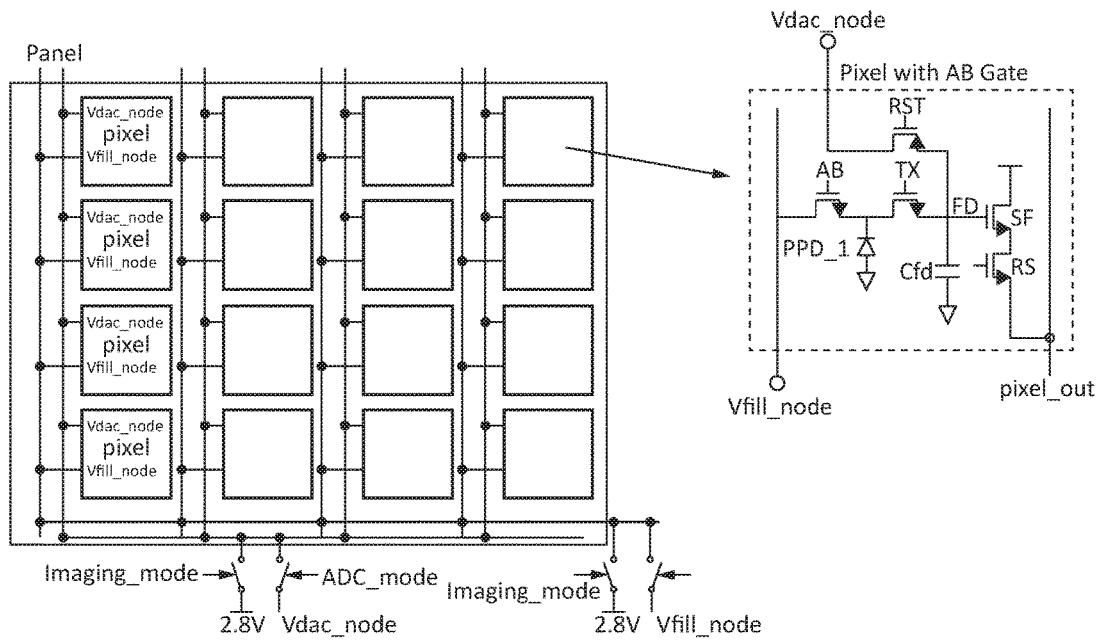
FIG. 20 is a schematic of pixel groups in an imaging array that can be selectively used in a conversion mode in accordance with an embodiment of the present invention.
Figure 20:
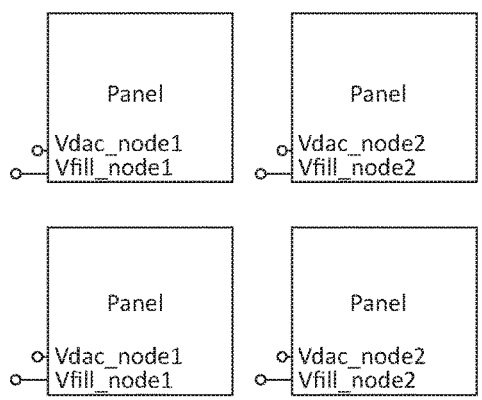

The PPD based ADC circuits including single slope, SAR, delta sigma, and cyclic architectures require arrays of PPD devices for their accumulators. These PPD devices (or HPD devices) can be dedicated devices that are configured for each ADC. Also, it is possible to time multiplex the structures that are natively part of the imaging array. The diagrams shown on FIG. 20 include the pixel schematic with the pixel_out, RST, RS, TX, AB, as well as power connections for the source follower SF, reset transistor drain, and AB transistor drain. The power connections for the reset transistor drain and AB drain can be multiplexed to allow different pixel modes to allow ADC circuit configurations. The reset transistor drain can be part of the integrator DAC node and is labeled Vdac_node. The AB transistor drain is the drain for the fill operation of a PPD and is labeled Vfill_mode.

For a group of pixels these special connections to the pixel array can be switched between being connected to 2.8V or to the circuit connections for the Vdac_node as well as Vfill transistor node. The drawing on p. 10 shows a group of pixels called a "Panel" with an array of pixels in it. These global connections for Vdac_node and Vfill_node are shown in the drawing. Local to each group of pixels in the panel is a switch to connected the panel signals for either imaging mode or ADC mode. The Vdac_node and Vfill_node signals for a panel are connected to other parts of the ADC circuit as shown in previous schematics. Depending on the chip layout the remaining part of the circuit is located in another part of the sensor or for stacking technology could be located on a die below the pixel array. The panels also can be configured to be a column of pixels, row of pixels, or a combination of a certain number of rows and columns of pixels.

The schematic for the panel doesn't show the other pixel controls like AB and TX (as well as row select, pixel output, or source follower power) but these are present as well. The AB and TX controls can be controlled on a per row basis or locally controlled for each panel (controls from the ADC control circuit or from the sensor imaging mode controller).

Also, the RST gate for the reset transistor would be biased on to allow the FD node that is part of the pixel to be connected to the ADC Cdac node.

Note that each ADC can utilize both a combination of pixel placed PPD circuits and also a bank of dedicated PPD circuits. Then a balance between using dedicated area for the ADC PPD circuits and borrowing time from the imaging mode in the pixel array can be made to optimize the sensor area, speed, and maximum imaging integration time. Under conditions when the pixel array integration time is short, there is significant time when the pixel is not being used for imaging (dead time between exposures). Under these conditions, the ADC does not need to borrow integration time from the sensor operation. Also, it should be noted that there could be power benefits in operating the ADC with devices from the pixel array because some of the charge used to fill up the PPD device is generated by locally in the pixel from incoming light.

Note that any of the circuit configurations can be achieved with 1 to "n" number of PPD devices to tradeoff circuit parameters like size vs. speed. The capacitor size for the Cdacs can also be optimized along with the PPD charge capacity. Using a single PPD but doing multiple "fill" and "transfer" cycles achieves the same functional result as using a parallel set of PPD to perform more charge transfer in a given time interval.

Notably, both electron and hole based PPD charge packet cells can be used to decrease voltages or increase voltages on circuit nodes. This capability can be used as a low power method to set voltages in circuits because of the relatively small amount of charge moved around in the circuit. Hence, this circuit technique could be used in any circuit with high impedance nodes.

This PPD charge packet circuit has the ability to harvest light energy to create the charge needed in the charge packet PPD cells rather than using "fill" transistors. The small amount of charge used by the cells and the ability to use electron hole pairs generated by light make these circuits ideal for ultra-low power applications. Using this method many of the pixel array circuits can be operated in ultra-low power modes and use light energy to supply charge. Also, the charge used in the PPD can be thermally generated by dark current that is proportional to the chip junction and ambient temperature.

The foregoing is merely illustrative of the principles of this invention and various modifications can be made by those skilled in the art without departing from the scope and spirit of the invention.

What is claimed is:

1. An image sensor, comprising:
    an image pixel comprising a first pinned photodiode of a first dopant type, wherein the image pixel produces an output signal based an amount of charge in the first pinned photodiode of the first dopant type;
    an output line coupled to the image pixel, wherein the output line conveys the output signal from the image pixel;
    a charge integrator circuit that includes a plurality of charge transfer circuits that are coupled between a summing node and the output line coupled to the image pixel; and
    a charge subtraction circuit that is coupled to the summing node and that includes an additional plurality of charge transfer circuits that contain a pinned photodiode of a second dopant type that is different from the first dopant type.

2. The image sensor of claim 1, wherein the output line is coupled to the charge integrator circuit, the image sensor further comprising:
    a level shifting circuit coupled between the output line and the charge integrator circuit, wherein the level shifting circuit raises an image pixel signal to an elevated signal level.

3. The image sensor of claim 2, wherein the charge integrator circuit comprises a first charge integrator circuit, wherein the charge subtraction circuit comprises a first charge subtraction circuit, wherein the summing node comprises a first summing node, and wherein the image sensor further comprises:
    a second charge integrator circuit;
    a second charge subtraction circuit; and
    a second summing node that is interposed between the second charge integrator circuit and the second charge subtraction circuit.

4. The image sensor of claim 3, wherein the level shifting circuit comprises a first level shifting circuit, and wherein the image sensor further comprises:
    a second level shifting circuit coupled between the first summing node and the second charge integrator circuit; and
    a comparator having a first input that is coupled to the second summing node and a second input that is coupled to a reference voltage level.

5. The image sensor of claim 2, wherein the level shifting circuit comprises a first level shifting circuit that is selectively coupled to the charge integrator circuit, and wherein the image sensor further comprises:
    a second level shifting circuit that receives an input from the charge integrator circuit, wherein the second level shifting circuit has an output that is selectively connected to the charge integrator circuit.

* * * * *